(12) United States Patent
Baptist et al.

(10) Patent No.: US 11,416,340 B1
(45) Date of Patent: Aug. 16, 2022

(54) STORAGE SYSTEM WITH MULTIPLE STORAGE TYPES IN A VAST STORAGE NETWORK

(71) Applicant: Pure Storage, Inc., Mountain View, CA (US)

(72) Inventors: Andrew D. Baptist, Mt. Pleasant, WI (US); Wesley B. Leggette, Chicago, IL (US); Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 44 days.

(21) Appl. No.: 17/079,891

(22) Filed: Oct. 26, 2020

Related U.S. Application Data

(63) Continuation-in-part of application No. 16/244,615, filed on Jan. 10, 2019, now Pat. No. 10,838,814, which is a continuation of application No. 15/439,383, filed on Feb. 22, 2017, now Pat. No. 10,241,866, which is a continuation-in-part of application No. 15/095,558, filed on Apr. 11, 2016, now Pat. No. 10,013,203, which is a
(Continued)

(51) Int. Cl.
| | |
|---|---|
| G06F 11/10 | (2006.01) |
| G06F 3/06 | (2006.01) |
| H03M 13/15 | (2006.01) |
| H03M 13/00 | (2006.01) |

(52) U.S. Cl.
CPC .......... *G06F 11/1092* (2013.01); *G06F 3/064* (2013.01); *G06F 3/0604* (2013.01); *G06F 3/067* (2013.01); *G06F 3/0619* (2013.01); *G06F 3/0644* (2013.01); *G06F 11/1076* (2013.01); *G06F 11/1088* (2013.01); *G06F 2201/81* (2013.01); *G06F 2211/1028* (2013.01); *G06F 2211/1054* (2013.01); *H03M 13/1515* (2013.01); *H03M 13/616* (2013.01)

(58) Field of Classification Search
CPC .. G06F 11/1092; G06F 3/0604; G06F 3/0619; G06F 3/064; G06F 3/0644; G06F 3/067; G06F 11/1076; G06F 11/1088; G06F 2201/81; G06F 2211/1028; G06F 2211/1054; H03M 13/1515; H03M 13/616
USPC ......................................... 714/764
See application file for complete search history.

(56) References Cited

U.S. PATENT DOCUMENTS

| | | | |
|---|---|---|---|
| 4,092,732 A | 5/1978 | Ouchi | |
| 4,236,207 A * | 11/1980 | Rado ................... | G06F 11/1008 711/170 |

(Continued)

OTHER PUBLICATIONS

Chung; An Automatic Data Segmentation Method for 3D Measured Data Points; National Taiwan University; pp. 1-8; 1998.

(Continued)

*Primary Examiner* — James C Kerveros
(74) *Attorney, Agent, or Firm* — Garlick & Markison; Timothy W. Markison; Bruce E. Stuckman

(57) ABSTRACT

A method includes receiving a write request to store a data object; identifying object parameters associated with the data object; selecting a memory type based on the identified object parameters; selecting a selected memory based on the memory type; and facilitating storage of the data object in the selected memory, wherein the data object is dispersed error encoded.

20 Claims, 61 Drawing Sheets

Related U.S. Application Data continuation-in-part of application No. 14/088,794, filed on Nov. 25, 2013, now Pat. No. 9,311,187.

(60) Provisional application No. 61/748,891, filed on Jan. 4, 2013.

(56) References Cited

U.S. PATENT DOCUMENTS

| | | |
|---|---|---|
| 5,454,101 A | 9/1995 | Mackay et al. |
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 8,006,128 B2 | 8/2011 | Olster |
| 8,234,545 B2 | 7/2012 | Shalvi et al. |
| 8,281,220 B2 | 10/2012 | Kitahara |
| 9,081,712 B2 | 7/2015 | Kotzur |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2008/0288814 A1 | 11/2008 | Kitahara |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2010/0031082 A1 | 2/2010 | Olster |
| 2010/0251075 A1 | 9/2010 | Takahashi et al. |
| 2014/0089761 A1* | 3/2014 | Kwok ............ G06F 11/1048 714/768 |
| 2014/0136915 A1 | 5/2014 | Hyde et al. |
| 2014/0181620 A1 | 6/2014 | Kotzur |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

(56) References Cited

OTHER PUBLICATIONS

Zeilenga; Lightweight Directory Access Protocol (LDAP): String Representation of Distinguished Names; IETF Network Working Group; RFC 4514; Jun. 2006; pp. 1-15.

* cited by examiner

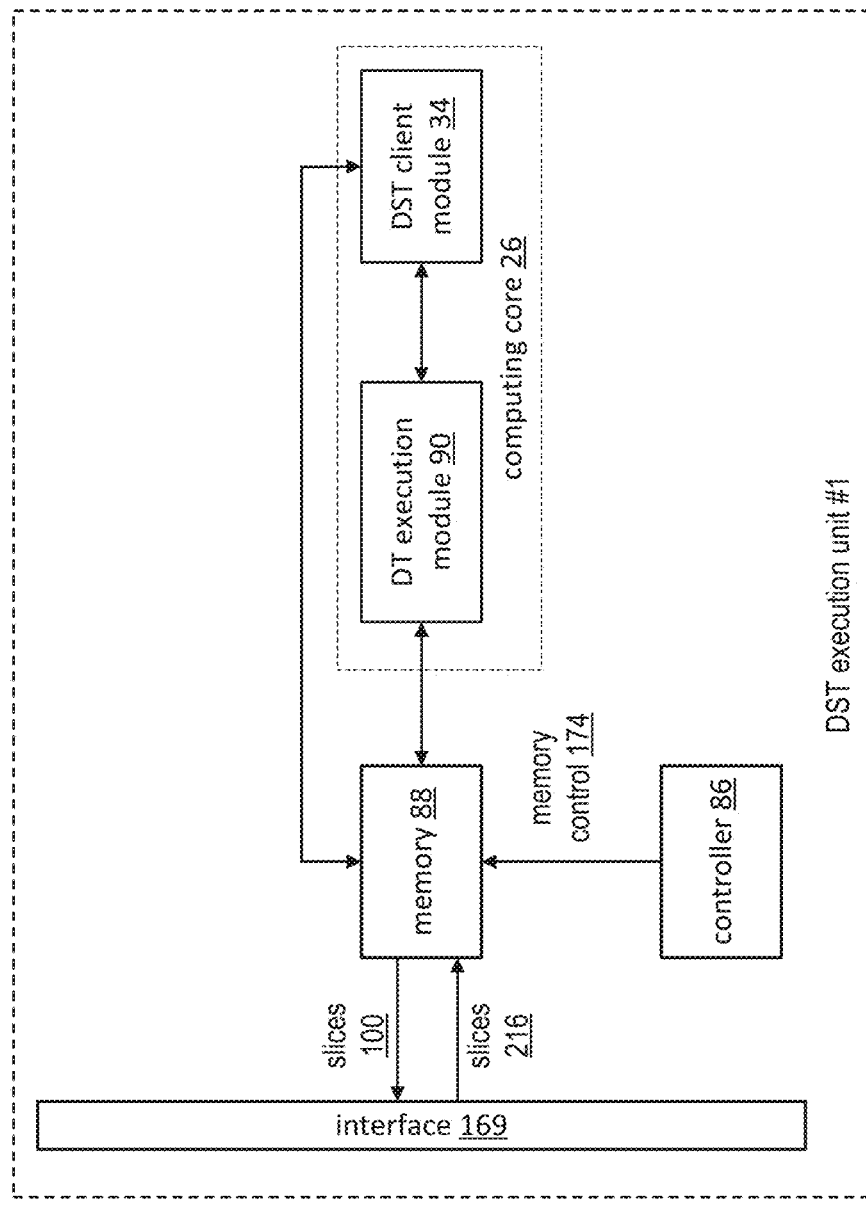
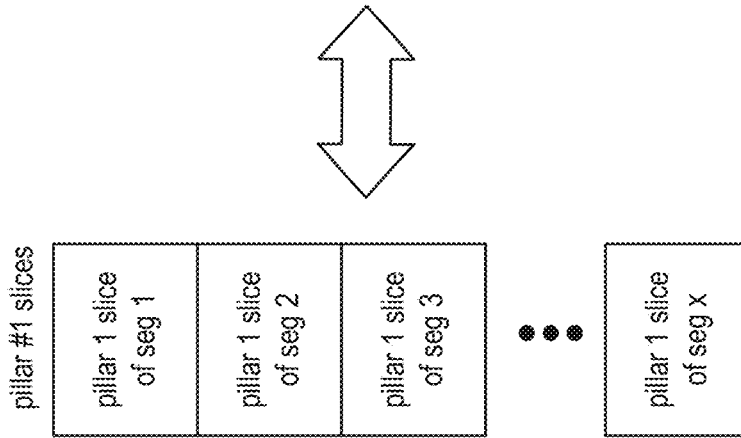
FIG. 24

DST allocation info 242: data partition info 320: data ID; No. of partitions; Addr. info for each partition; format conversion indication

| | task execution info 322 | | | | intermediate result info 324 | | |
|---|---|---|---|---|---|---|---|
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 &<br>1_5 | R1-1_1 - R1-1_z &<br>R1-5_1 - R1-5_z | 1_1, 2_1, 3_1, 4_1, & 5_1 | R1-6 | DST unit 2 | DST unit 2 | DST units 2-6 |
| 1_7 | after 1_2 &<br>1_5 | R1-2_1 - R1-2_z &<br>R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

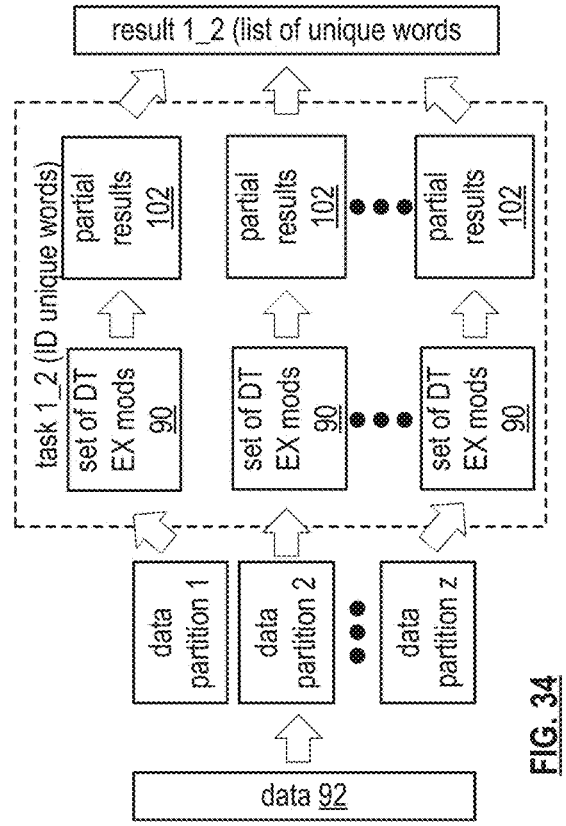
FIG. 34
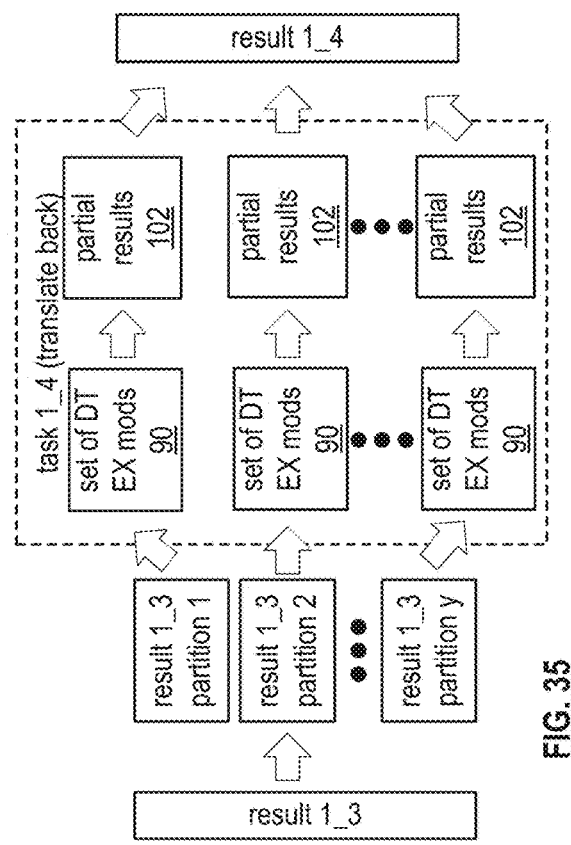
FIG. 35
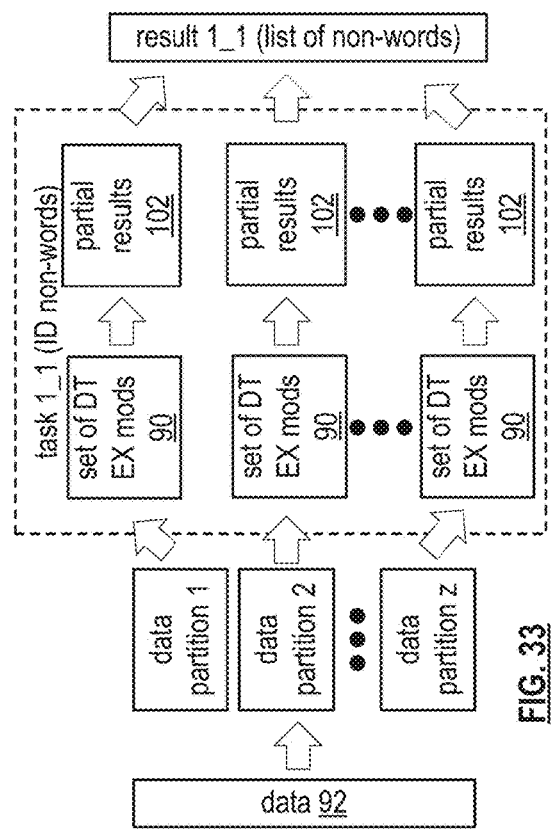
FIG. 33
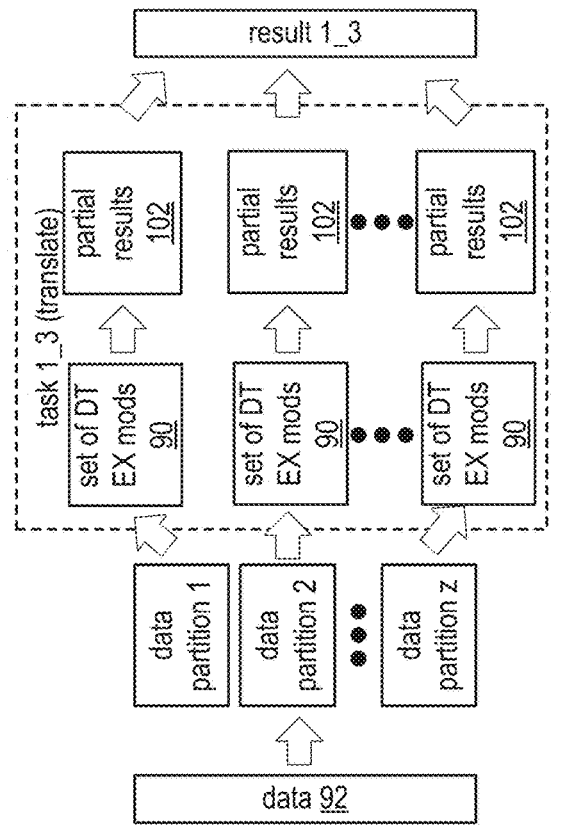

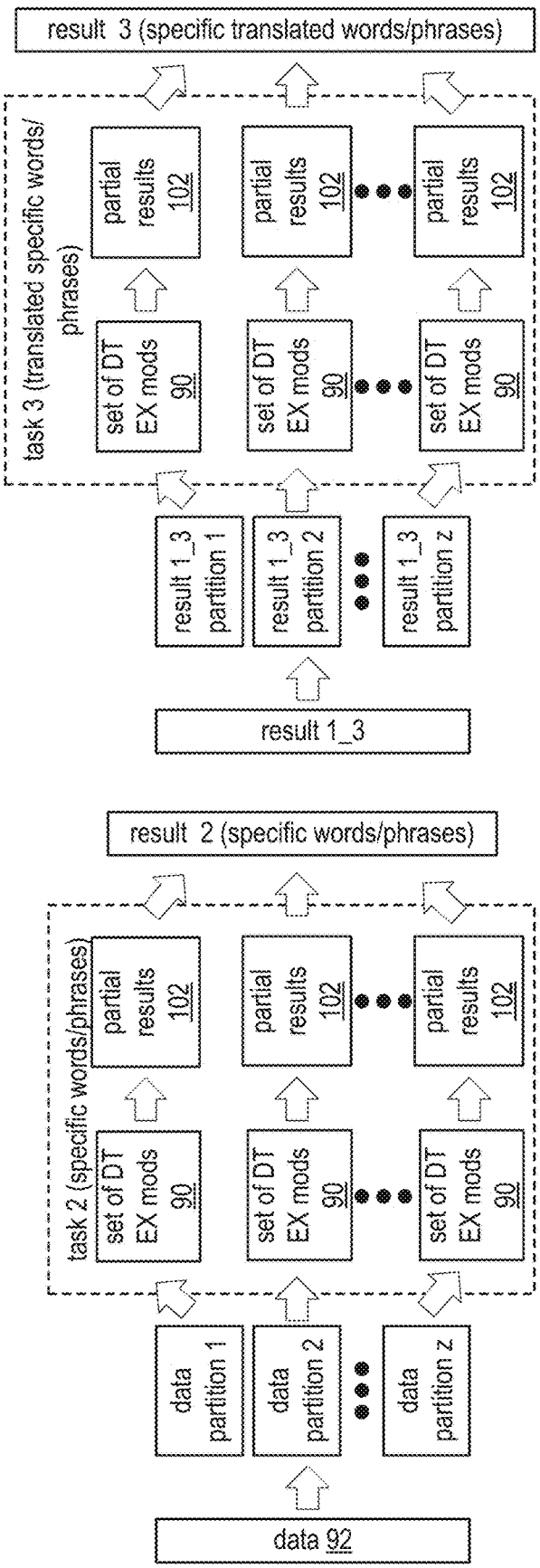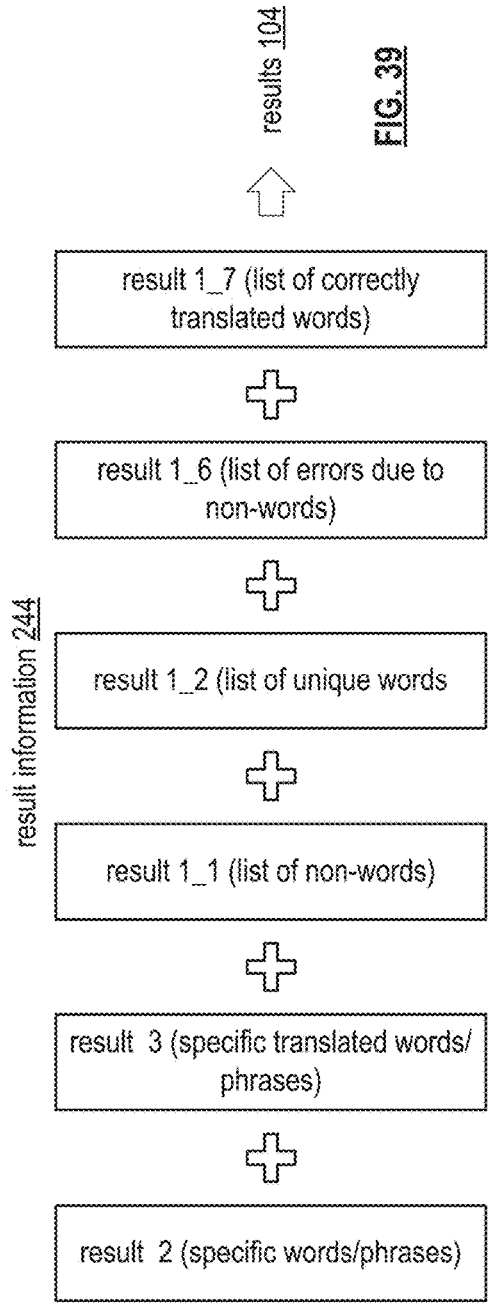

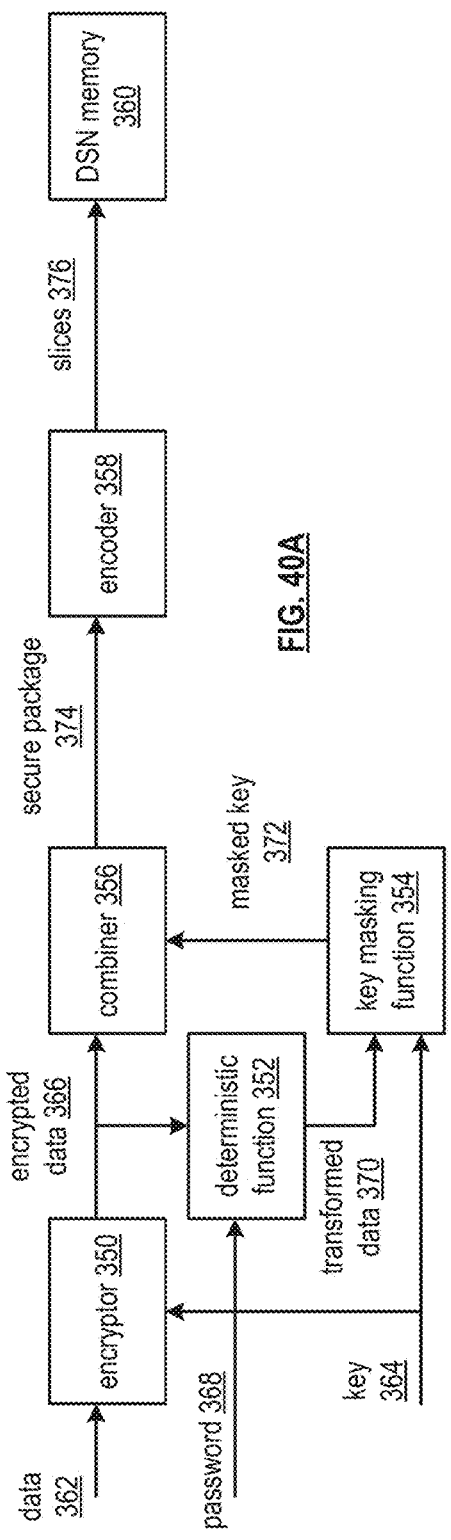
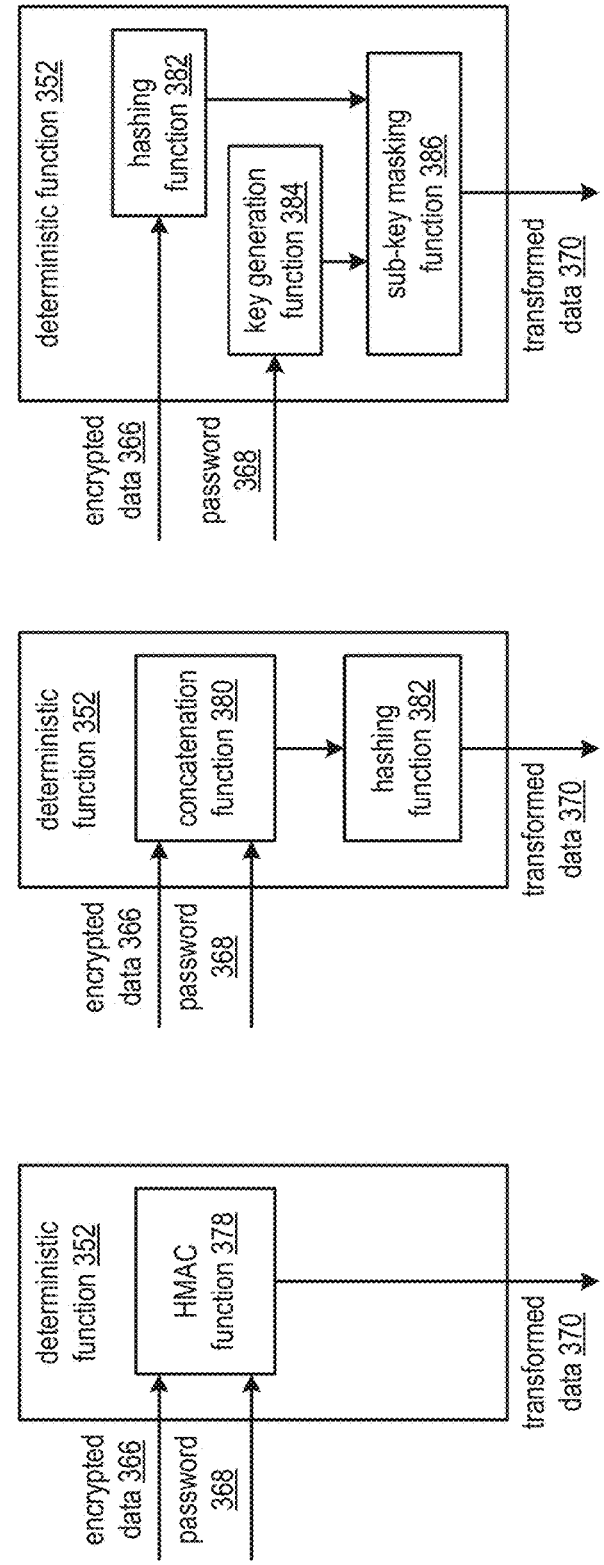

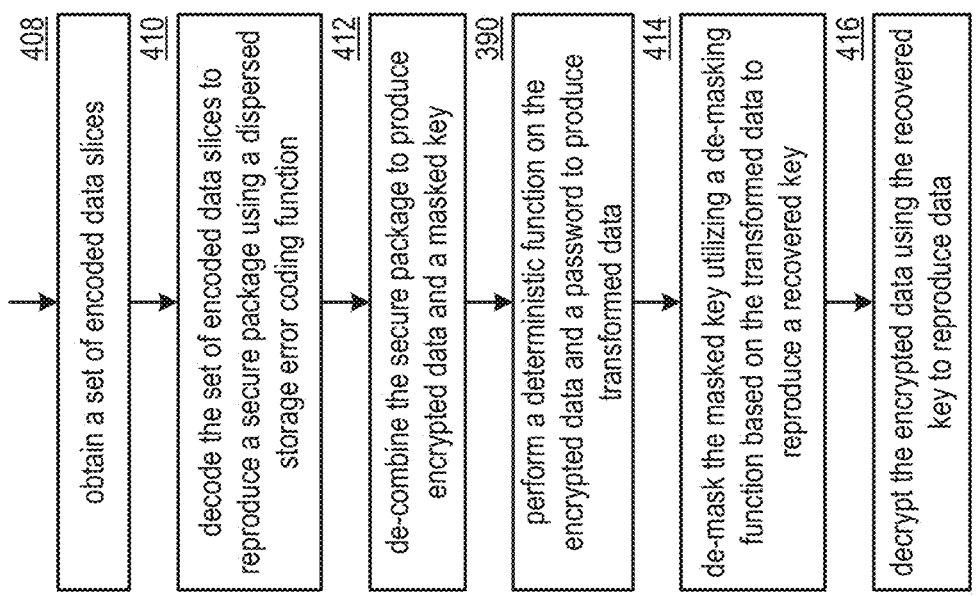

DS parameters table 610

| desired level 612 | decode threshold 614 | write threshold 616 | desired threshold 618 | total number 620 |
|---|---|---|---|---|
| highest | 10 | 12 | 16 | 16 |
| medium-high | 10 | 12 | 15 | 16 |
| medium | 10 | 12 | 14 | 16 |
| low-medium | 10 | 12 | 13 | 16 |
| lowest | 10 | 12 | 12 | 16 |

FIG. 47C storage compliance table 622

| desired level 612 | actual stored 624 | compliance process 626 |
|---|---|---|
| highest | 16 | delete original |
| highest | 15 | re-store |
| medium-high | 16 | delete original |
| medium-high | 15 | delete original |
| medium-high | 14 | retry slice |
| medium-high | 13 | re-store segment |
| medium-high | 12 | rebuild |

FIG. 47D

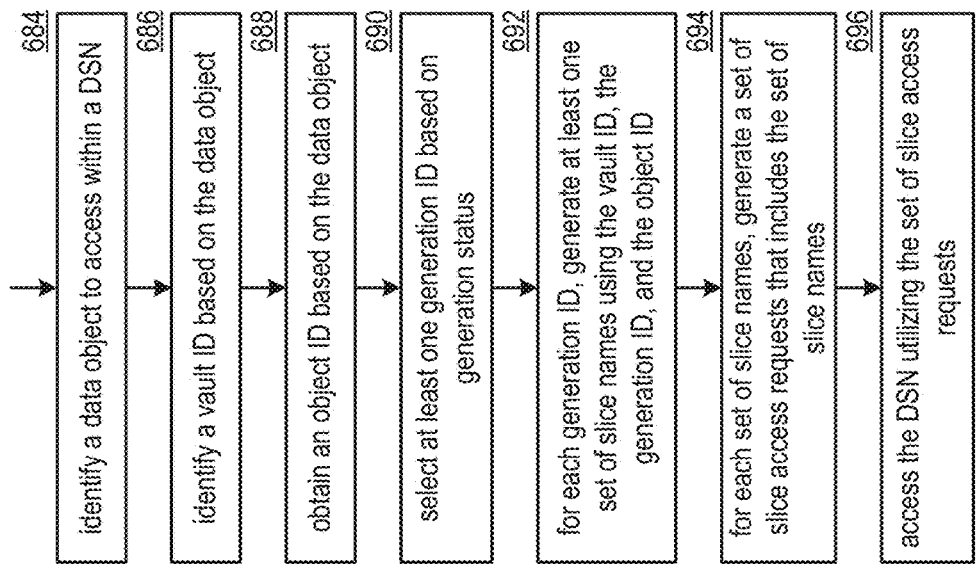

STORAGE SYSTEM WITH MULTIPLE STORAGE TYPES IN A VAST STORAGE NETWORK

CROSS REFERENCE TO RELATED PATENTS

The present U.S. Utility Patent Application claims priority pursuant to 35 U.S.C. § 120 as a continuation-in-part of U.S. Utility application Ser. No. 16/244,615, entitled "ALLOCATING REBUILDING QUEUE ENTRIES IN A DISPERSED STORAGE NETWORK", filed Jan. 10, 2019, which is a continuation of U.S. Utility application Ser. No. 15/439,383, entitled "ALLOCATING REBUILDING QUEUE ENTRIES IN A DISPERSED STORAGE NETWORK", filed Feb. 22, 2017, issued as U.S. Pat. No. 10,241,866 on Mar. 26, 2019, which is a continuation-in-part of U.S. Utility application Ser. No. 15/095,558, entitled "ACHIEVING STORAGE COMPLIANCE IN A DISPERSED STORAGE NETWORK", filed Apr. 11, 2016, issued as U.S. Pat. No. 10,013,203 on Jul. 3, 2018, which is a continuation-in-part of U.S. Utility application Ser. No. 14/088,794, entitled "ACHIEVING STORAGE COMPLIANCE IN A DISPERSED STORAGE NETWORK", filed Nov. 25, 2013, issued as U.S. Pat. No. 9,311,187 on Apr. 12, 2016, which claims priority pursuant to 35 U.S.C. § 119(e) to U.S. Provisional Application No. 61/748,891, entitled "OBFUSCATING AN ENCRYPTION KEY IN A DISPERSED STORAGE NETWORK", filed Jan. 4, 2013, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 24 is a schematic block diagram of an example of a storage operation of a DST execution unit in accordance with the present invention;

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 40A is a schematic block diagram of an embodiment of a data obfuscation system in accordance with the present invention;

FIG. 40B is a schematic block diagram of an embodiment of a deterministic function module in accordance with the present invention;

FIG. 40C is a schematic block diagram of another embodiment of a deterministic function module in accordance with the present invention;

FIG. 40D is a schematic block diagram of another embodiment of a deterministic function module in accordance with the present invention;

FIG. 40G is a flowchart illustrating an example of de-obfuscating data in accordance with the present invention;

Figure 47A:
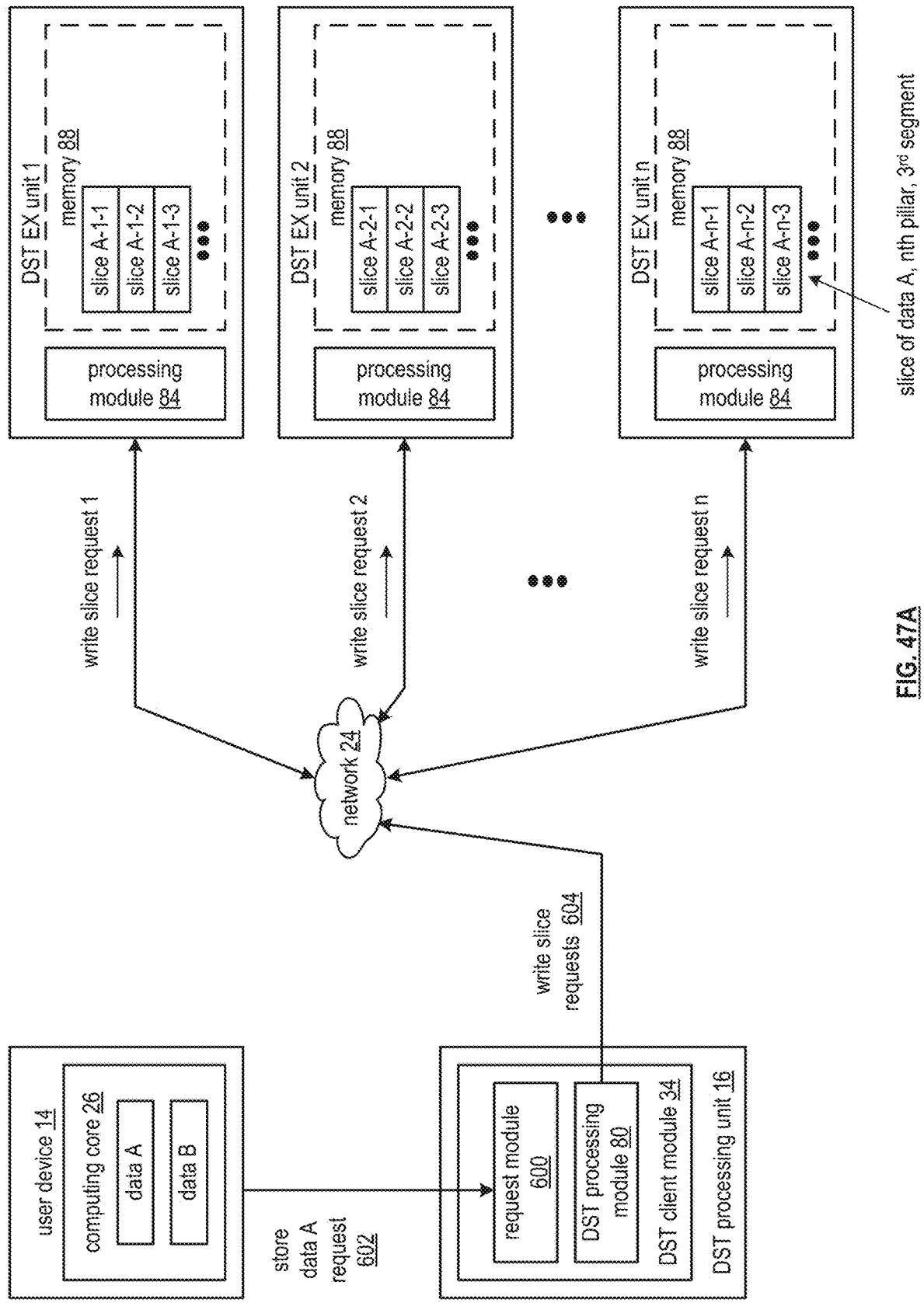
Figure 47B:
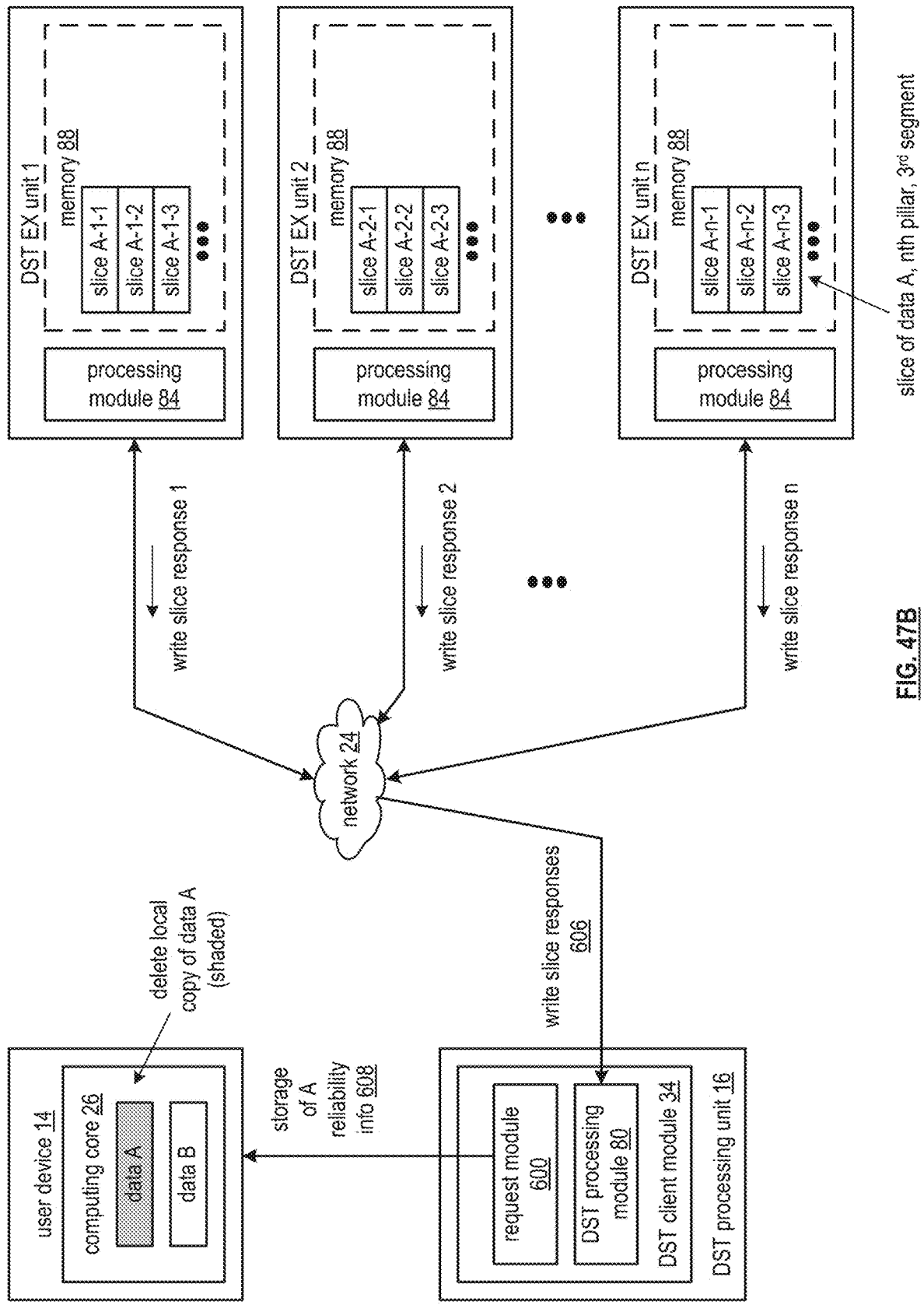
Figure 47E:
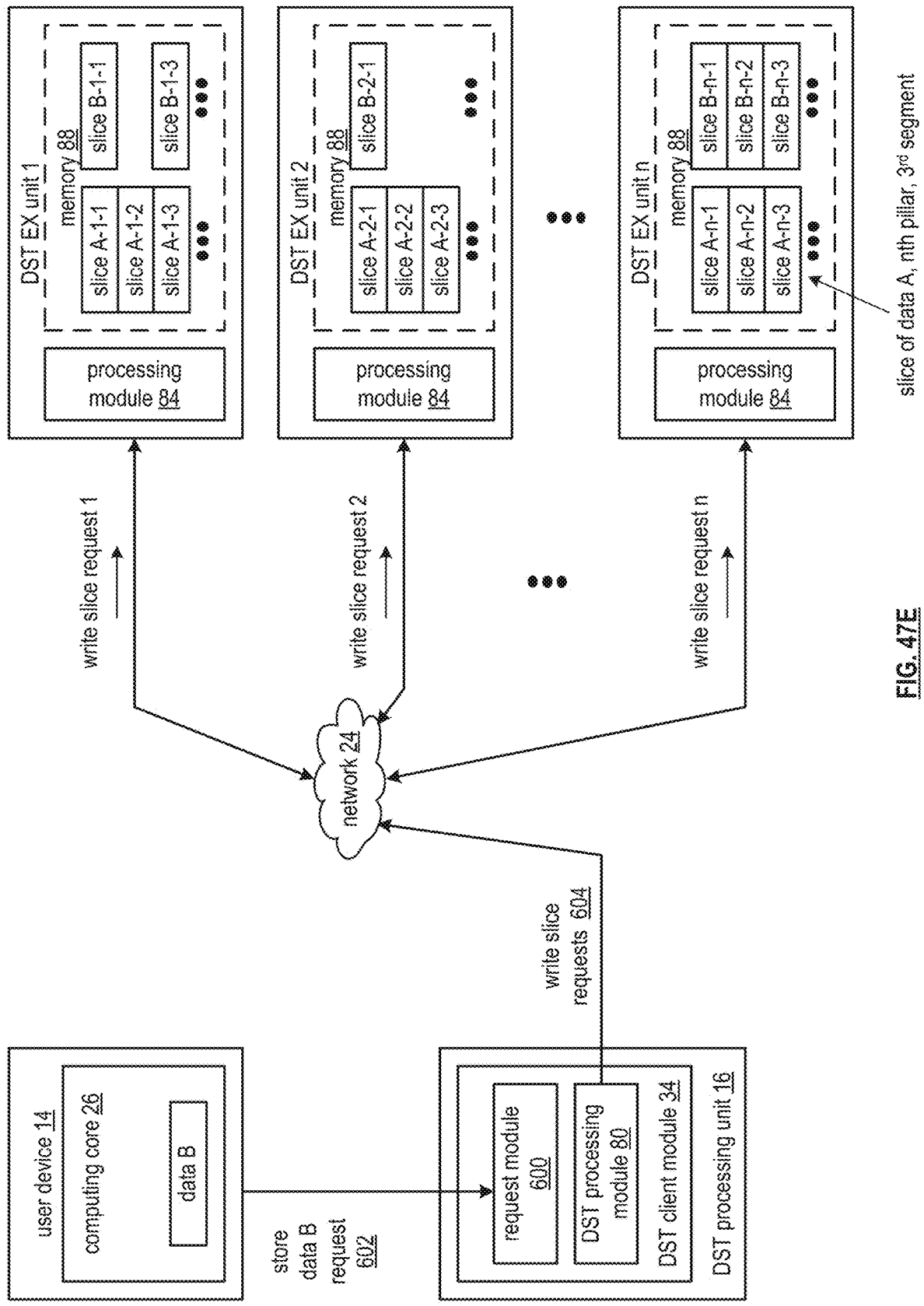
Figure 47F:
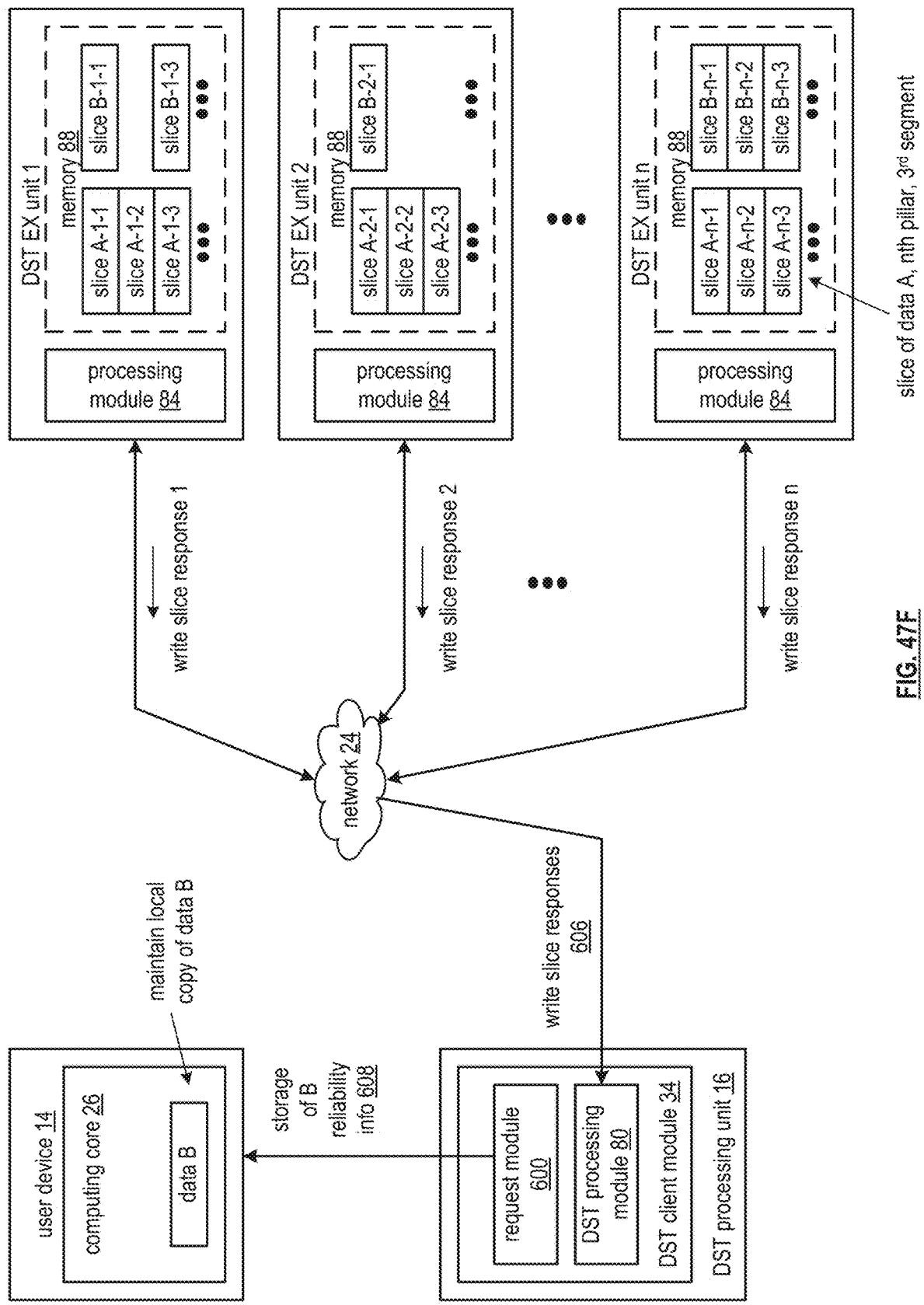
Figure 47G:
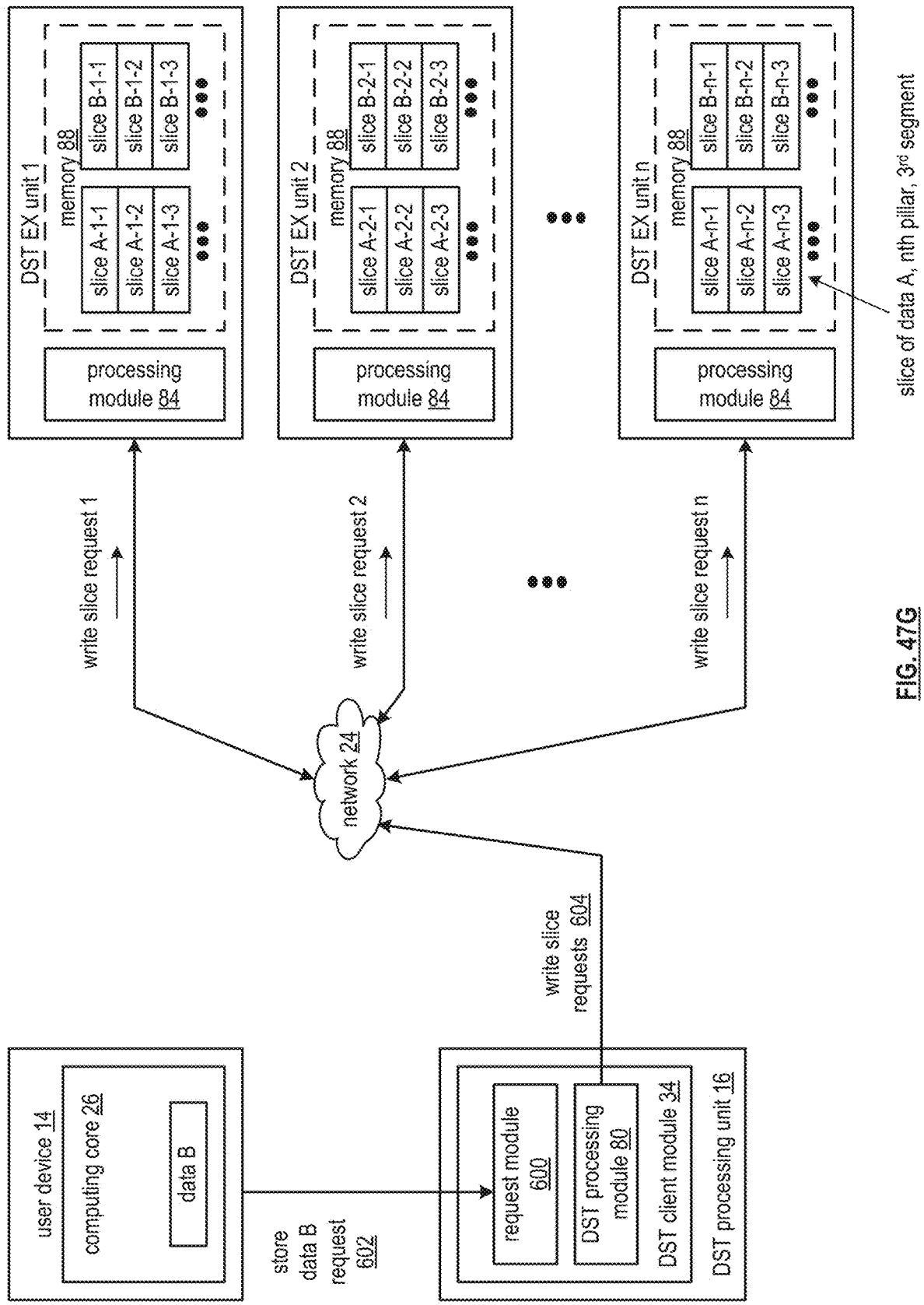
Figure 47H:
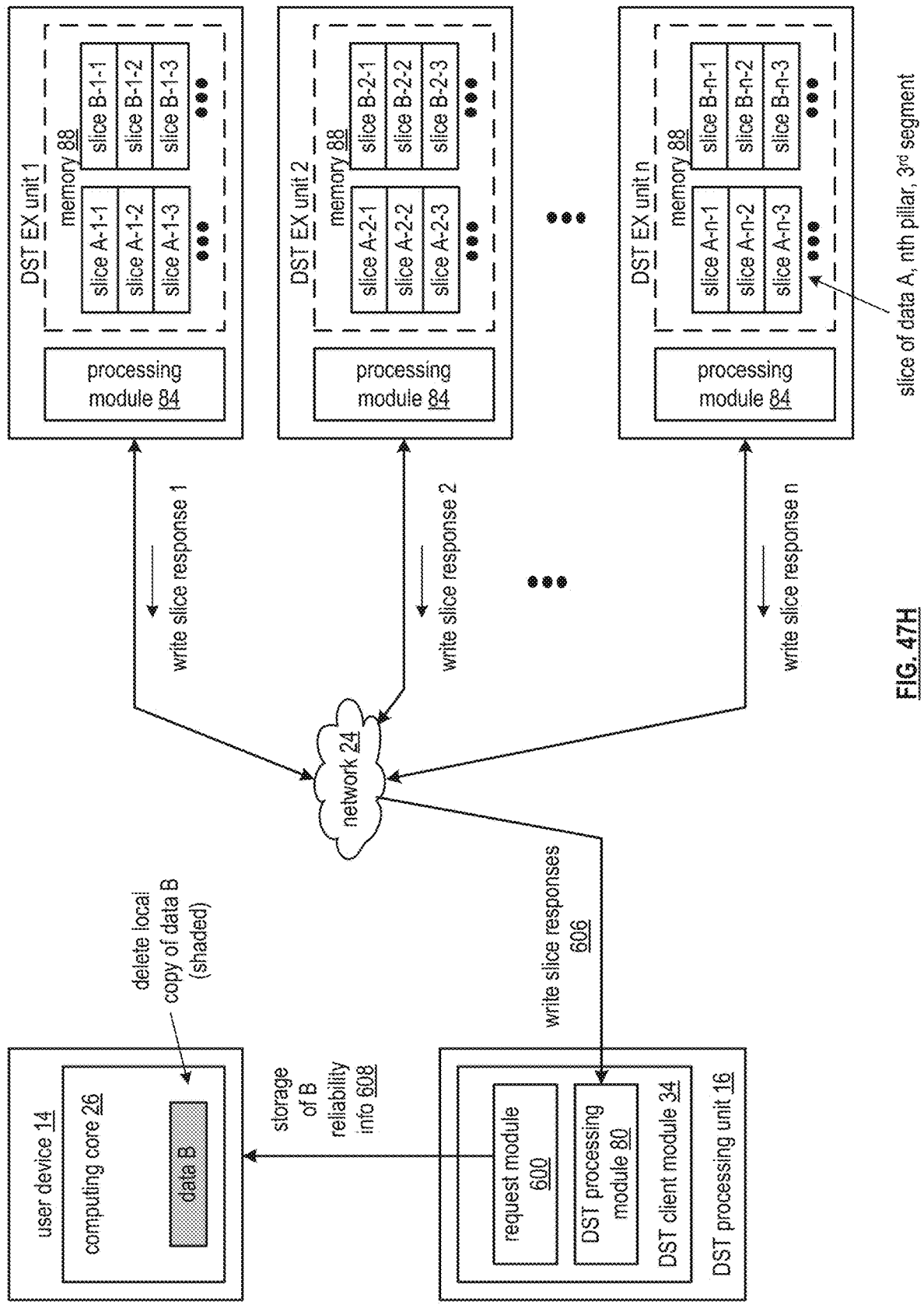
Figure 47I:
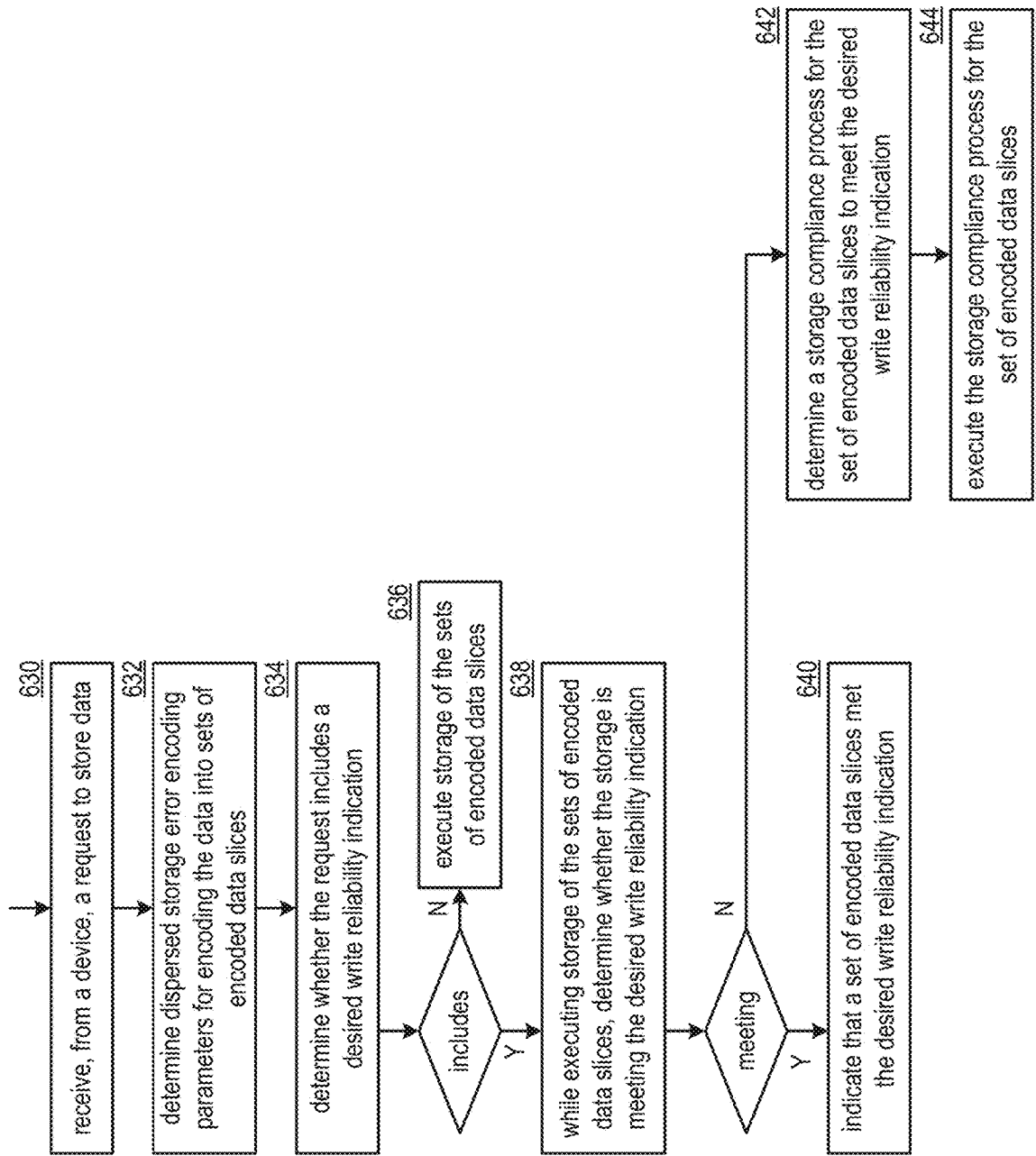
Figure 48A:
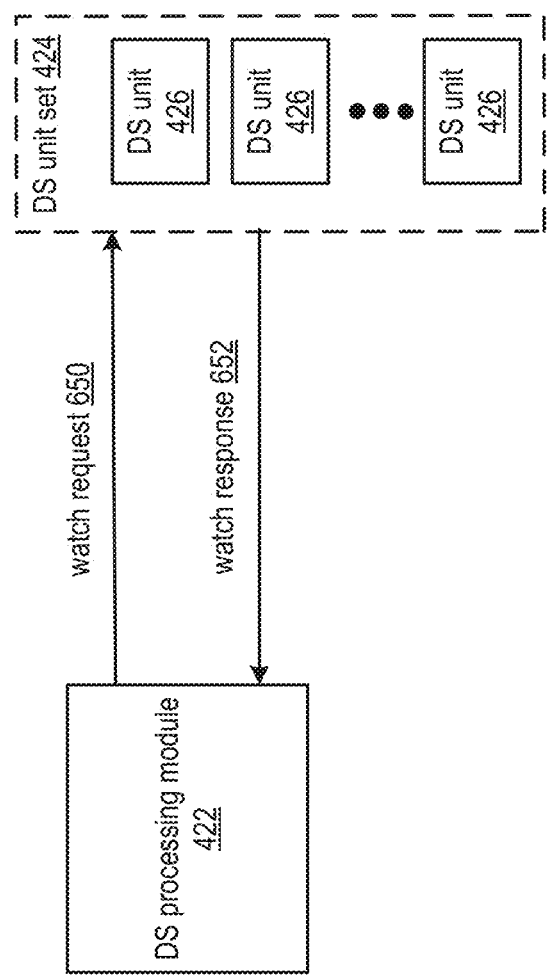
Figure 48B:
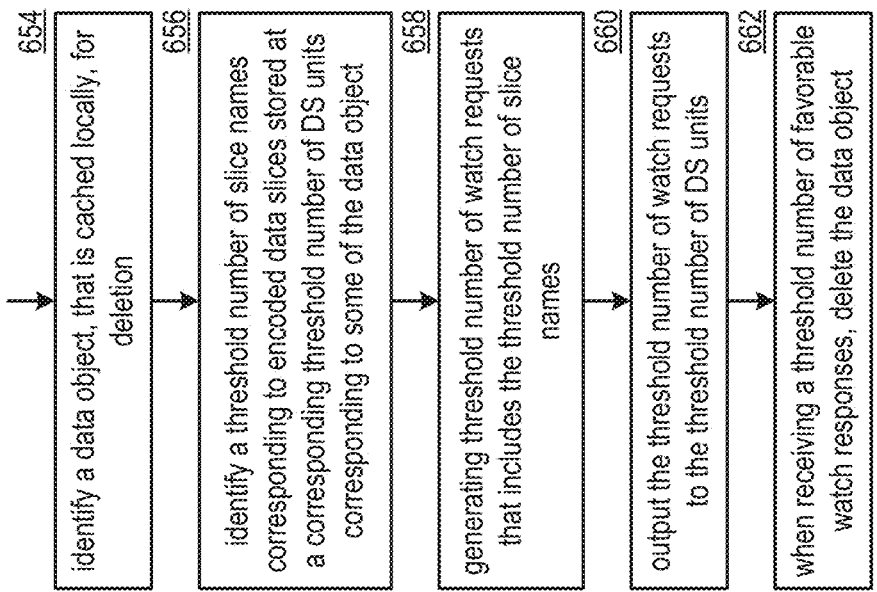
Figure 49A:
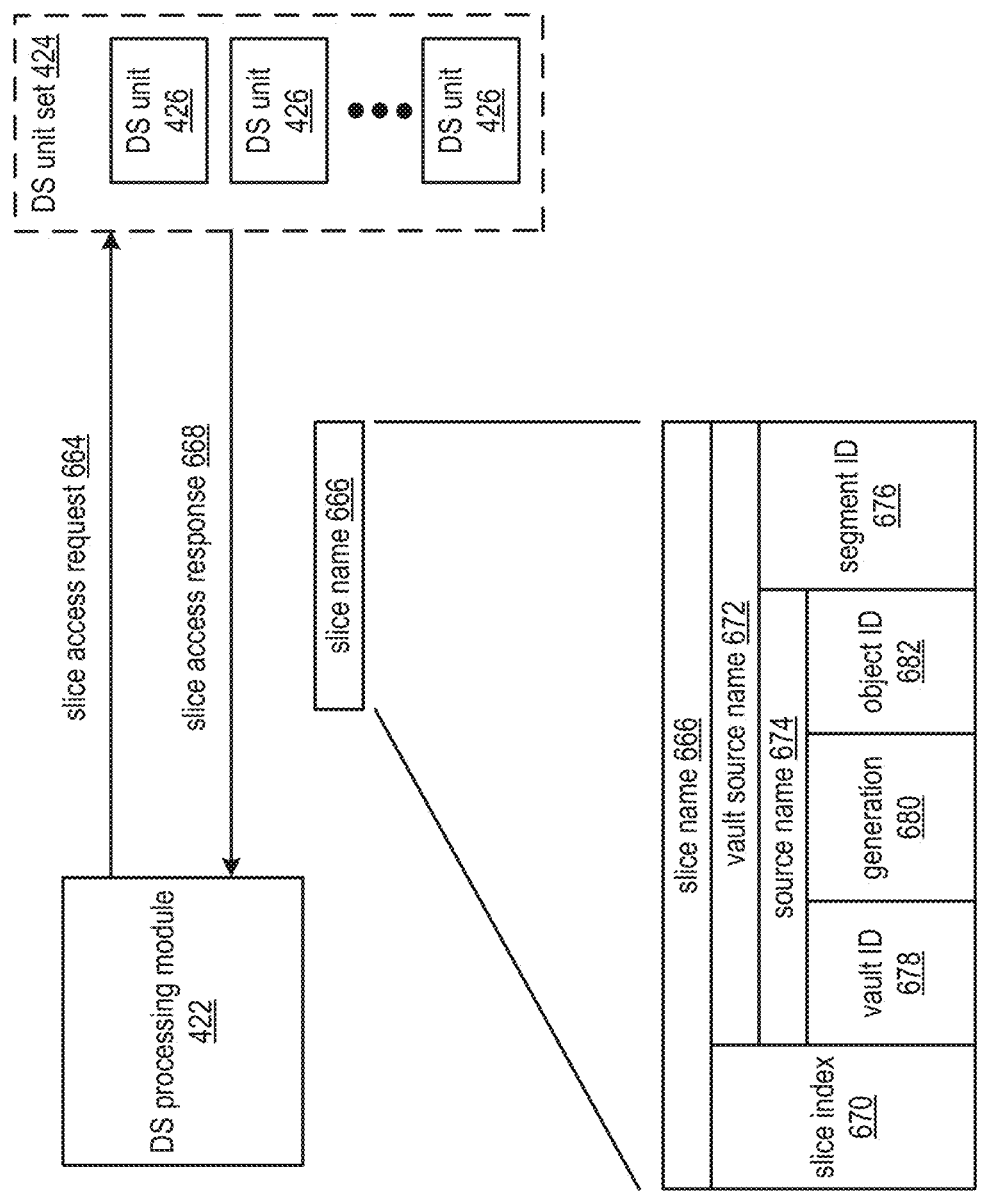

FIGS. 47A-B are schematic block diagrams of embodiments of a dispersed storage network in accordance with the present invention;

FIG. 47C is a diagram illustrating an example of a dispersed storage (DS) parameters table in accordance with the present invention;

FIG. 47D is a diagram illustrating an example of a storage compliance table in accordance with the present invention;

FIGS. 47E, 47F, 47G and 47H are schematic block diagrams of more embodiments of a dispersed storage network in accordance with the present invention;

FIG. 47I is a flowchart illustrating an achieving storage compliance in accordance with the present invention;

FIG. 48A is a schematic block diagram of another embodiment of a dispersed storage system in accordance with the present invention;

FIG. 48B is a flowchart illustrating an example of deleting data in accordance with the present invention;

FIG. 49A is a schematic block diagram of another embodiment of a dispersed storage system in accordance with the present invention; and FIG. 49B is a flowchart illustrating another example of accessing data in accordance with the present invention.

DETAILED DESCRIPTION OF THE INVENTION

Figure 1:
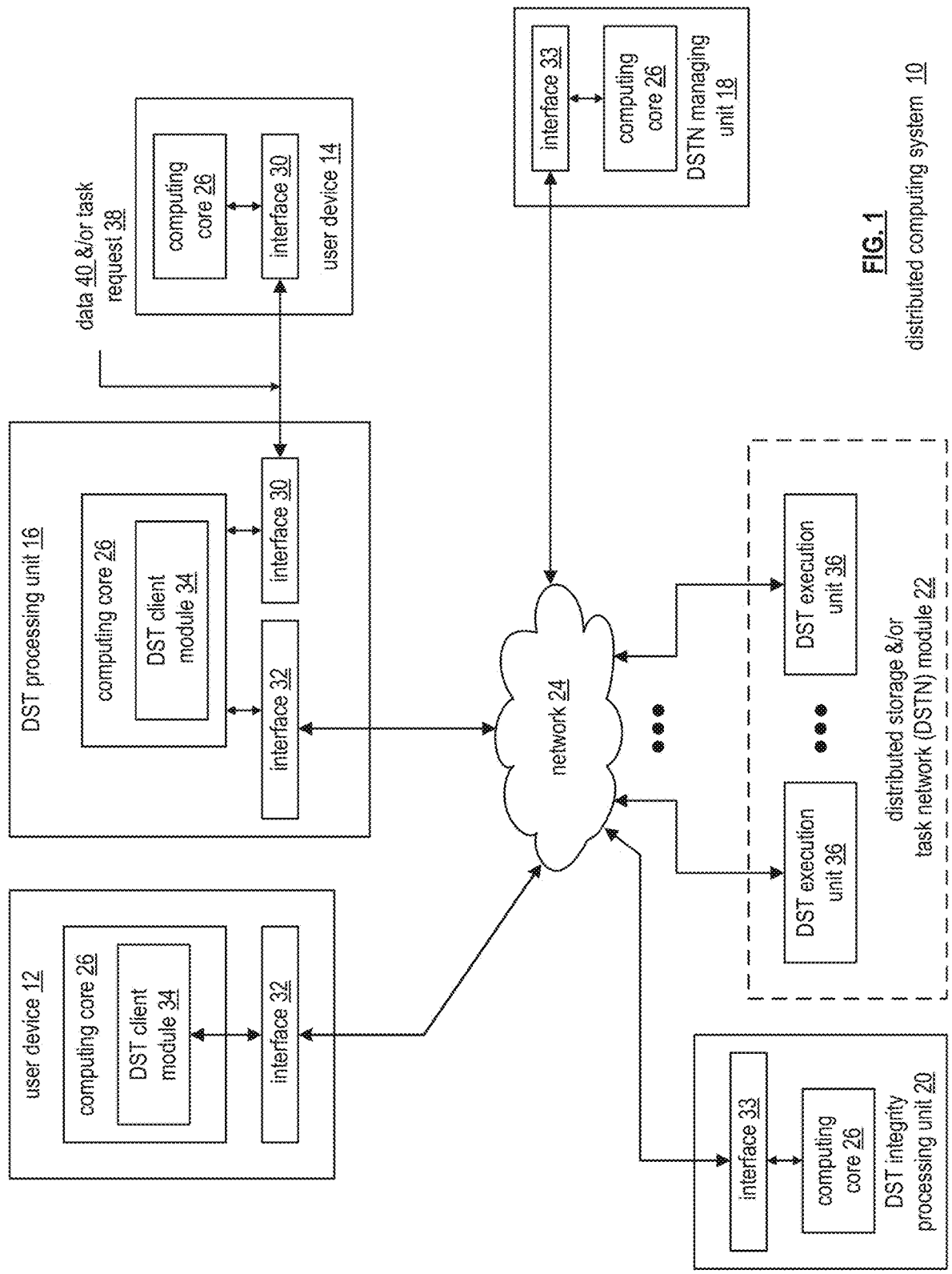
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
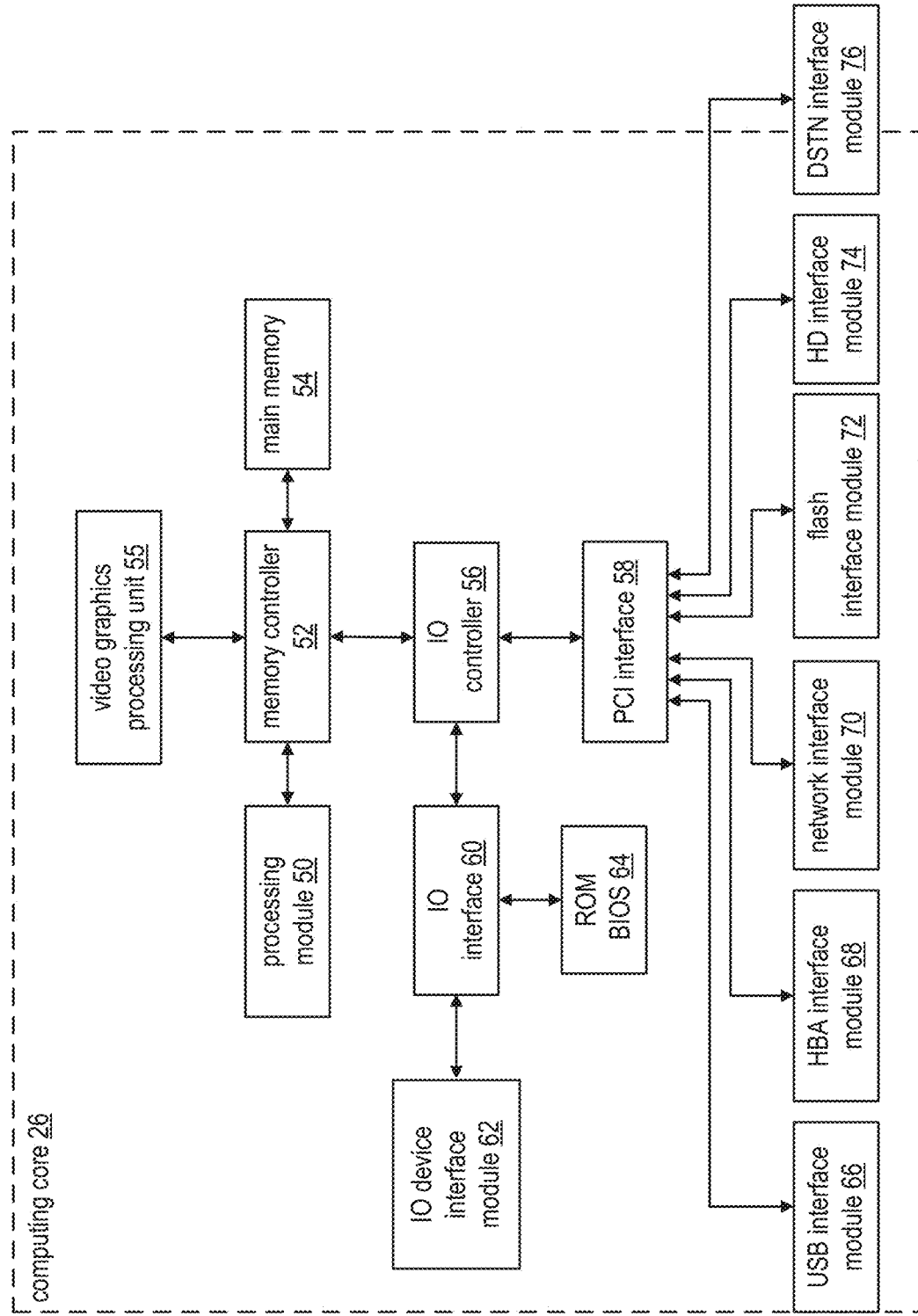
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
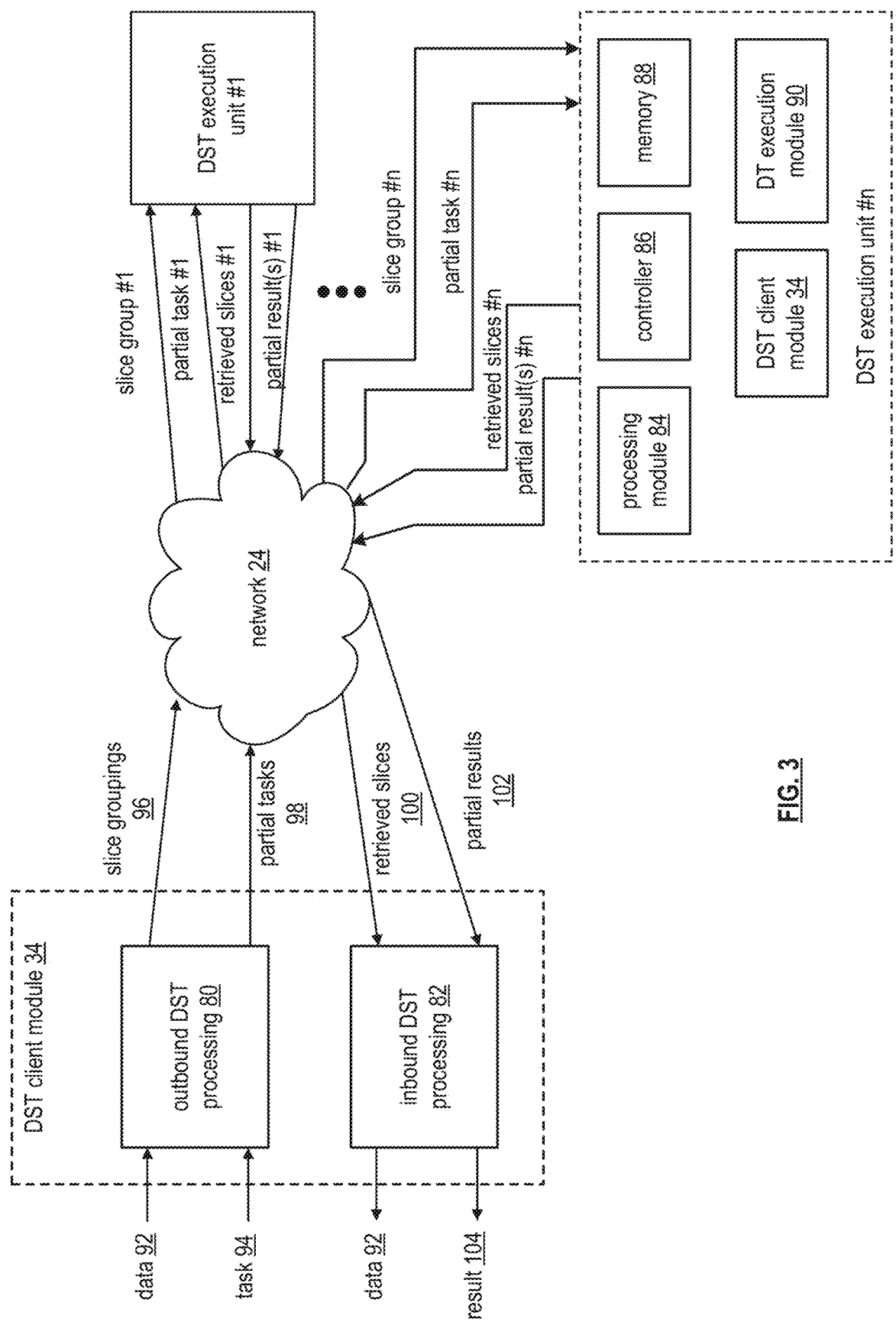
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
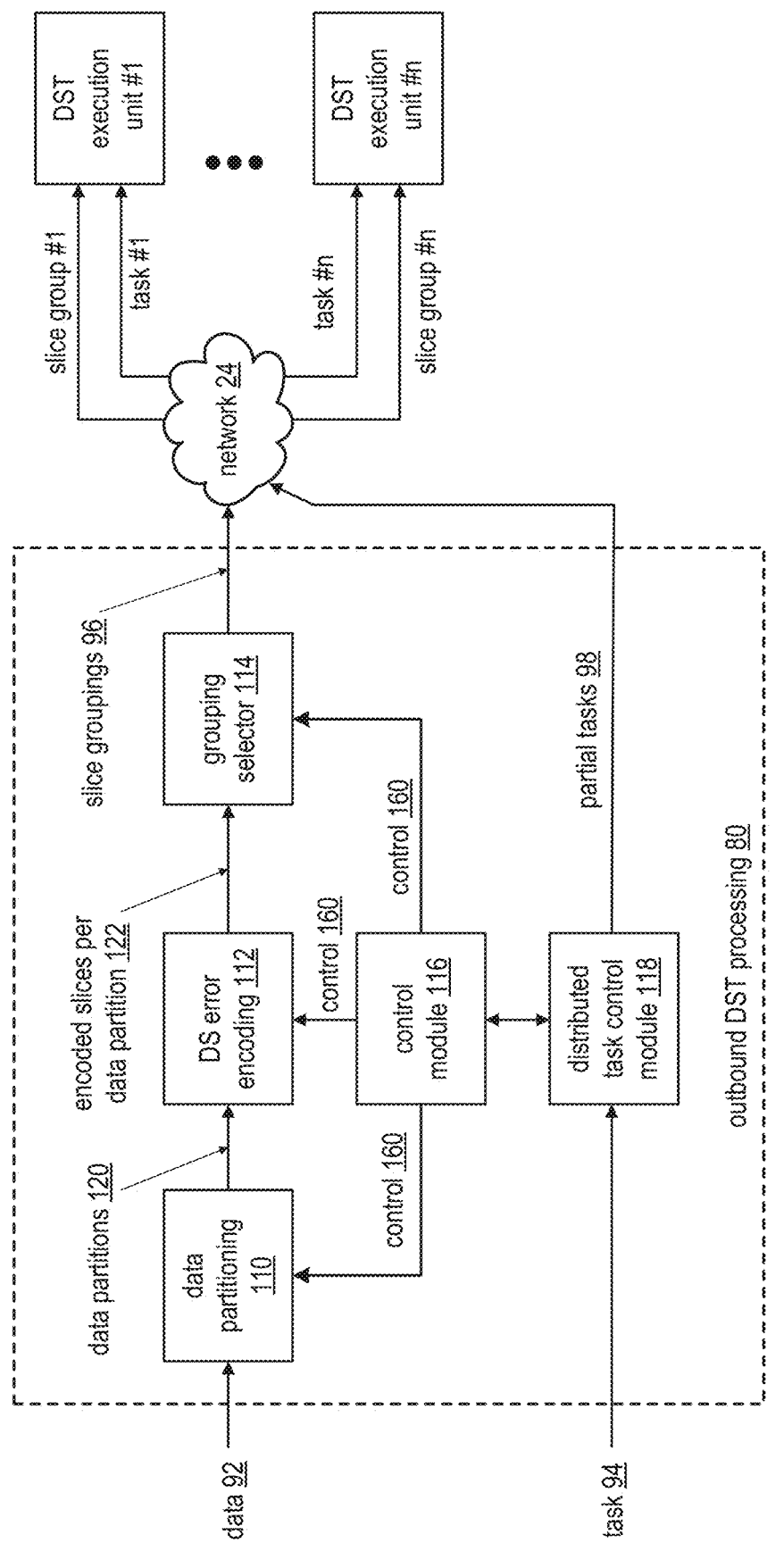
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
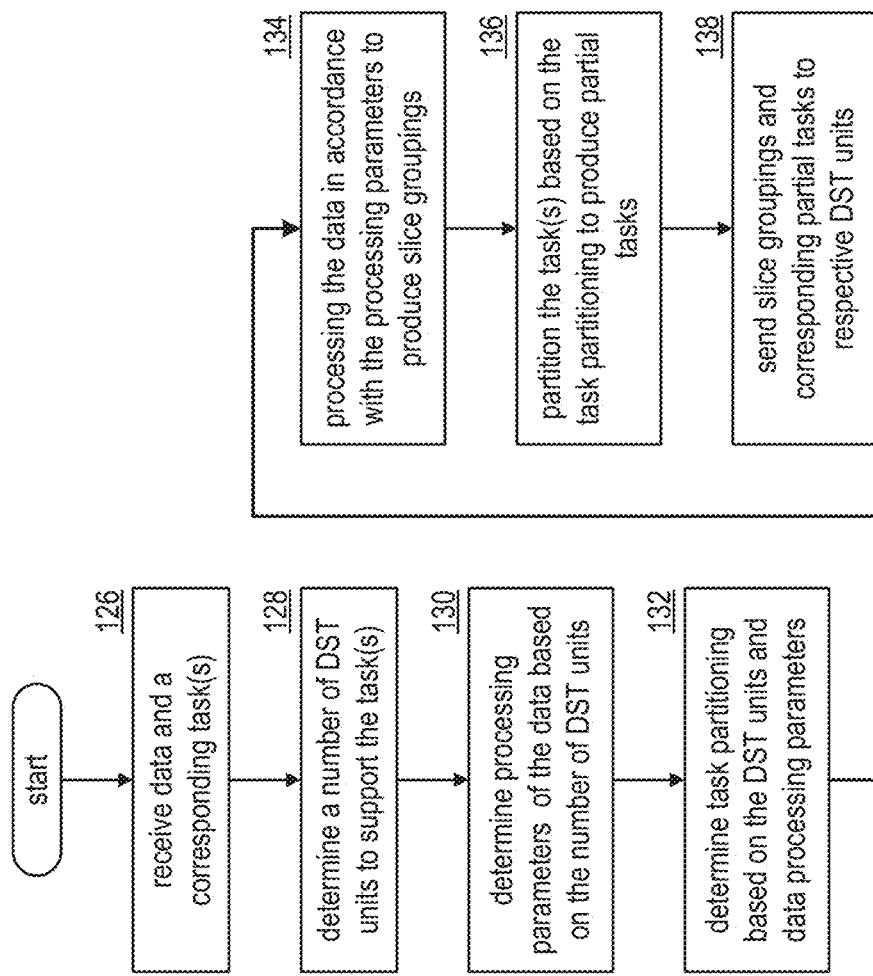
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
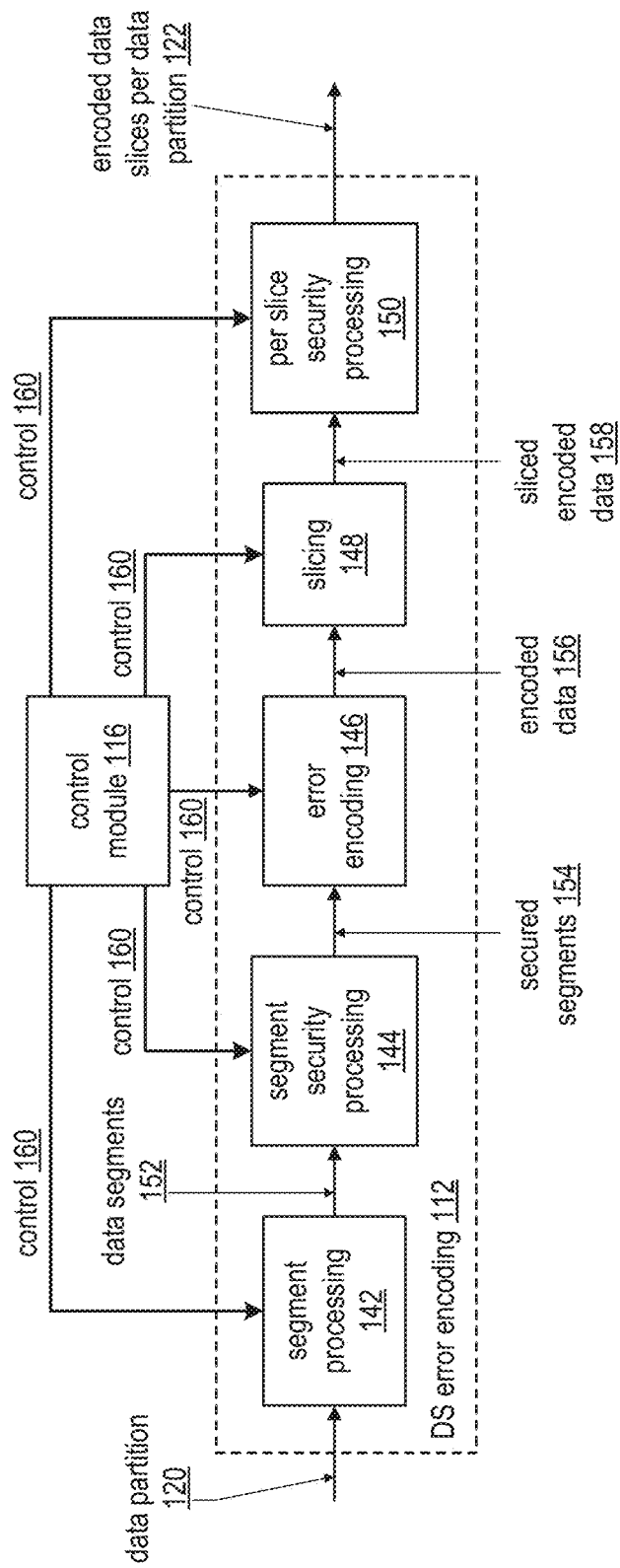
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
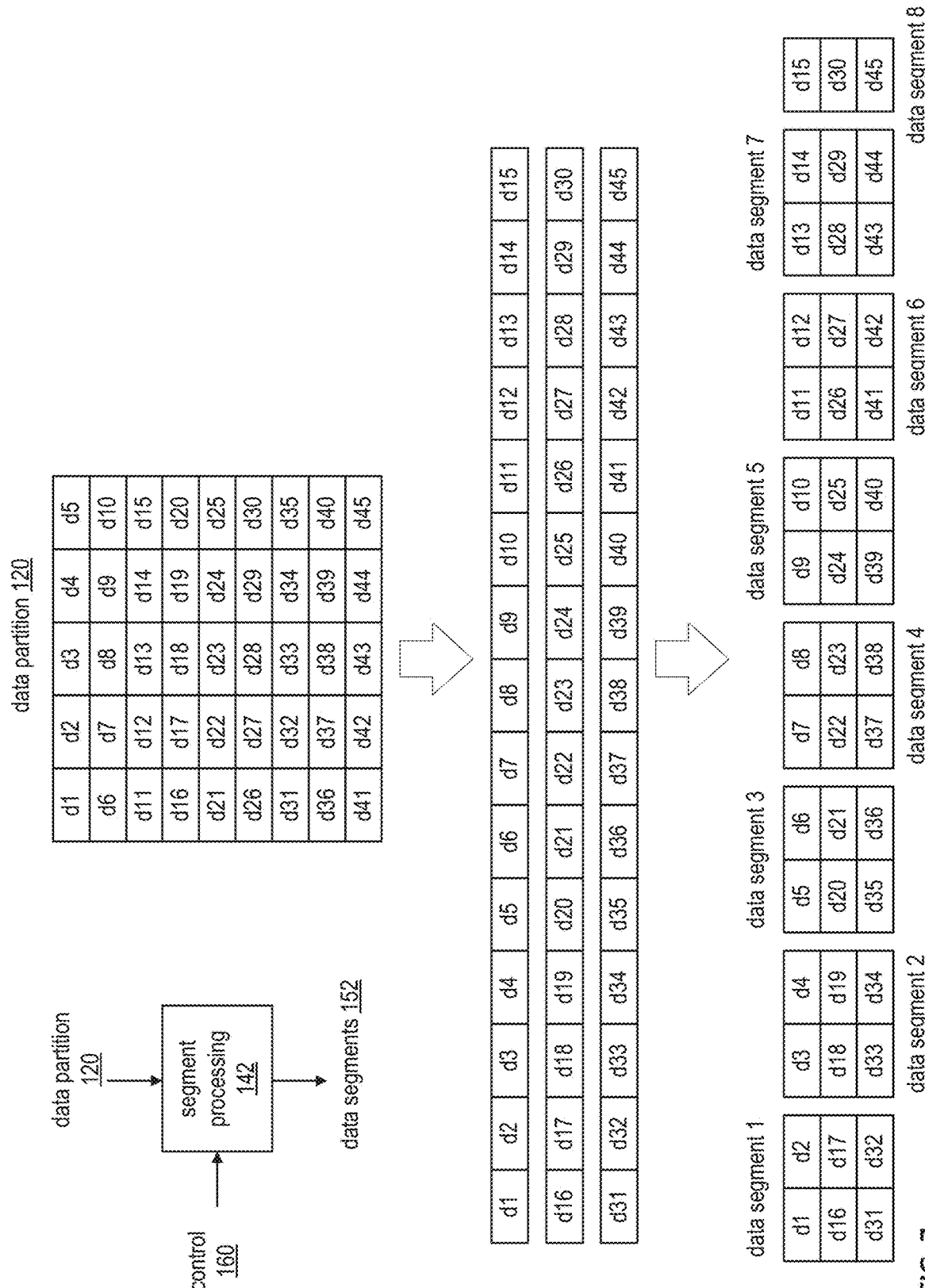
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
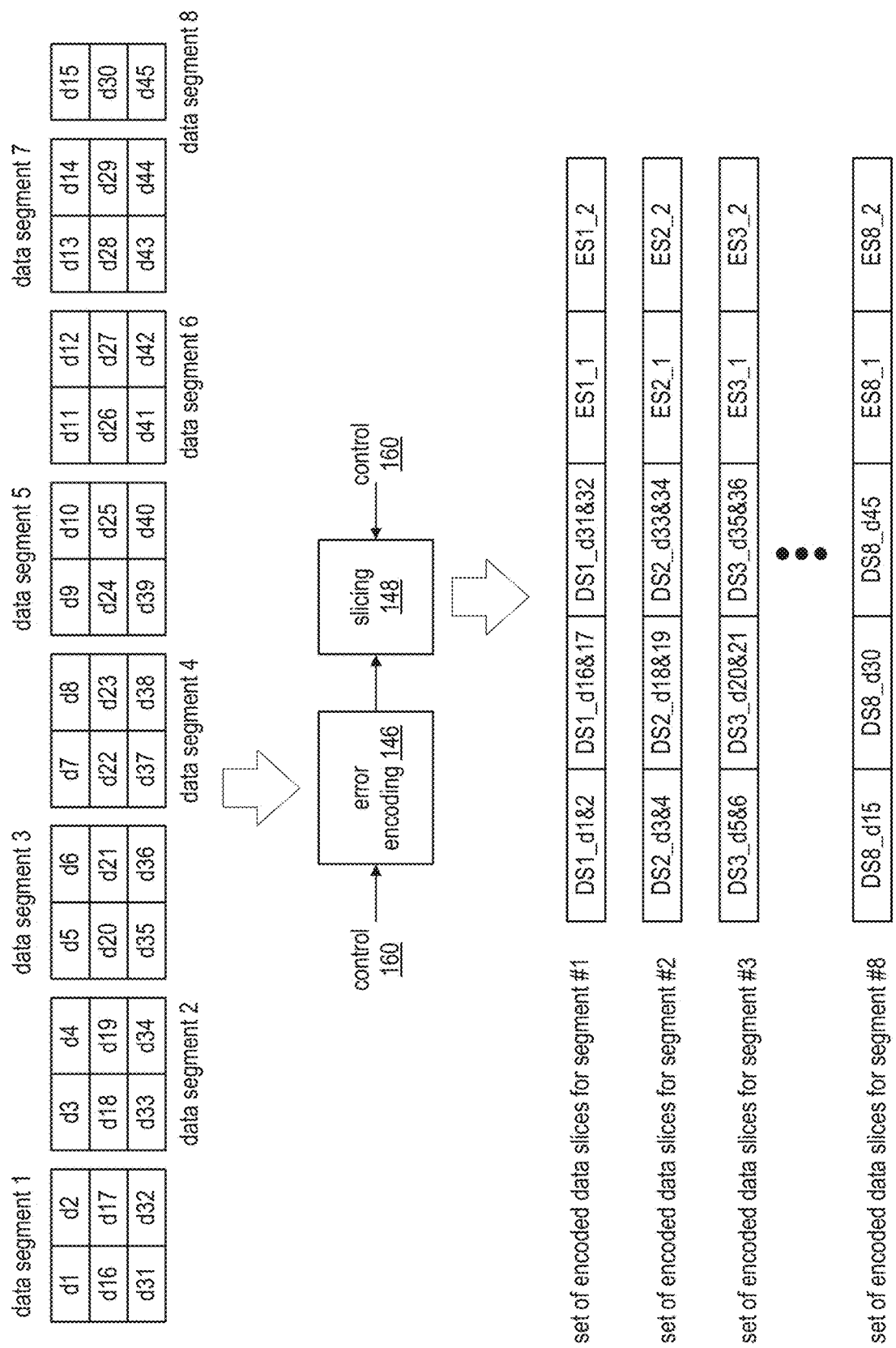
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
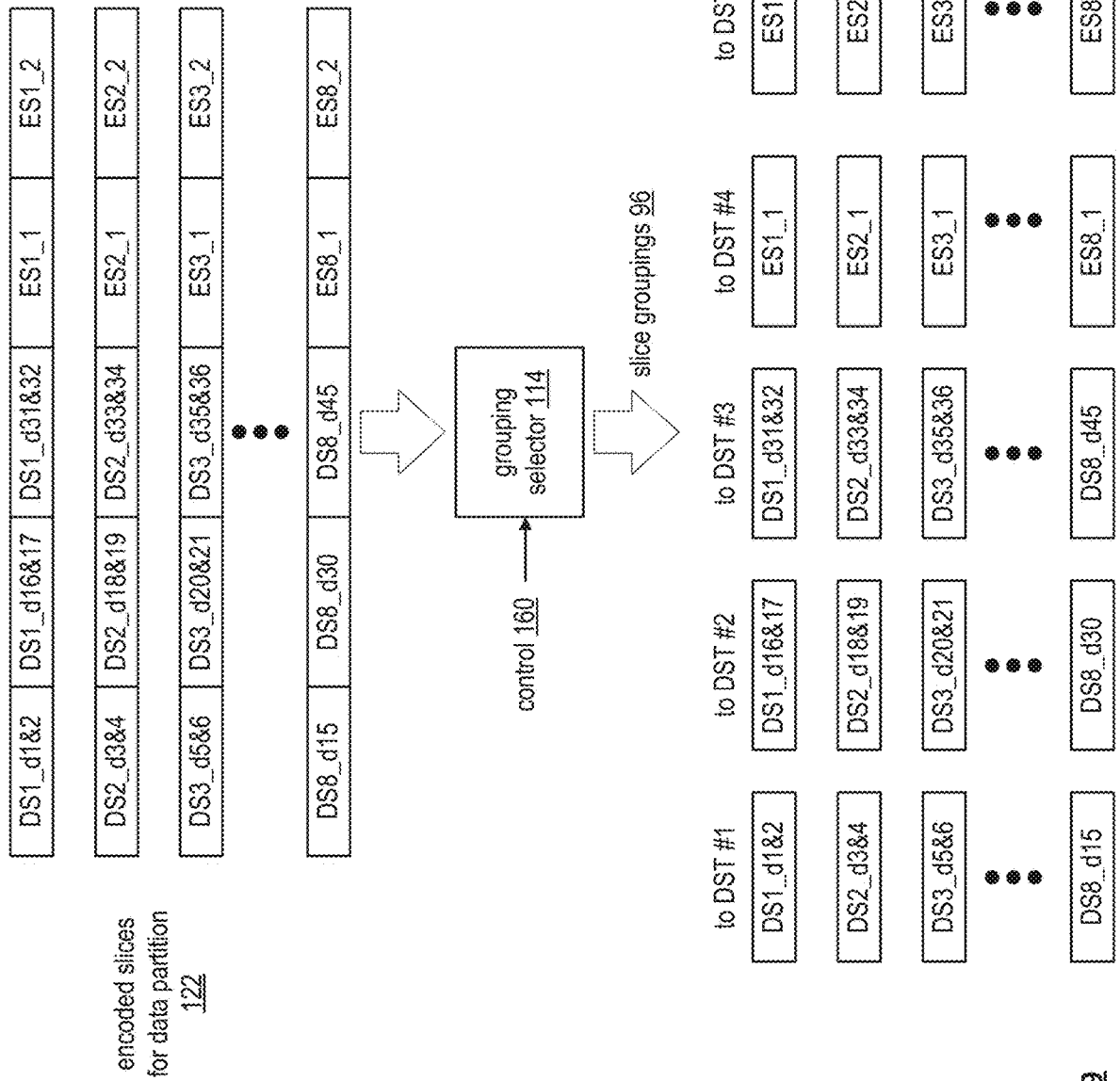
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
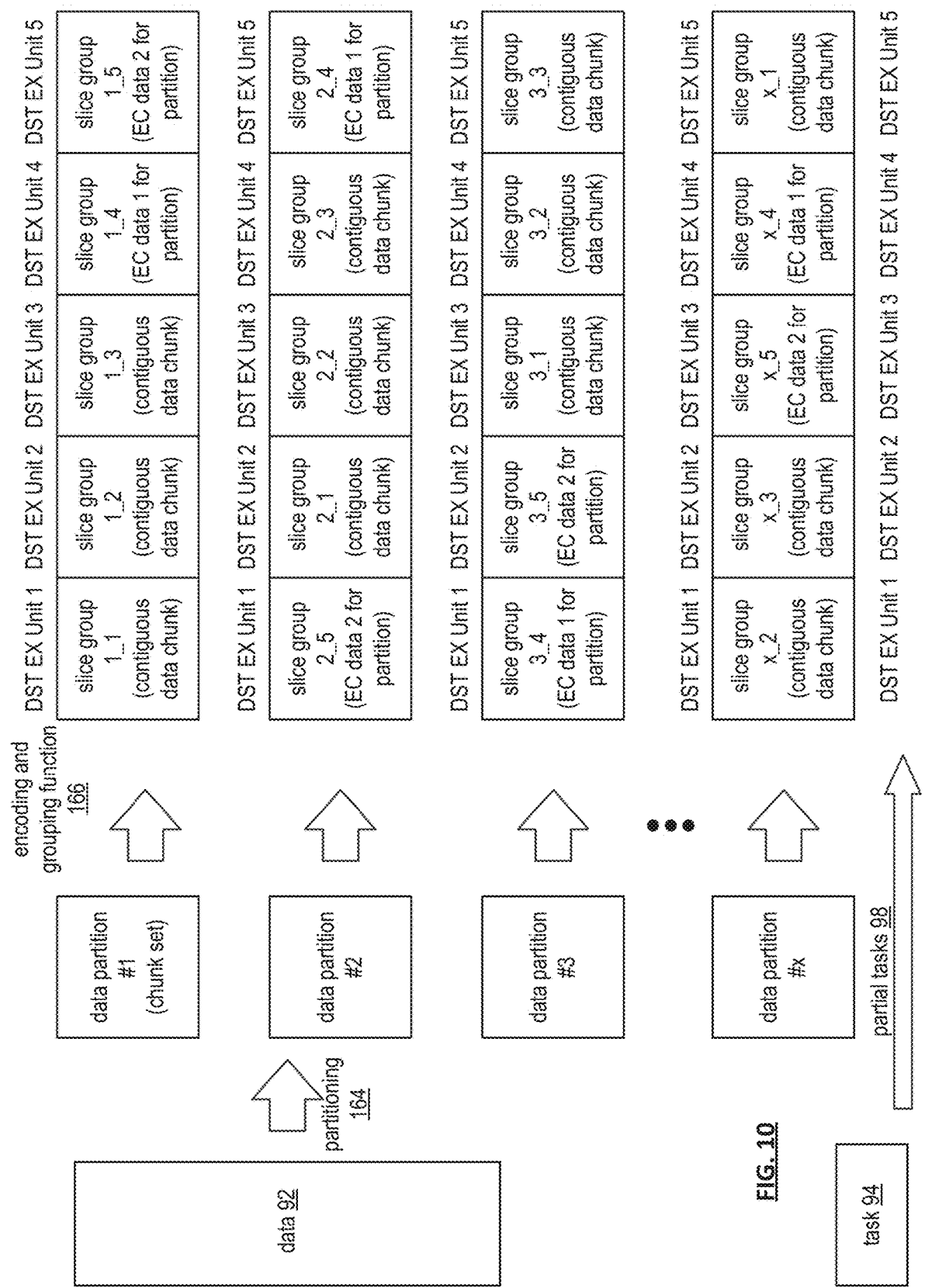
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-*x*, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
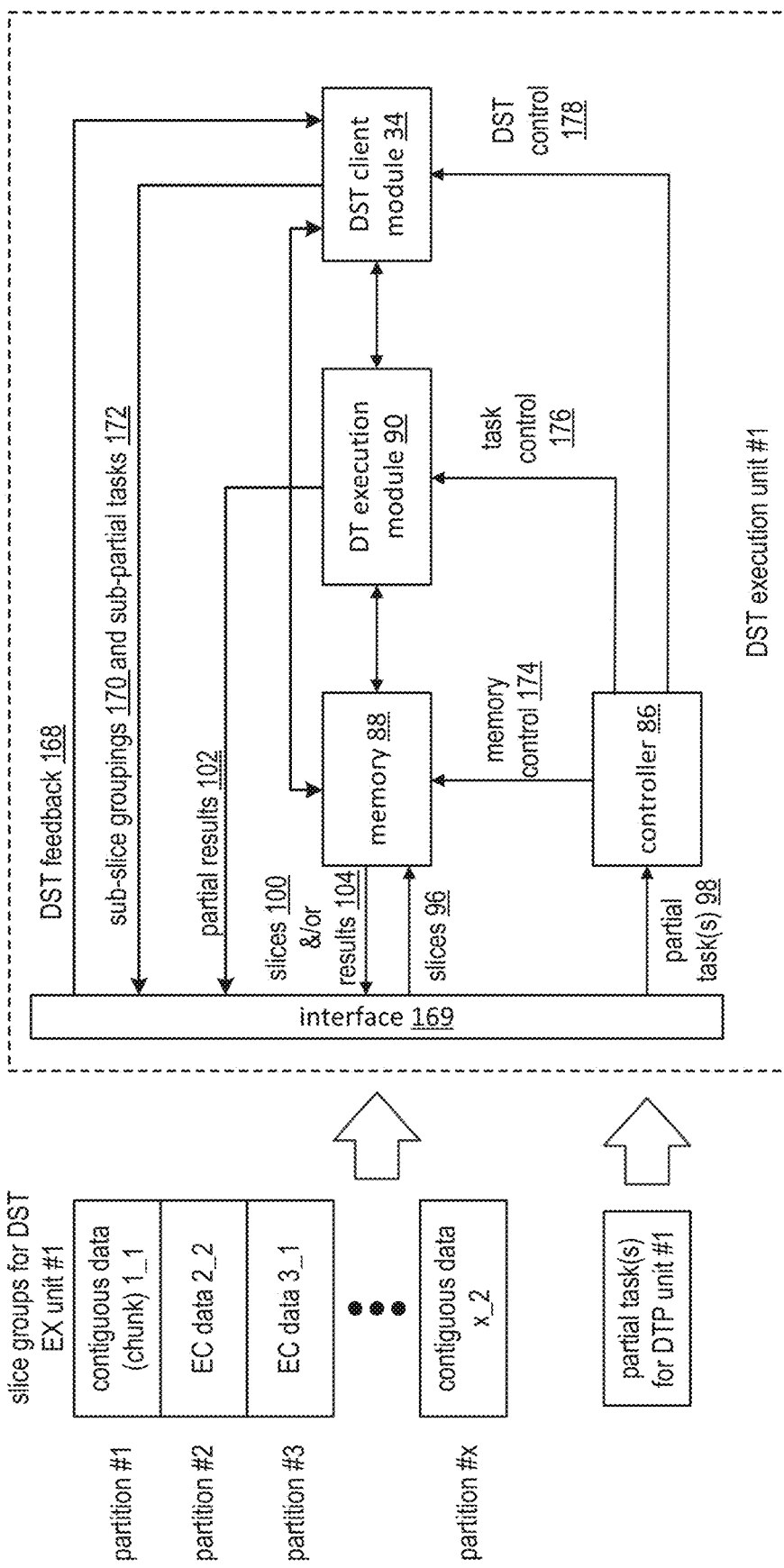
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
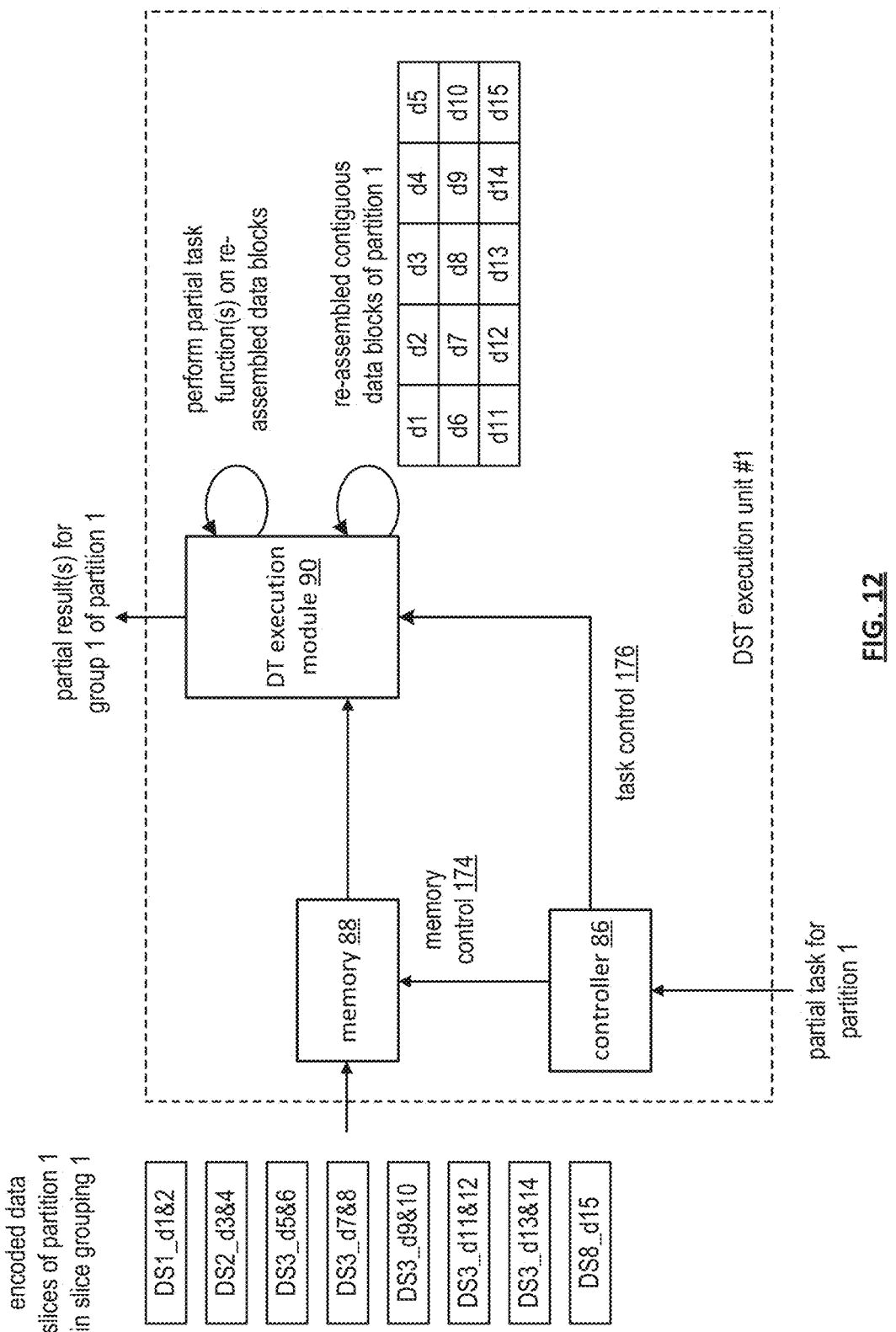
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
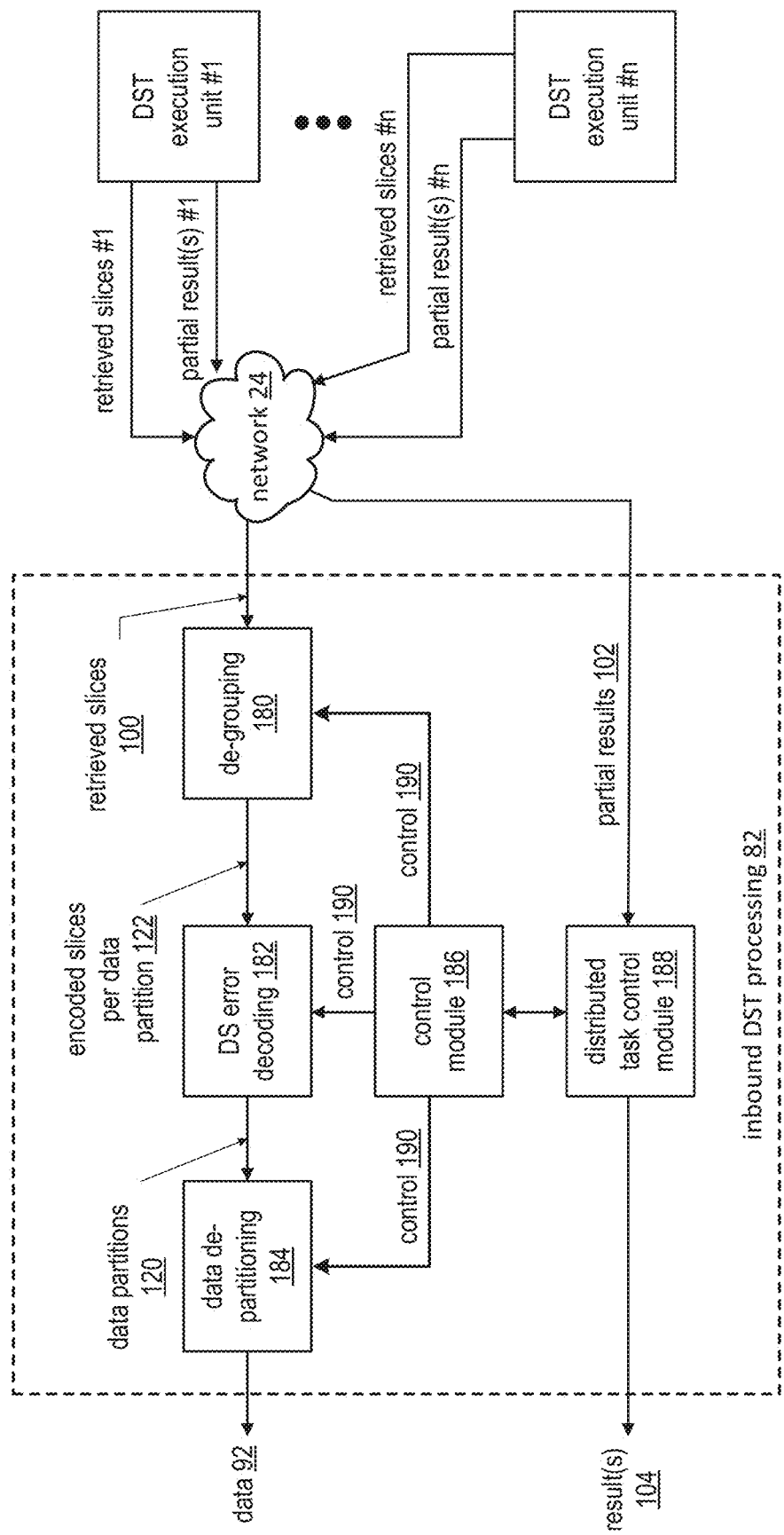
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
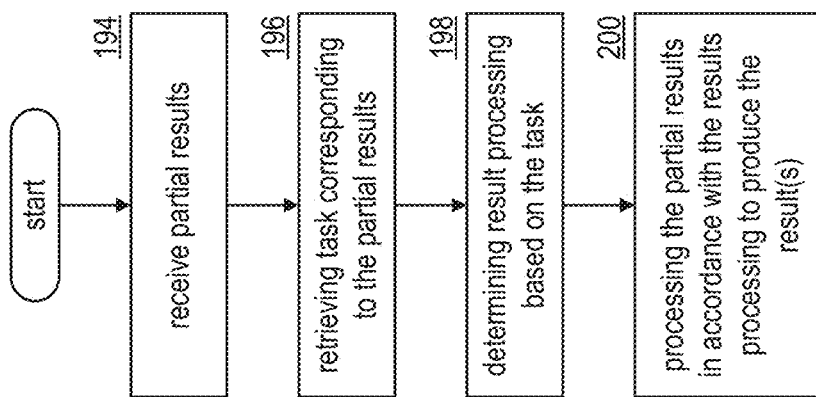
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
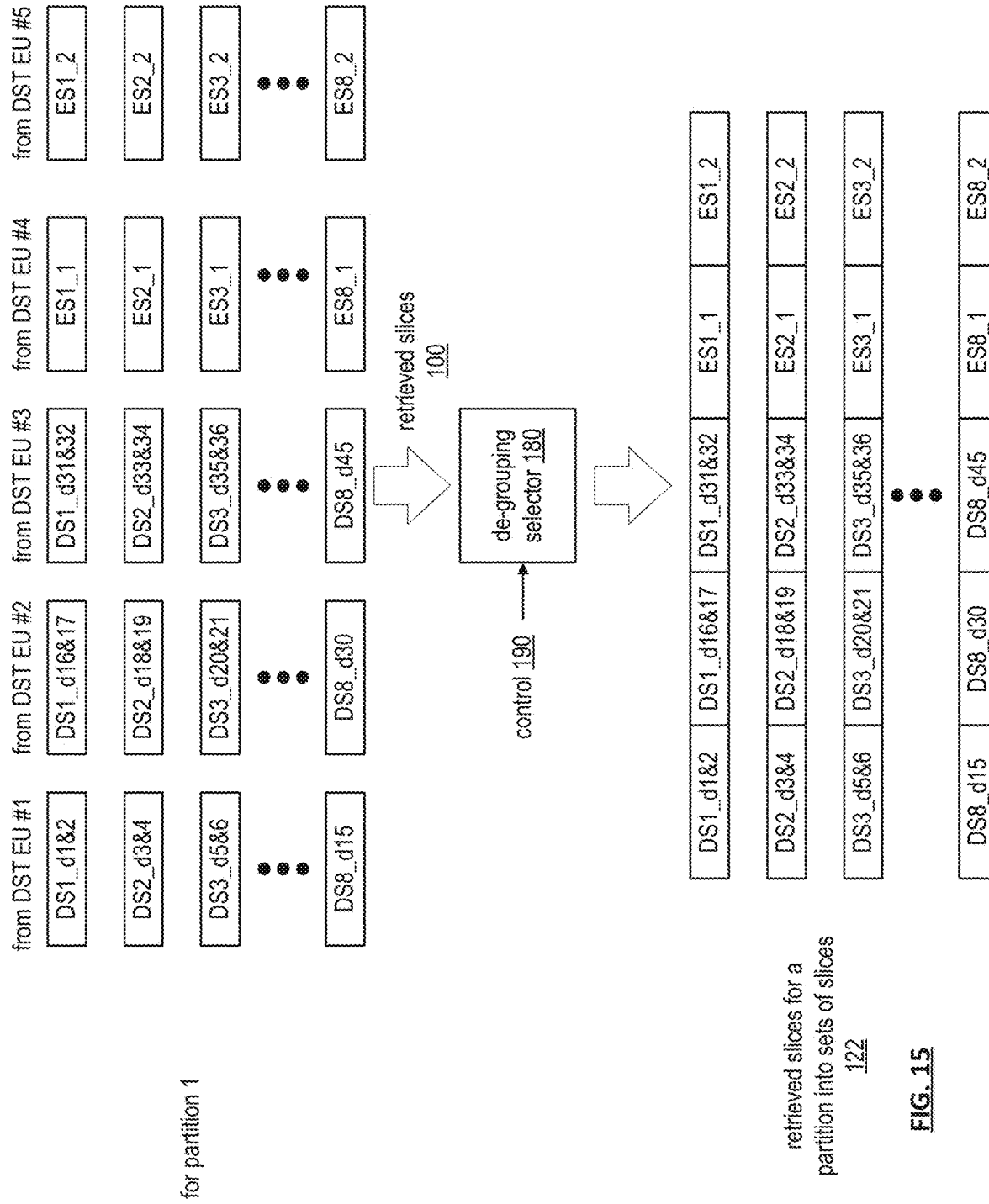
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
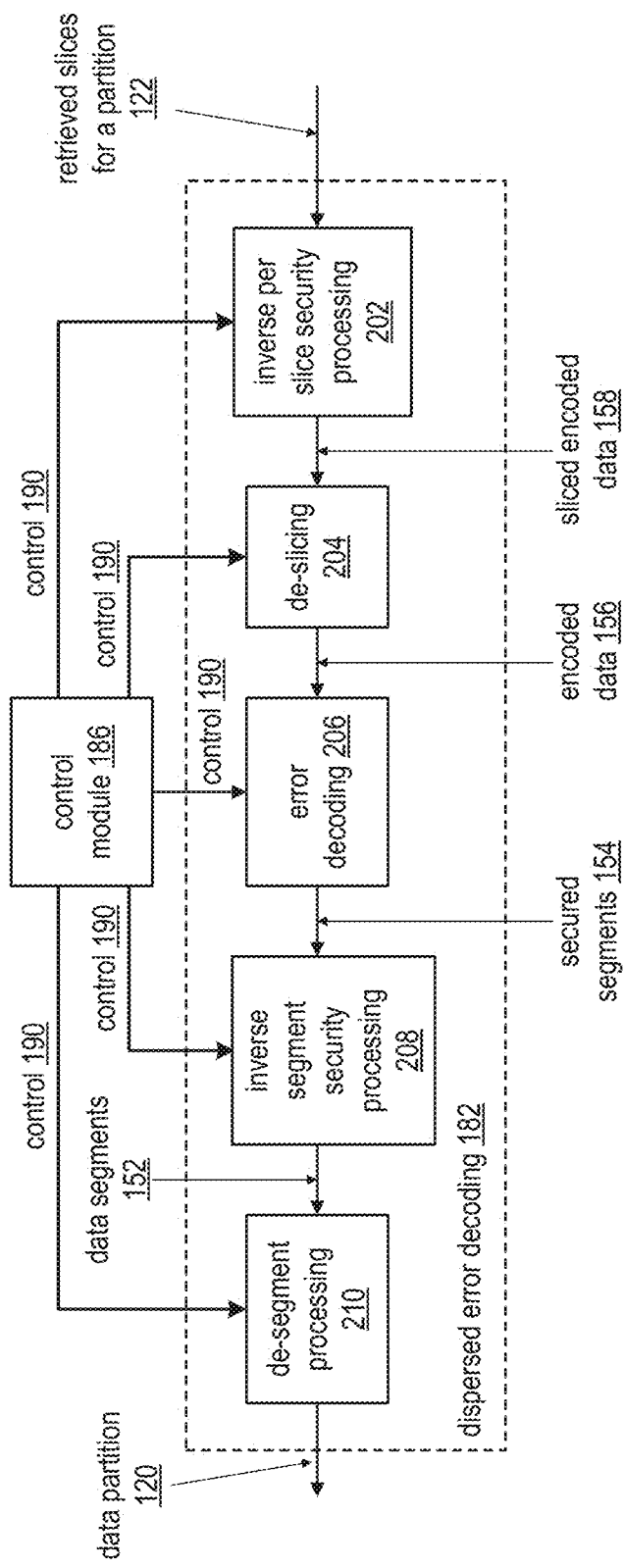
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
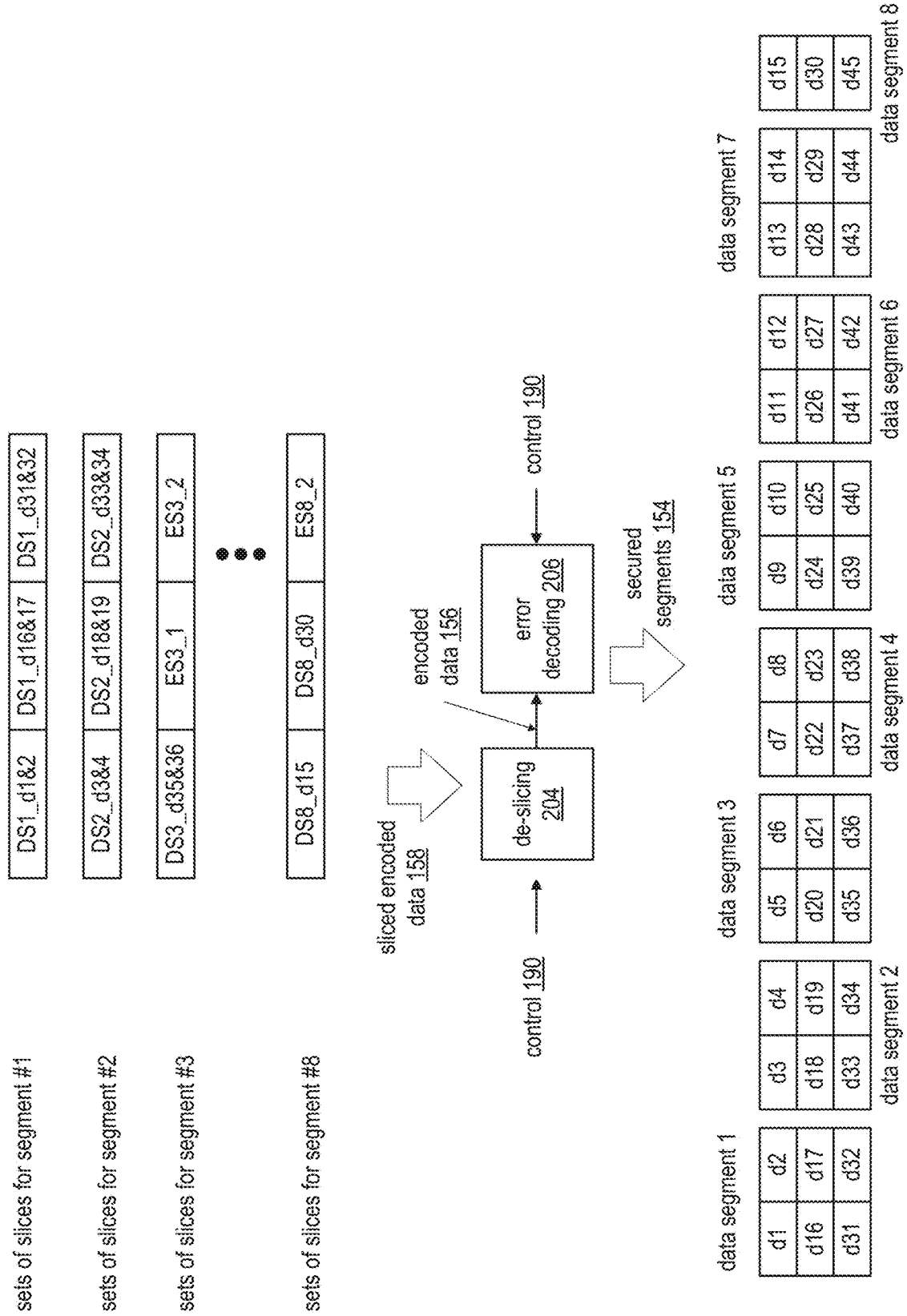
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
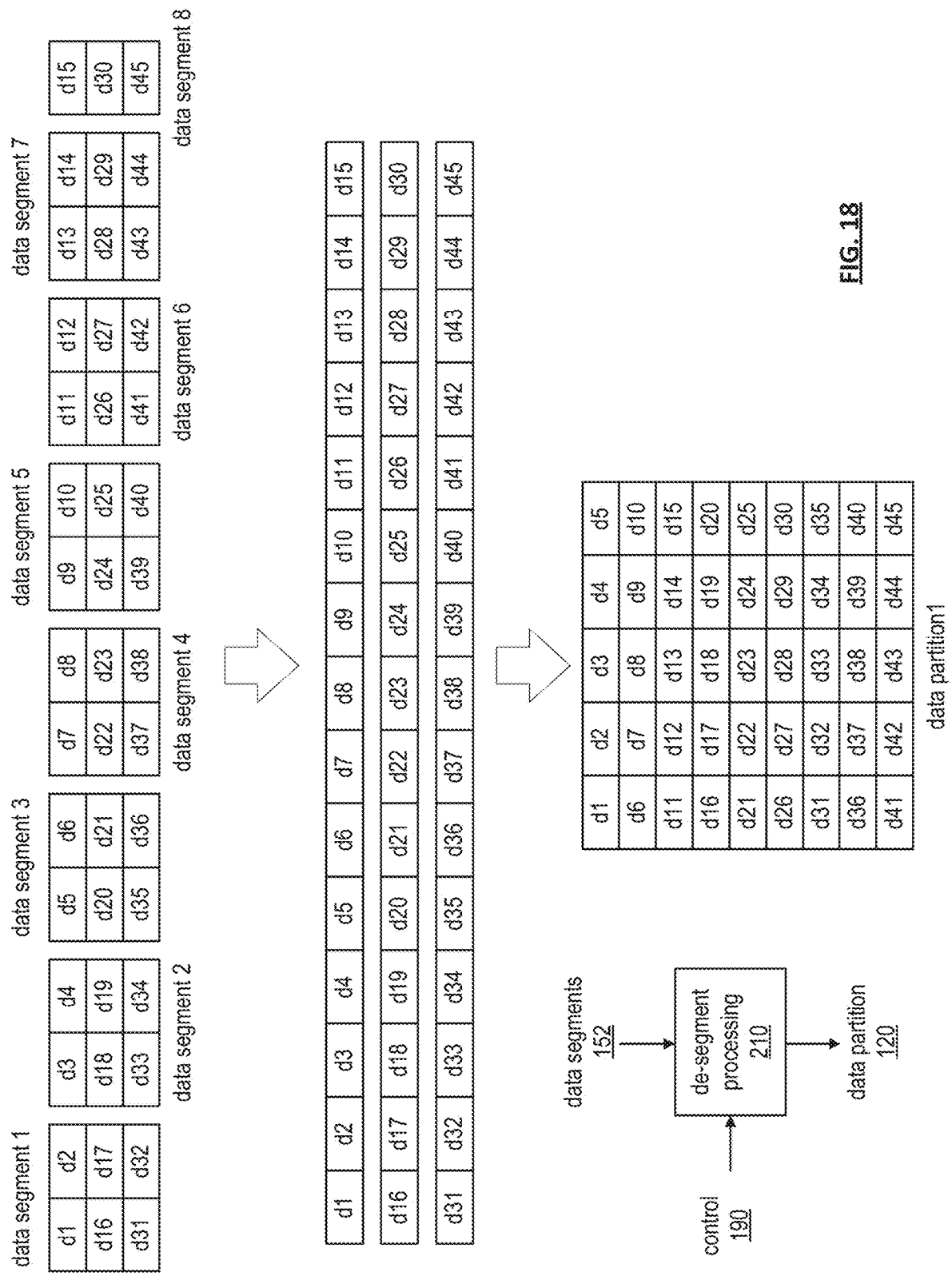
FIG. 18 is a diagram of an example of de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
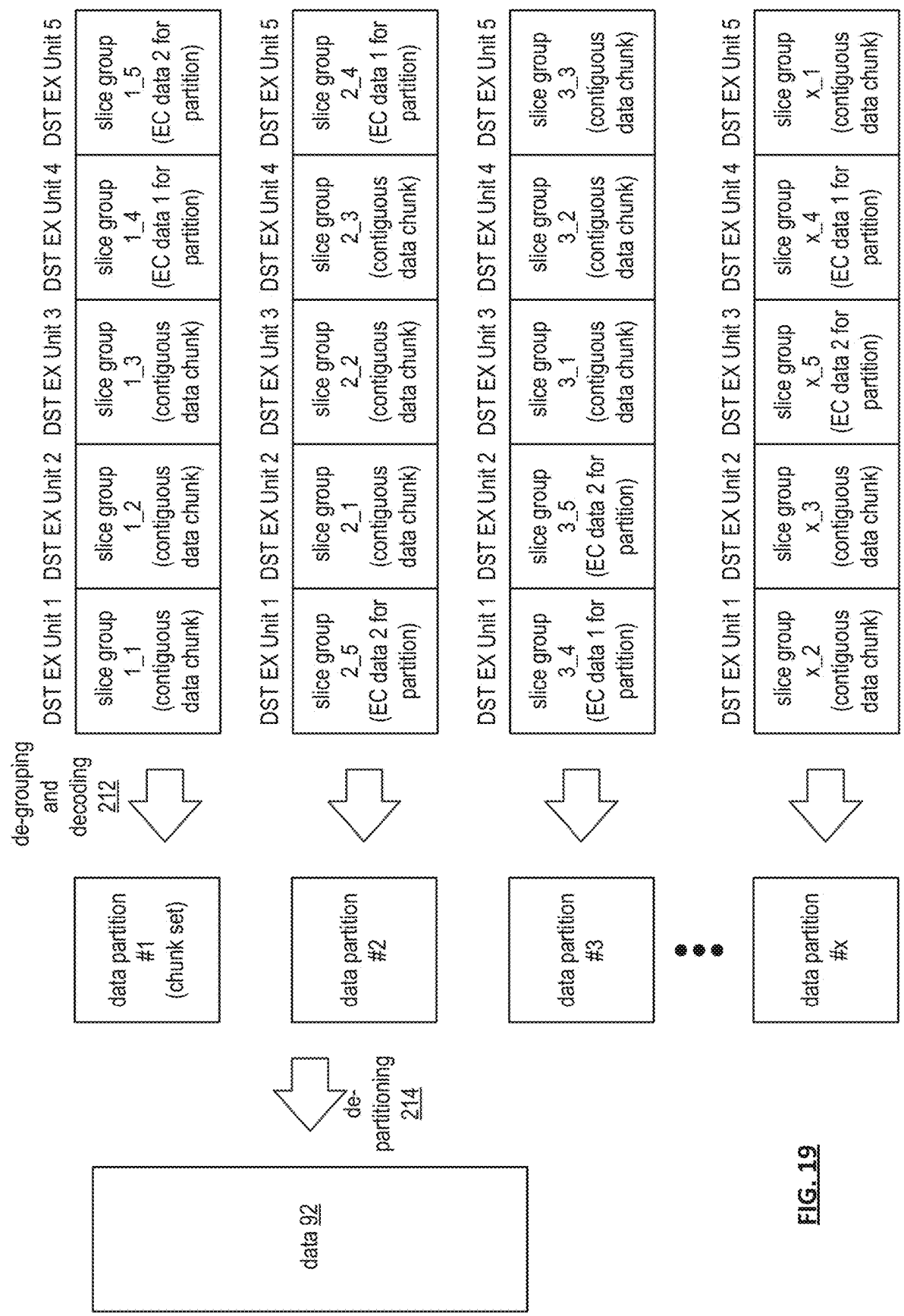
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
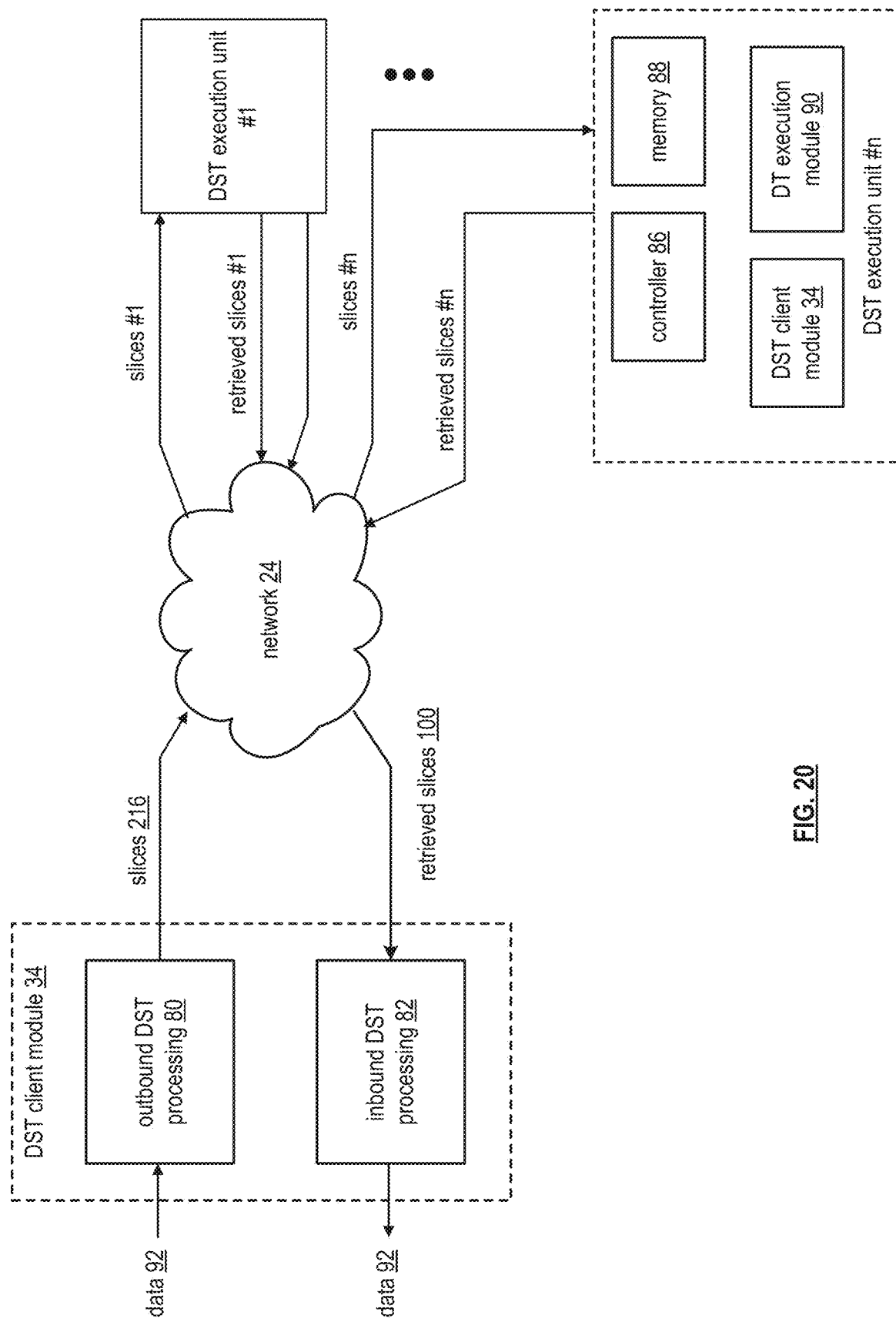
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
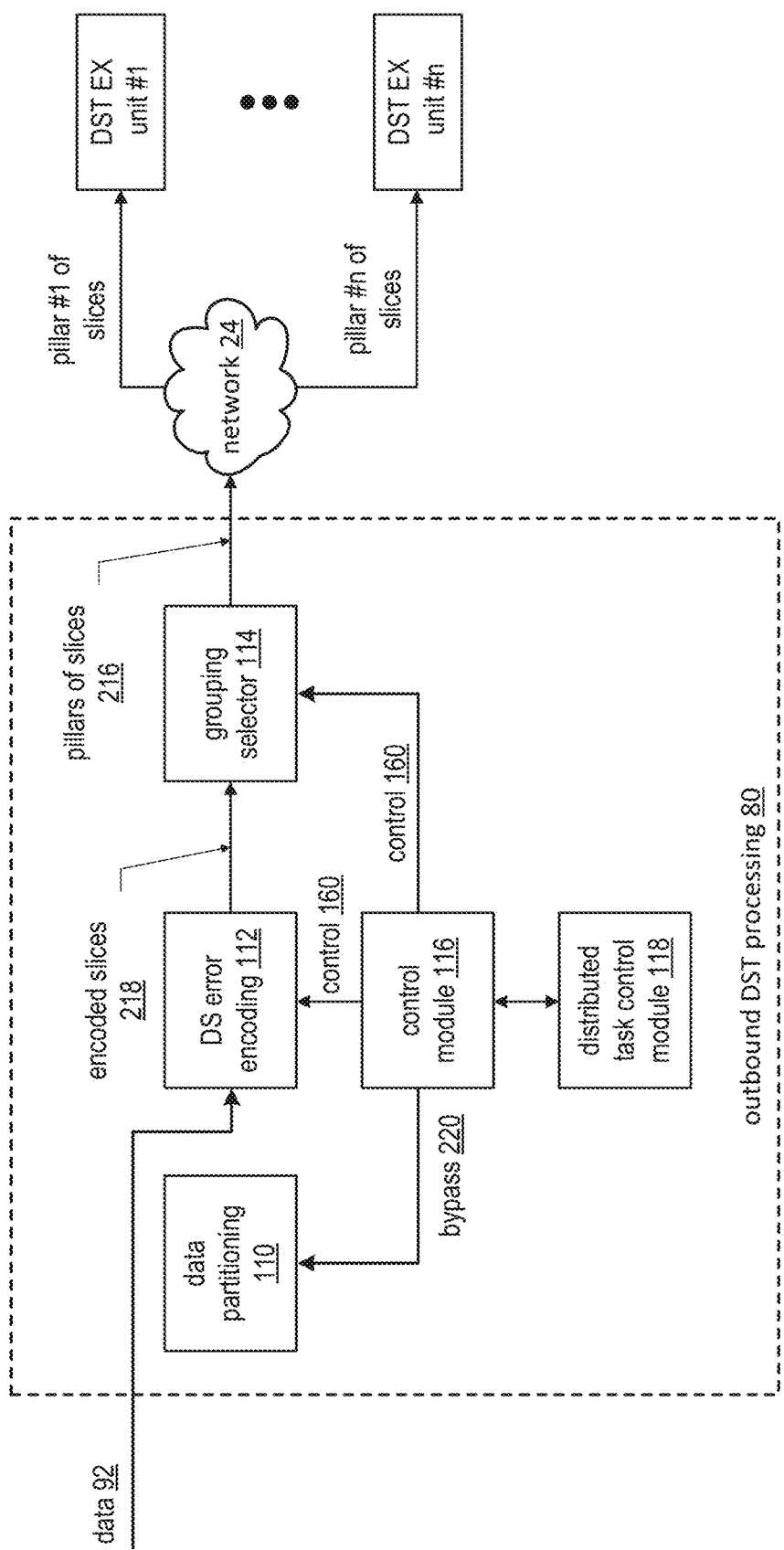
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
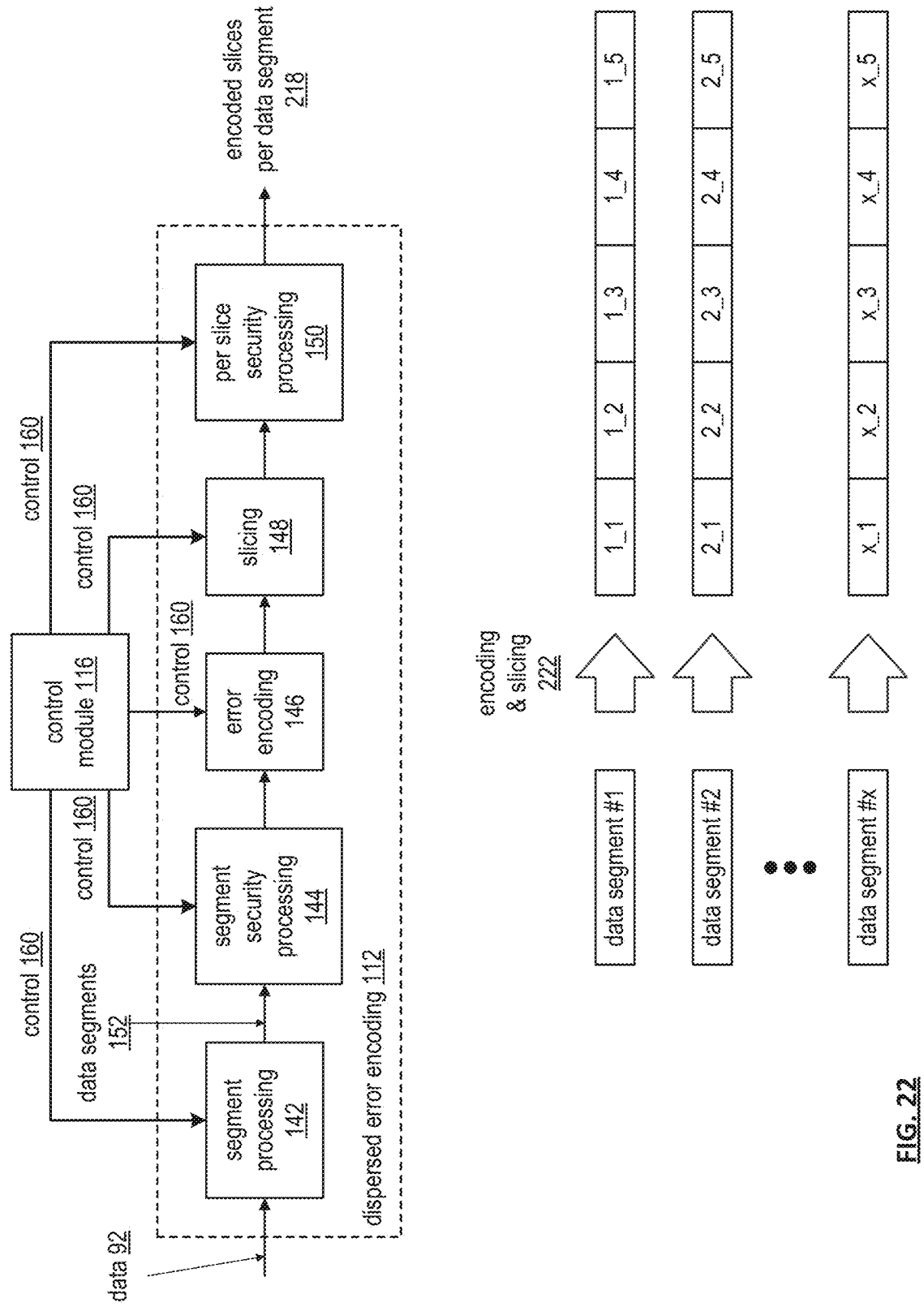
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
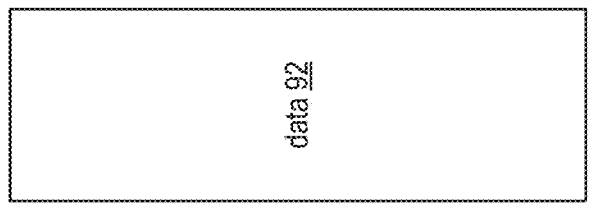
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
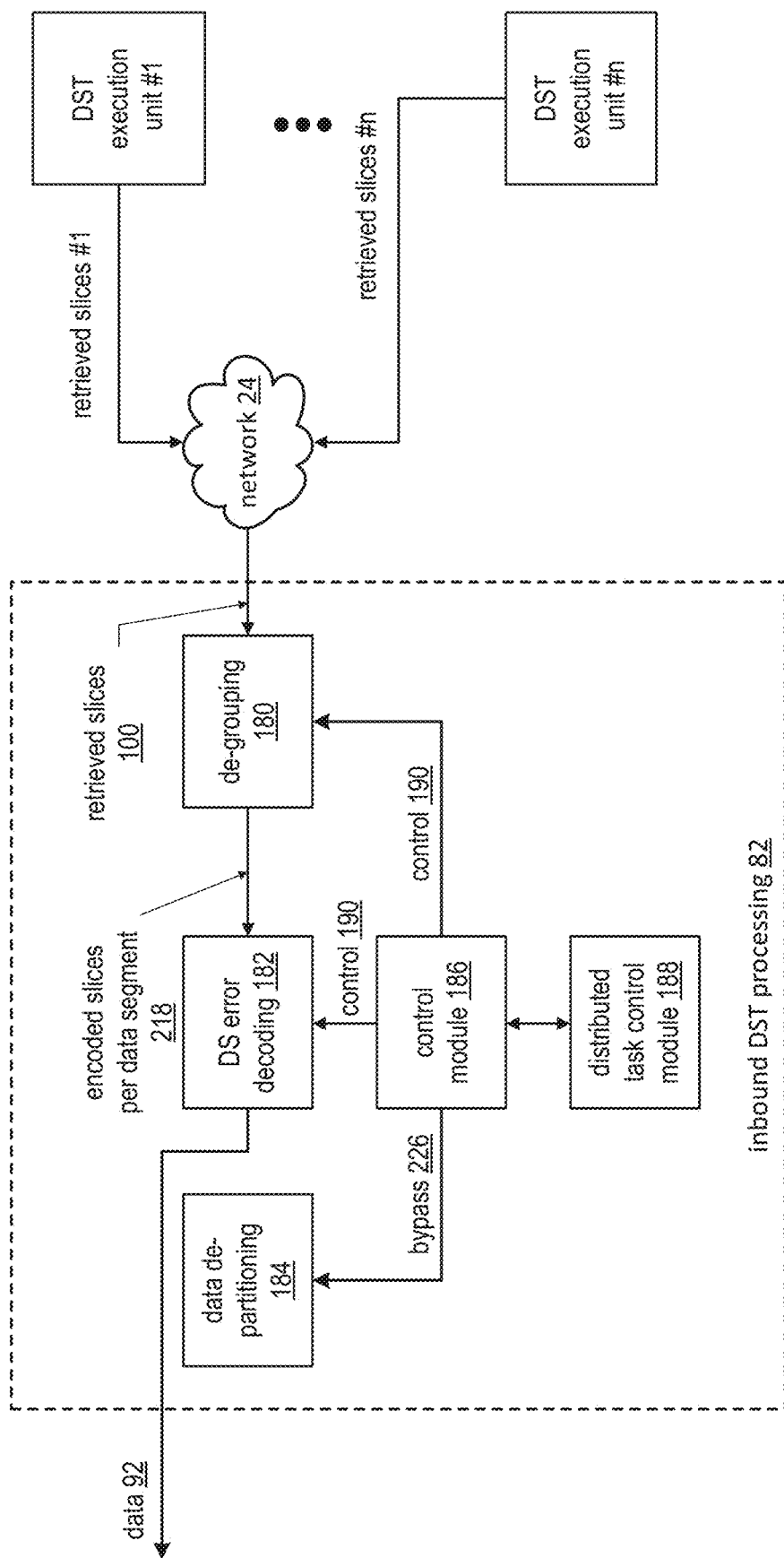
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
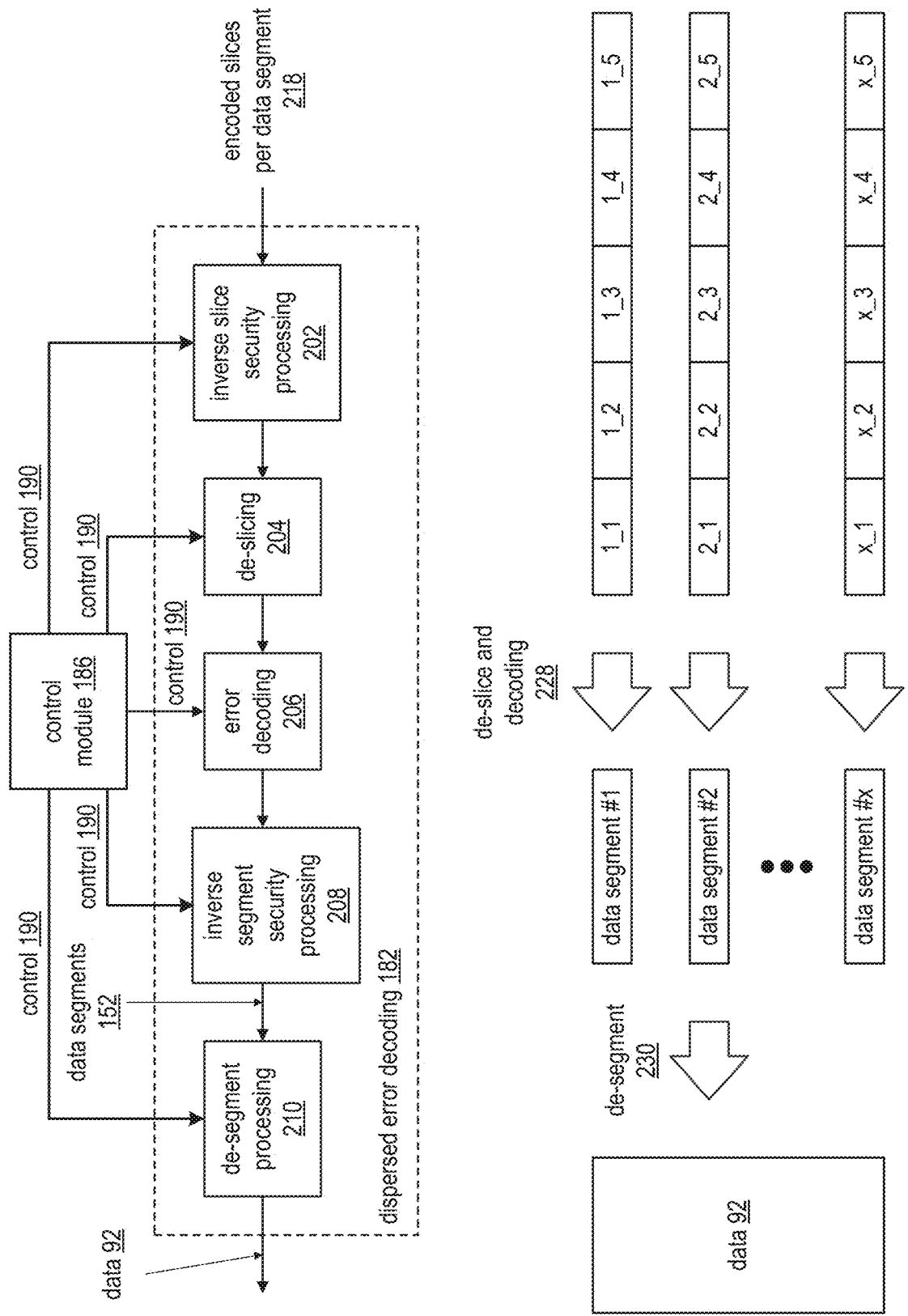
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
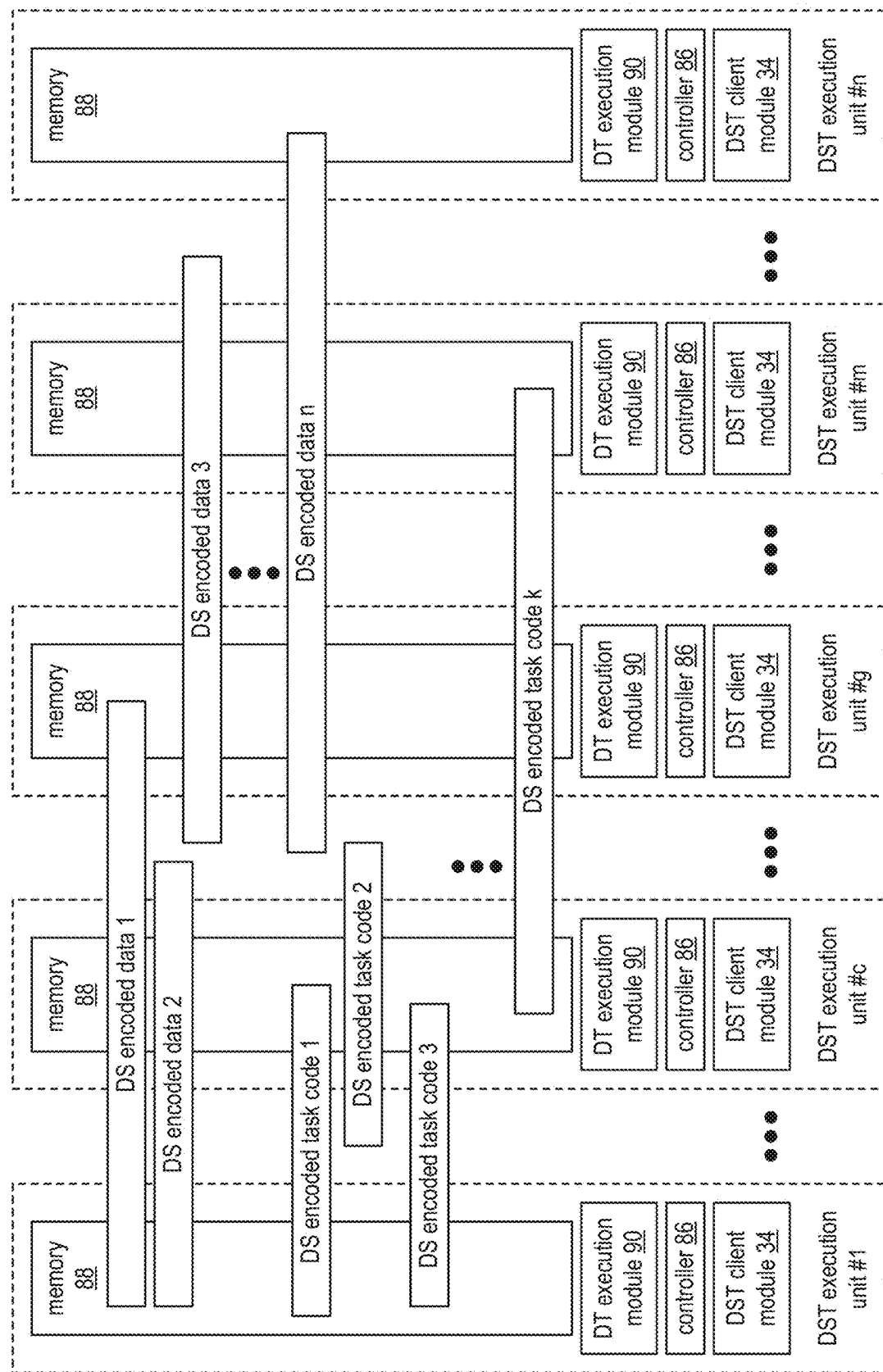
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
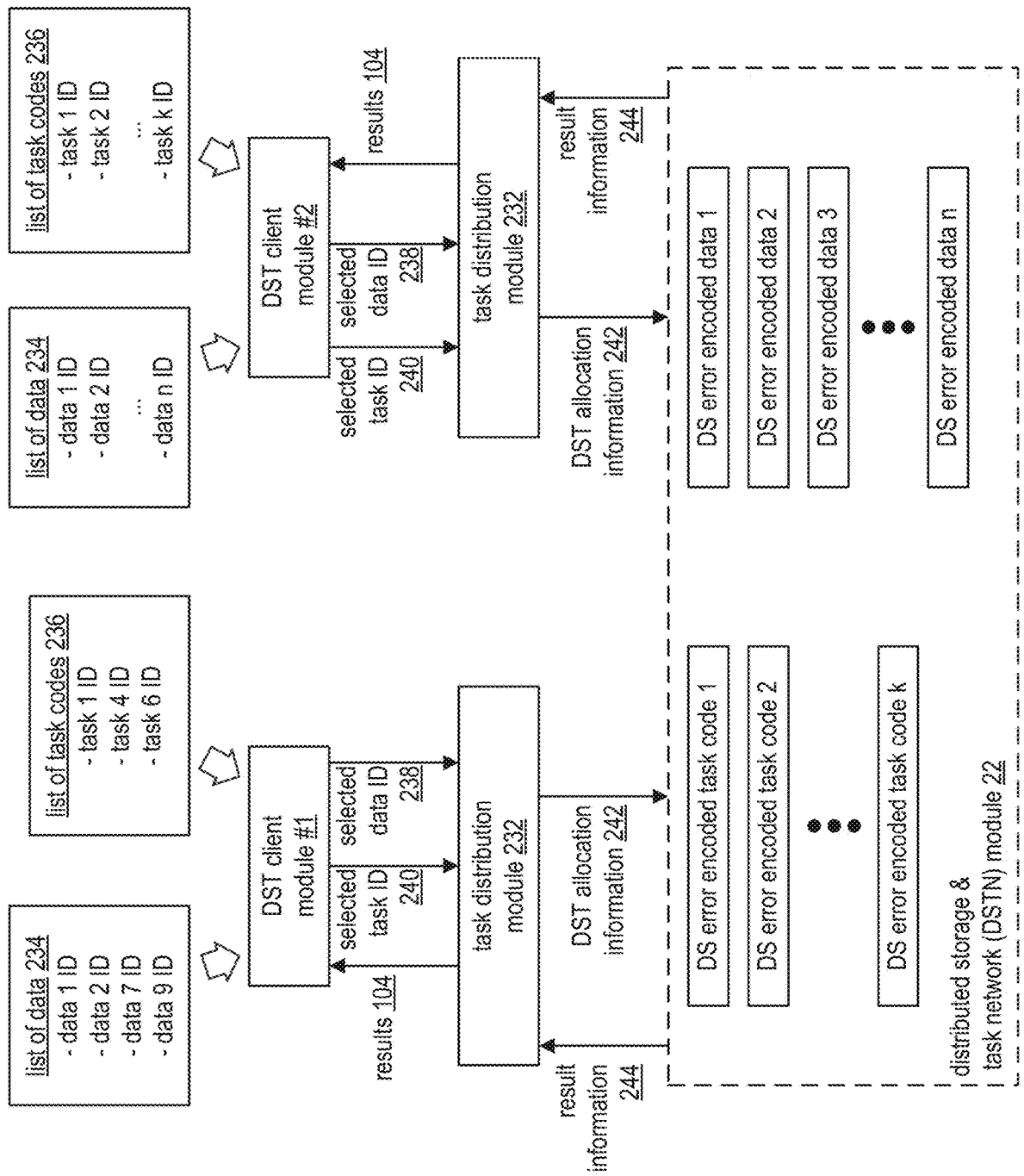
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
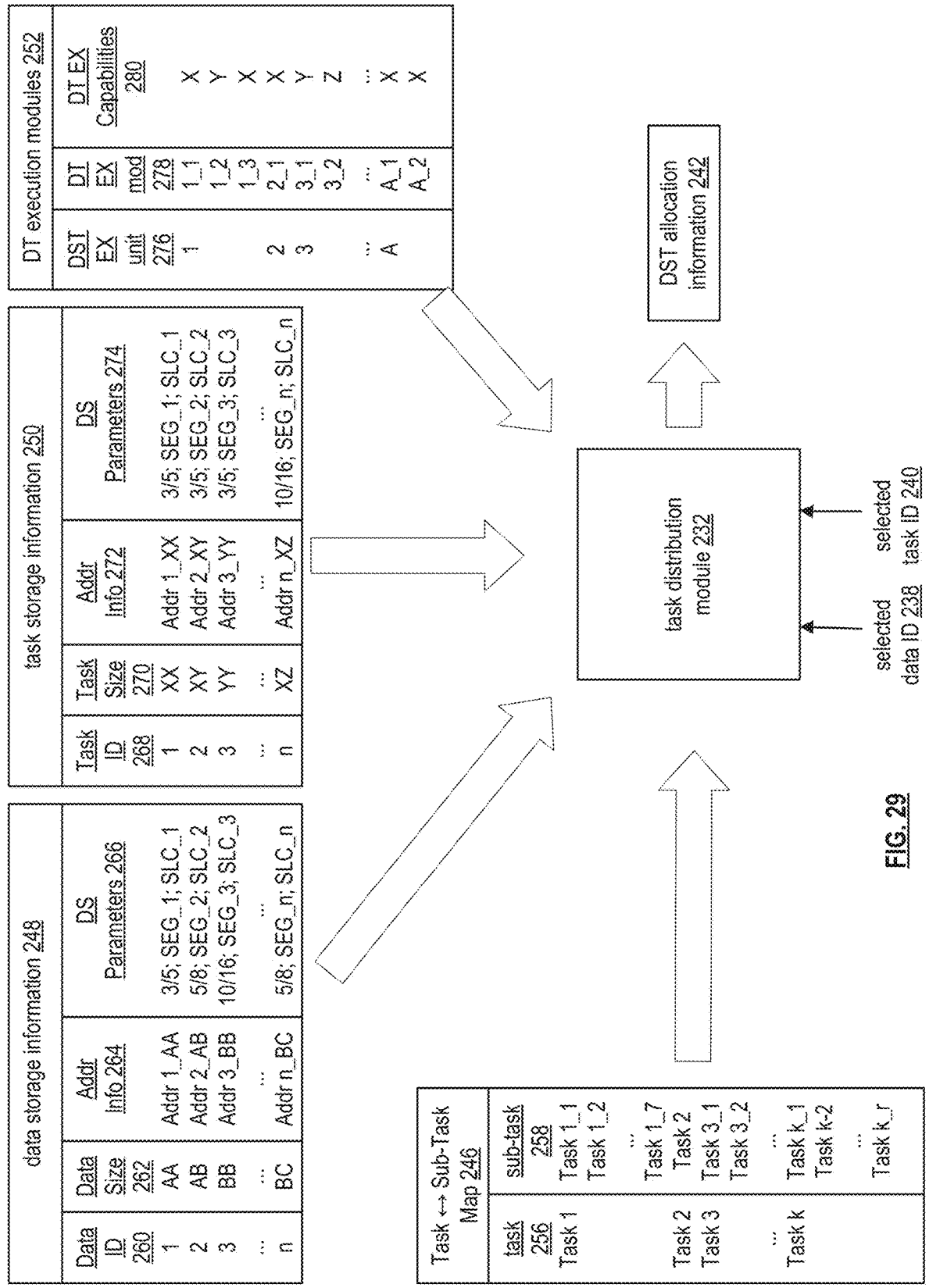
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task ⇔ n which data partitions, where and how intermediate results are to be stored, etc. If multiple tasks are being performed on the same data or different data, the task distribution module factors such information into its generation of the DST allocation information.

Figure 30:
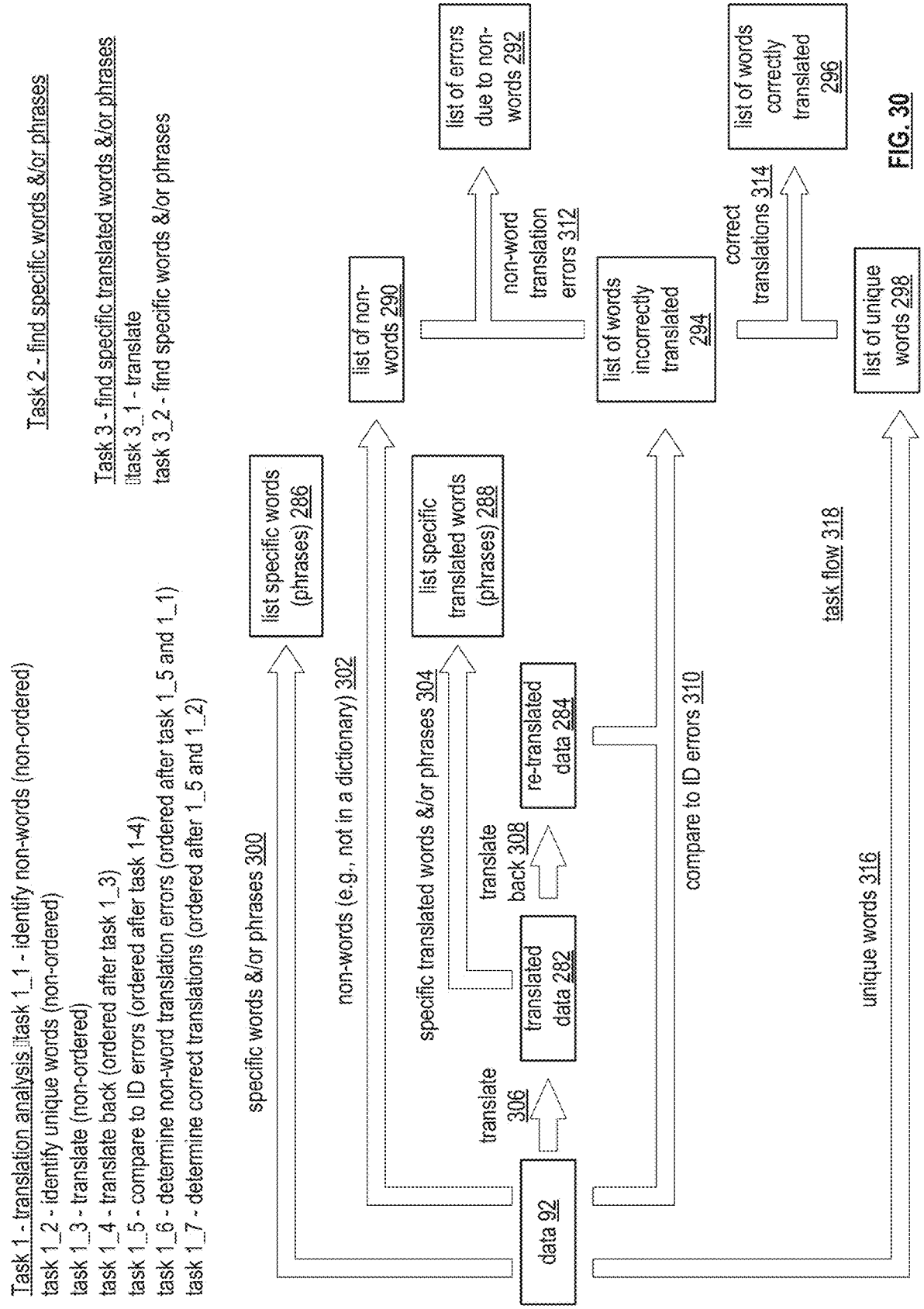
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.) may include the word and/or phrase, how many times it is used, where in the data it is used, and/or any other information requested regarding a word and/or phrase.

Figure 31:
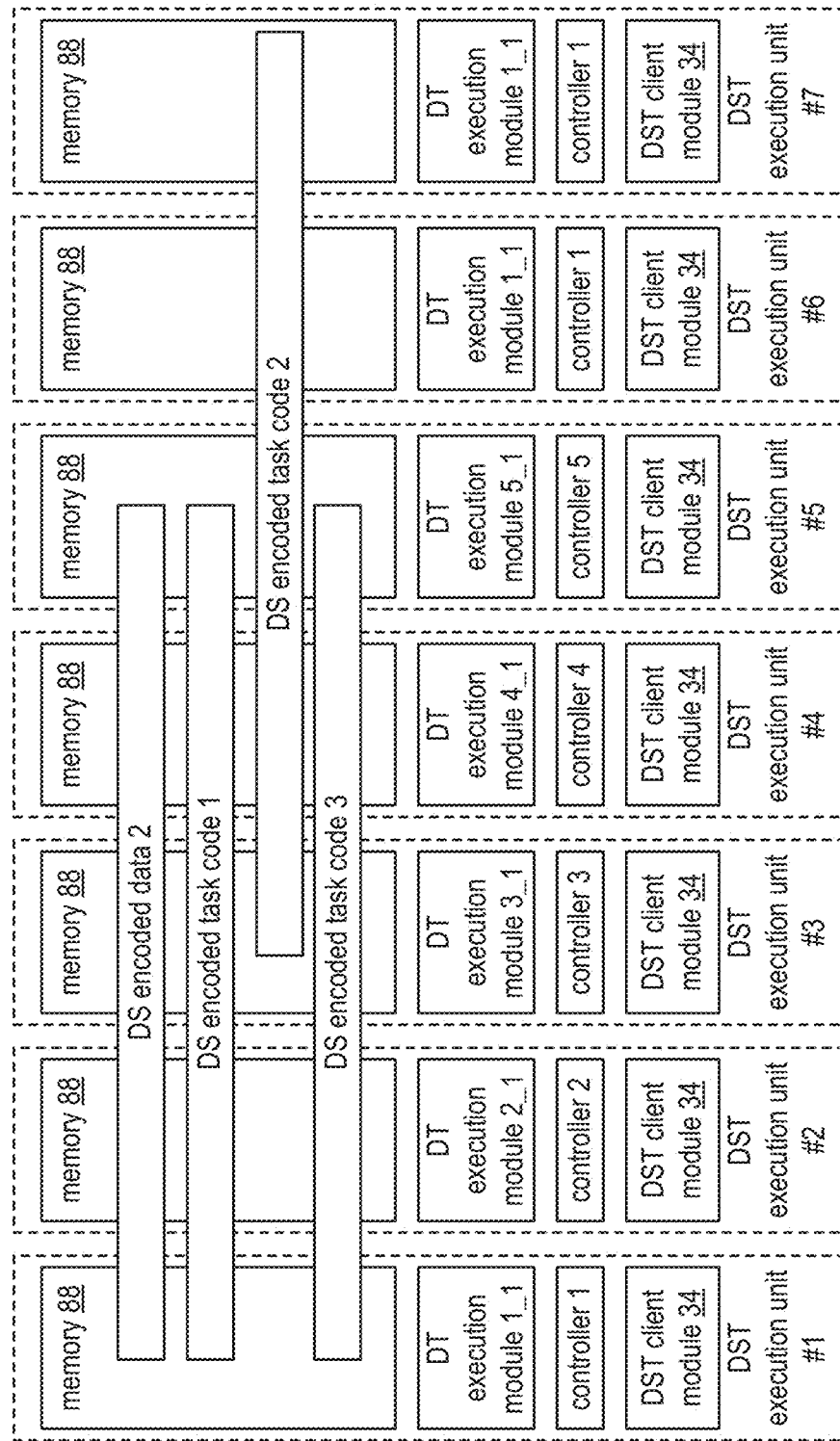
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terra-Byte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., 1$^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terra-Byte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., 1 through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
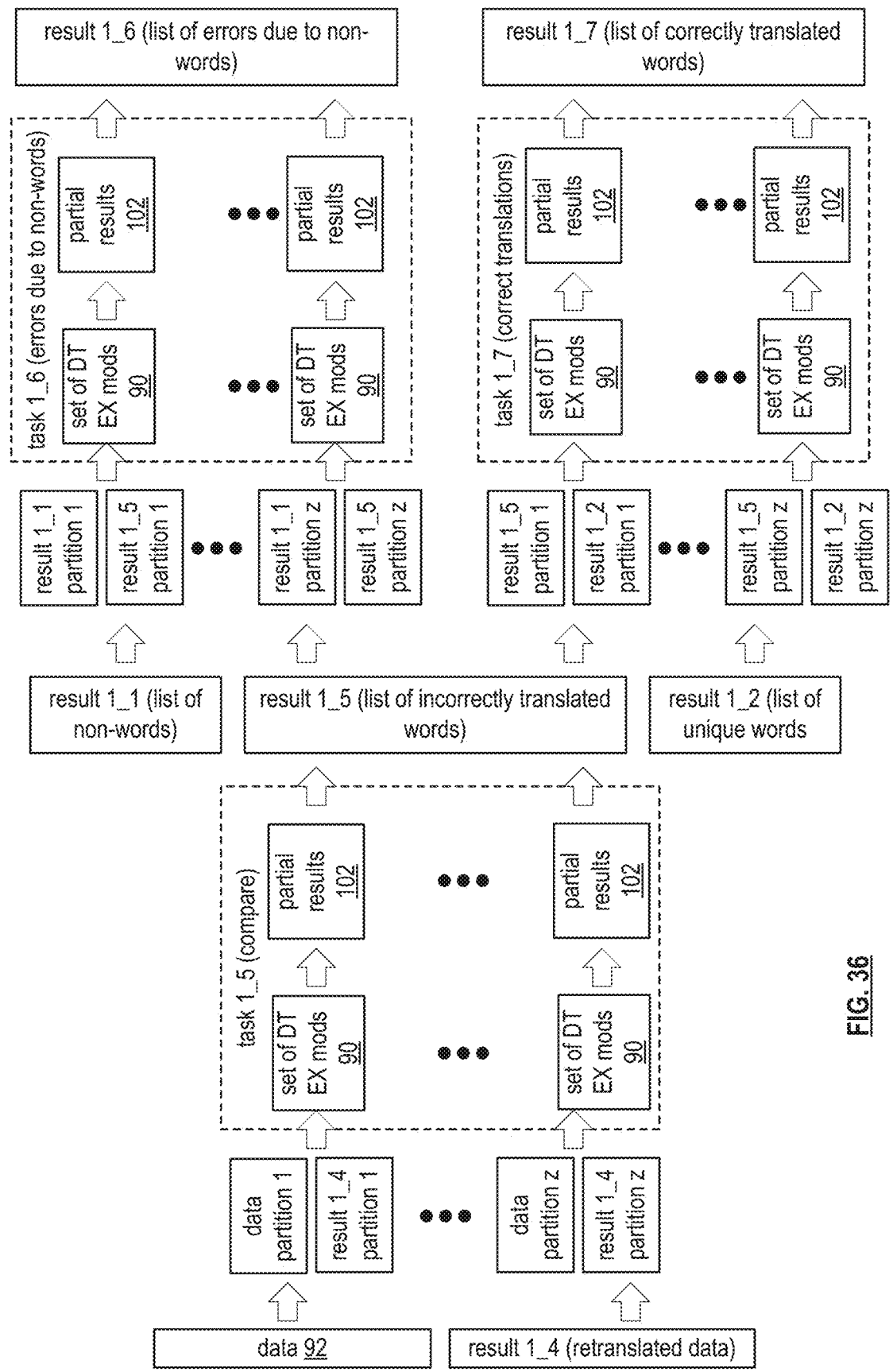

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., 1$^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., 1$^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., 1$^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terra-Byte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terra-Byte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

FIG. 40A is a schematic block diagram of an embodiment of a data obfuscation system that includes an encryptor 350, a deterministic function 352, a key masking function 354, a combiner 356, an encoder 358, and a dispersed storage network (DSN) memory 360. The DSN memory 360 includes at least one set of storage units. The encryptor 350 encrypts data 362 using an encryption key 364 to produce encrypted data 366 in accordance with an encryption function. The key 364 is obtained from at least one of a local memory, received in a message, generated based on a random number, and deterministically generated from at least part of the data 362. The deterministic function 352 performs a deterministic function on the encrypted data 366 using a password 368 to produce transformed data 370, where the transformed data 370 has a same number of bits as the encryption key 364. The password 368 includes any private sequence of information (e.g., alphanumeric digits).

The password 368 may be obtained by one or more of a lookup, receiving from a user interface input, retrieving from the DSN memory, and performing a user device query. The deterministic function 352 may be based on one or more of a hashing function, a hash based message authentication code function, a mask generating function, a concatenation function, a sponge function, and a key generation function. The method of operation of the deterministic function is described in greater detail with reference to FIGS. 40B-40D.

The key masking function 354 masks the key 364 using the transformed data 370 to produce a masked key 372, where the masked key 372 includes the same number of bits as the key 364. The masking may include at least one of a logical mathematical function, a deterministic function, and an encryption function. For example, the masking includes performing an exclusiveOR (XOR) logical function on the key 364 and the transformed data 370 to produce the masked key 372. The combiner 356 combines the encrypted data 366 and the masked key 372 to produce a secure package 374. The combining may include at least one of pre-appending, post-appending, inserting, and interleaving. The encoder 358 performs a dispersed storage error coding function on the secure package 374 to produce one or more sets of slices 376 in accordance with dispersed storage error coding function parameters for storage in the DSN memory 360.

FIG. 40B is a schematic block diagram of an embodiment of a deterministic function module 352 that includes a hash based message authentication code function module (HMAC) 378. The HMAC function 378 performs a hash based message authentication code function on encrypted data 366 using a password 368 as a key of the HMAC to produce transformed data 370.

FIG. 40C is a schematic block diagram of another embodiment of a deterministic function module 352 that includes a concatenation function 380 and a hashing function 382. The concatenation function 380 concatenates encrypted data 366 and a password 368 to produce an intermediate result. For example, the concatenation function 380 combines the encrypted data 366 and the password 368 by appending the password 368 to the encrypted data 366 to produce the intermediate result. The hashing function 382 performs a deterministic hashing algorithm on the intermediate result to produce transformed data 370. Alternatively, a mask generating function may be utilized as the hashing function 382.

FIG. 40D is a schematic block diagram of another embodiment of a deterministic function module 352 that includes a hashing function 382, a key generation function 384, and a sub-key masking function 386. The hashing function 382 performs a deterministic hashing algorithm on encrypted data 366 to produce a hash of the encrypted data. Alternatively, a mask generating function may be utilized as the hashing function 382. The key generation function 384 generates an intermediate key based on a password 368, where the intermediate key includes a same number of bits as the encryption key utilized in the system of FIG. 40A. The key generation function 384 includes at least one of a key derivation function, a hashing function, and a mask generating function. The sub-key masking function 386 may include at least one of a logical mathematical function, a deterministic function, and an encryption function. For example, the sub-key masking includes performing an exclusiveOR (XOR) logical function on the intermediate key and the hash of the encrypted data to produce transformed data 370.

Figure 40E:
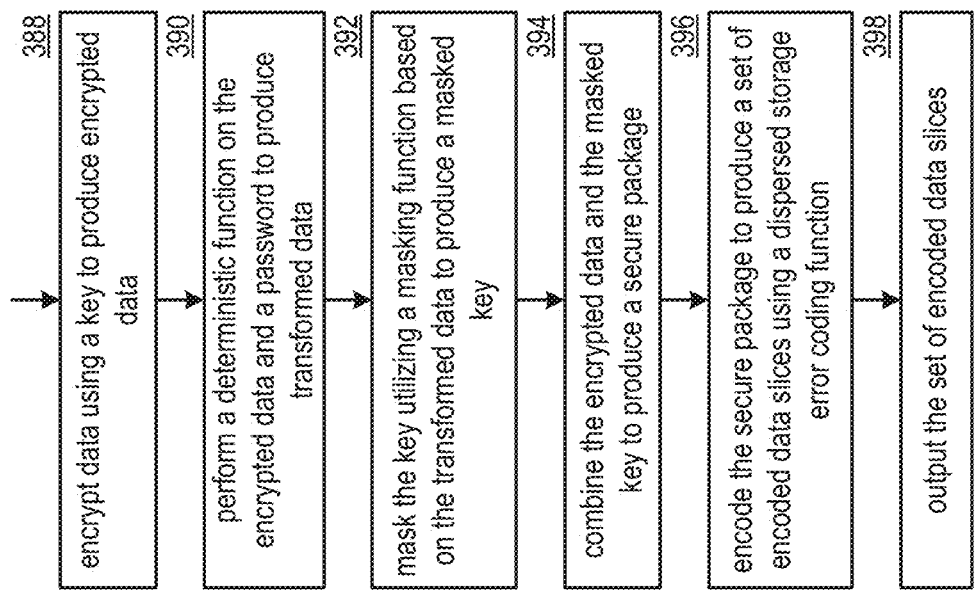
FIG. 40E is a flowchart illustrating an example of obfuscating data in accordance with the present invention.

FIG. 40E is a flowchart illustrating an example of obfuscating data. The method begins at step 388 where a processing module (e.g., of a dispersed storage processing module) encrypts data using a key to produce encrypted data. The method continues at step 390 where the processing module performs a deterministic function on the encrypted data and a password to produce transformed data. The method continues at step 392 where the processing module masks the key utilizing a masking function based on the transformed data to produce a masked key. For example, the processing module performs an exclusiveOR function on the key and the transformed data to produce the masked key.

The method continues at step 394 where the processing module combines (e.g., pre-append, post-append, insert, interleave, etc.) the encrypted data and the masked key to produce a secure package. The method continues at step 396 where the processing module encodes the secure package to produce a set of encoded data slices using a dispersed storage error coding function. The method continues at step 398 where the processing module outputs the set of encoded data slices. For example, the processing module outputs the set of encoded data slices to a dispersed storage network memory for storage therein. As another example, the processing module outputs the set of encoded data slices to a communication network for transmission to one or more receiving entities.

Figure 40F:
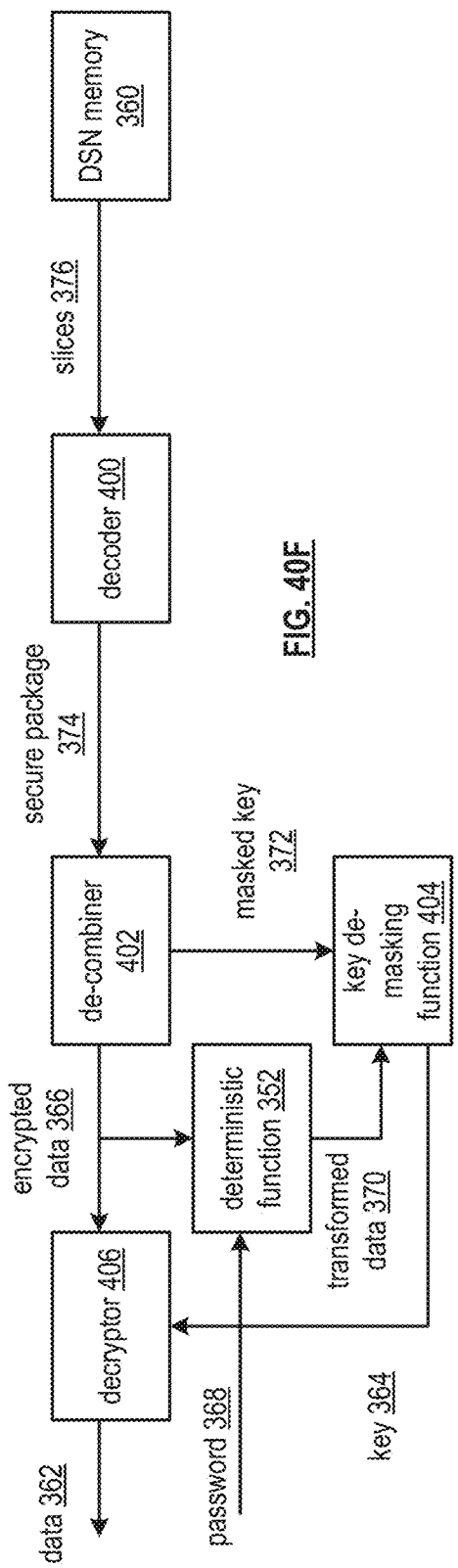
FIG. 40F is a schematic block diagram of an embodiment of a data de-obfuscation system in accordance with the present invention.

FIG. 40F is a schematic block diagram of an embodiment of a data de-obfuscation system that includes a dispersed storage network (DSN) memory 360, a decoder 400, a de-combiner 402, a deterministic function 352, a key de-masking function 404, and a decryptor 406. The decoder 400 obtains (e.g., retrieves, receives) one or more sets of encoded data slices 376 from the DSN memory 360. The decoder 400 decodes the one or more sets of encoded data slices 376 using a dispersed storage error coding function in accordance with dispersed storage error coding function parameters to reproduce at least one secure package 374. For example, the decoder decodes a first set of encoded data slices to produce a first secure package.

For each secure package 374, the de-combiner 402 de-combines the secure package 374 to reproduce encrypted data 366 and a masked key 372. The de-combining includes at least one of de-appending, un-inserting, and de-interleaving in accordance with a de-combining scheme. The deterministic function 352 performs a deterministic function on the encrypted data 366 using a password 368 to reproduce transformed data 370, where the transformed data 370 has a same number of bits as a recovered encryption key 364. The password 368 includes any private sequence of information and is substantially identical to a password 368 of a complementary encoder.

The key de-masking function 404 de-masks the masked key 372 using the transformed data 370 to produce the recovered key 364, where the recovered key 364 includes a same number of bits as the masked key 372. The de-masking may include at least one of a logical mathematical function, a deterministic function, and an encryption function. For example, the de-masking includes performing an exclusiveOR (XOR) logical function on the masked key and the transformed data to produce the recovered key. The decryptor 406 decrypts the encrypted data 366 using the recovered key 364 to reproduce data 362 in accordance with a decryption function.

FIG. 40G is a flowchart illustrating an example of de-obfuscating data, which includes similar steps to FIG. 40E. The method begins at step 408 where a processing module (e.g., of a dispersed storage processing module) obtains a set of encoded data slices. The obtaining includes at least one of retrieving and receiving. For example, the processing module receives the set of encoded data slices from a dispersed storage network memory. As another example, the processing module receives the set of encoded data slices from a communication network. The method continues at step 410 where the processing module decodes the set of encoded data slices to reproduce a secure package using a dispersed storage error coding function and in accordance with dispersed storage error coding function parameters.

The method continues at step 412 where the processing module de-combines the secure package to produce encrypted data and a masked key. For example, the processing module partitions the secure package to produce the encrypted data and the masked key in accordance with a partitioning scheme. The method continues with step 390 of FIG. 40E where the processing module performs a deterministic function on encrypted data and a password to reproduce transformed data. The method continues at step 414 where the processing module de-masks the masked key utilizing a de-masking function based on the transformed data to reproduce a recovered key. For example, the processing module performs an exclusiveOR function on the masked key and the transformed data to produce the recovered key. The method continues at step 416 where the processing module decrypts the encrypted data using the recovered key to reproduce data.

Figure 41A:
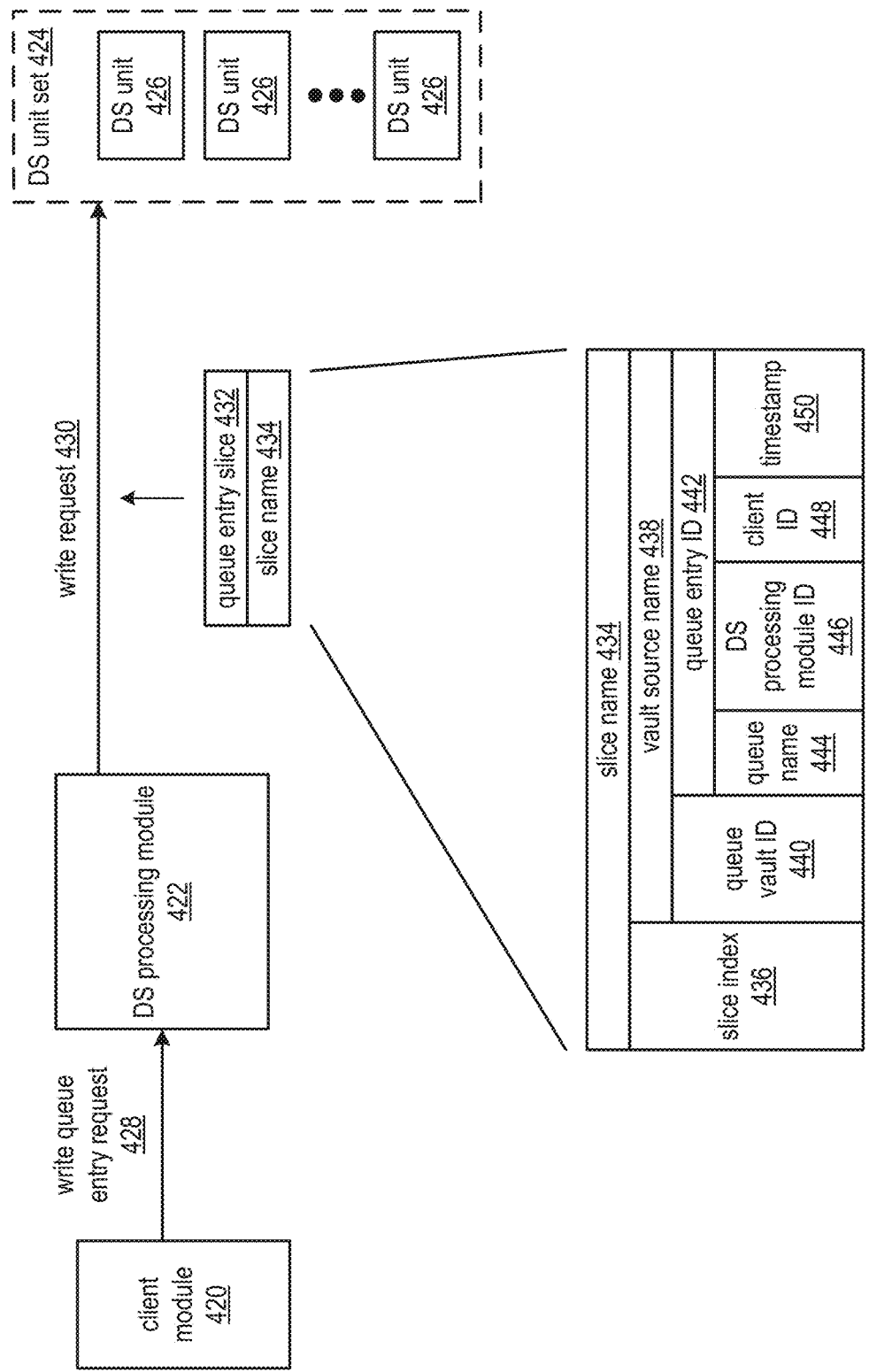
FIG. 41A is a schematic block diagram of an embodiment of a dispersed storage system in accordance with the present invention.

FIG. 41A is a schematic block diagram of an embodiment of a dispersed storage system that includes a client module 420, a dispersed storage (DS) processing module 422, and a DS unit set 424. The DS unit set 424 includes a set of DS units 426 utilized to access slices stored in the set of DS units 426. The DS unit 426 may be implemented using the distribute storage and task (DST) execution unit 36 of FIG. 1. The client module 420 may be implemented utilizing at least one of a user device, a distributed storage and task (DST) client module, a DST processing unit, a DST execution unit, and a DS processing unit. The DS processing module 422 may be implemented utilizing at least one of a DST client module, a DST processing unit, a DS processing unit, a user device, a DST execution unit, and a DS unit. The system is operable to facilitate storage of one or more queue entries of a queue in the DS unit set 424.

In an example of operation, the client module 420 generates a write queue entry request 428 where the write queue entry request 428 includes one or more of a queue entry, a queue name, and an entry number. The client module 420 may utilize the entry number to facilitate ordering of two or more queue entries. The client module 420 outputs the write queue entry request 428 to the DS processing module 422. The DS processing module 422 encodes the queue entry using a dispersed storage error coding function to produce a set of queue entry slices 432. For each DS unit 426 of the DS unit set 424, the DS processing module 422 generates a write request 430 and outputs the write request 430 to the DS unit 426 to facilitate storage of the queue entry slices by the DS unit set 424.

The write request 430 includes one or more of a queue entry slice 432 of the set of queue entry slices and a slice name 434 corresponding to the queue entry slice 432. The DS processing module 422 generates the slice name 434 based on the write queue entry request 428. The slice name 434 includes a slice index field 436 and a vault source name field 438. The slice index field 436 includes a slice index entry that corresponds to a pillar number of a set of pillar numbers associated with a pillar width dispersal parameter utilized in the dispersed storage error coding function. The vault source name field 438 includes a queue vault identifier (ID) field 440 and a queue entry ID field 442. The queue vault ID 440 includes an identifier of a vault of the dispersed storage system associated with the queue (e.g., a vault associated with the client module 420). The DS processing module 422 generates a queue vault ID entry for the queue vault ID field 440 by a one or more of a dispersed storage network registry lookup based on an identifier of a requesting entity associated with the write queue entry request 428, receiving the queue vault ID, and generating a new queue vault ID when a new queue name is requested (e.g., not previously utilized in the dispersed storage network).

The queue entry ID field 442 includes a queue name field 444, a DS processing module ID field 446, a client ID field 448, and a timestamp field 450. The DS processing module 422 generates a queue name entry for the queue name field 444 based on the queue name of the write queue entry request 428. The DS processing module 422 generates a DS processing module ID entry for the DS processing module ID field 446 as an identifier associated with the DS processing module 422 by at least one of a lookup, receiving, and generating when the ID has not been assigned so far. The DS processing module 422 generates a client ID entry for the client ID field 448 as an identifier associated with the client module 420 (e.g., requesting entity) by at least one of a lookup, extracting from the write queue entry request 428, initiating a query, and receiving. The DS processing module 422 generates a timestamp entry for the timestamp field 450 as at least one of a current timestamp, the entry number of the write queue entry request 428 (e.g., when provided), and a combination of the current timestamp and the entry number. In an implementation example, the slice name is 48 bytes, the queue entry ID field is 24 bytes, the queue name field is 8 bytes, the DS processing module ID is 4 bytes, the client ID field is 4 bytes, and the timestamp field is 8 bytes.

Figure 41B:
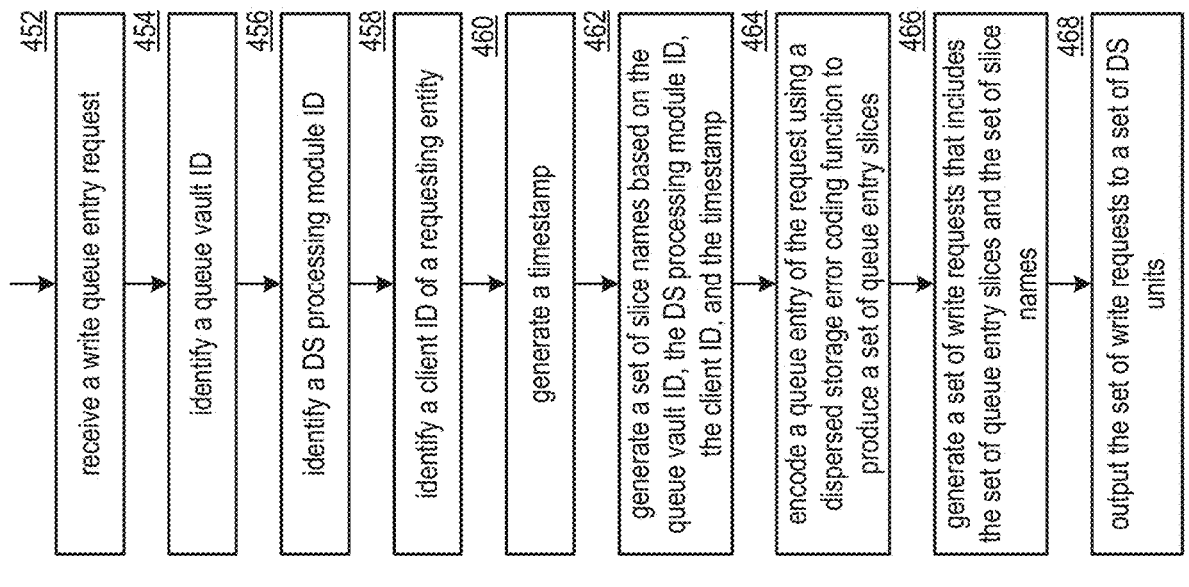
FIG. 41B is a flowchart illustrating an example of storing a queue entry in accordance with the present invention.

FIG. 41B is a flowchart illustrating an example of storing a queue entry. The method begins at step 452 where a processing module (e.g., of a dispersed storage (DS) processing module) receives a write queue entry request. The request includes one or more of a requesting entity identifier (ID), a queue entry, a queue name, and an entry number. The method continues at step 454 where the processing module identifies a queue vault ID. The identifying may be based on one or more of the requesting entity ID, the queue name, and a look up. For example, the processing module accesses a queue directory utilizing the queue name to identify the queue vault ID.

The method continues at step 456 where the processing module identifies a DS processing module ID associated with processing of the write queue entry request. The identifying may be based on one or more of generating a new ID, extracting from the request, a lookup, initiating a query, and receiving the identifier. The method continues at step 458 where the processing module identifies a client ID associated with the requesting entity. The identifying may be based on one or more of extracting from the request, a lookup, initiating a query, and receiving the identifier.

The method continues at step 460 where the processing module generates a timestamp. The generating includes at least one of obtaining a real-time time value and utilizing the entry number of the write queue entry request when provided. The method continues at step 462 where the processing module generates a set of slice names based on one or more of the queue vault ID, the DS processing module ID, the client ID, and the timestamp. For example, the processing module generates a slice name of the set of slice names to include a slice index corresponding to a slice to be associated with the slice name, the queue vault ID, the queue name of the write queue entry request, the DS processing module ID, the client ID, and the timestamp as depicted in FIG. 41A.

The method continues at step 464 where the processing module encodes the queue entry of the write queue entry request using a dispersed storage error coding function to produce a set of queue entry slices. The method continues at step 466 where the processing module generates a set of write requests that includes the set of queue entry slices and the set of slice names. The method continues at step 468 where the processing module outputs the set of write requests to a set of DS units to facilitate storage of the set of queue entry slices.

Figure 42B:
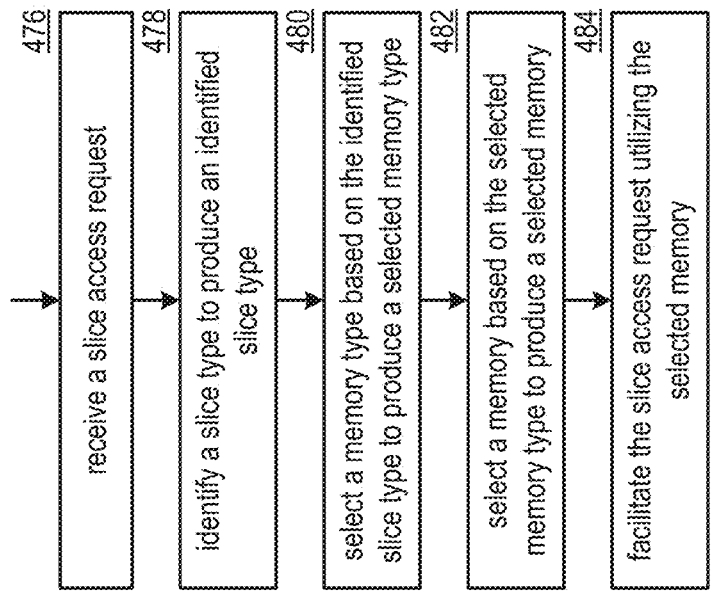
FIG. 42B is a flowchart illustrating an example of accessing data in accordance with the present invention.
Figure 42A:
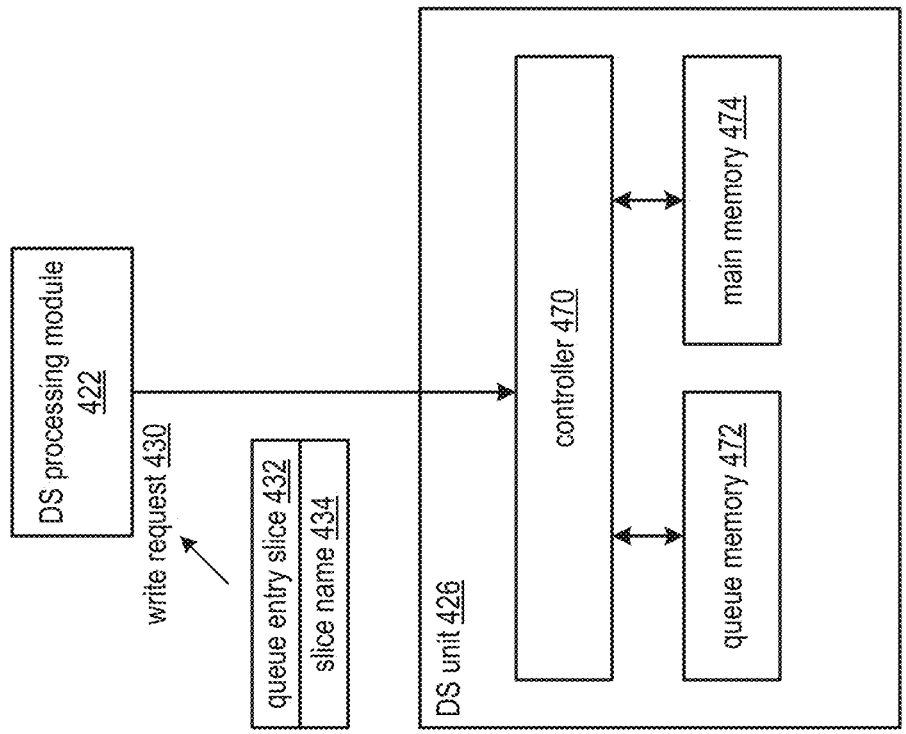
FIG. 42A is a schematic block diagram of another embodiment of a dispersed storage system in accordance with the present invention.

FIG. 42A is a schematic block diagram of another embodiment of a dispersed storage system that includes a dispersed storage (DS) processing module 422 and a DS unit 426. The DS unit 426 includes a controller 470, a queue memory 472, and a main memory 474. The queue memory 472 and the main memory 474 may be implemented utilizing one or more memory devices. Each memory device of the one or more memory devices may be implemented utilizing at least one of solid-state memory device, a magnetic disk drive, and an optical disk drive. The queue memory 472 may be implemented with memory technology to provide improved performance (e.g., lower access latency, higher bandwidth) as compared to the main memory 474. For example, the queue memory 472 is implemented utilizing dynamic random access memory (DRAM) to be utilized for storage of small sets of small encoded queue slices and/or lock slices. The main memory 474 may be implemented with other memory technology to provide improved cost (e.g., lowered cost) as compared to the queue memory. For example, the main memory 474 is implemented utilizing magnetic disk memory technology to be utilized for storage of large sets of large encoded data slices.

The DS processing module 422 generates a write request 430 that includes a queue entry slice 432 and a slice name 434 for outputting to the DS unit 426. The controller 470 receives the write request 430 and determines whether to utilize queue memory 472 or main memory 474 for storage of the queue entry slice 432 of the write request 430. The determining may be based on one or more of a queue entry slice identifier, a requesting entity identifier, and matching the slice name 434 to a queue entry slice name address range. When the controller 470 determines to utilize the queue memory 472, the controller 470 stores the queue entry slice 432 in the queue memory 472. The method of operation is discussed in greater detail with reference to FIG. 42B.

FIG. 42B is a flowchart illustrating an example of accessing data. The method begins at step 476 where a processing module (e.g., of a dispersed storage (DS) unit) receives a slice access request. The method continues at step 478 where the processing module identifies a slice type to produce an identified slice type. The slice type includes at least one of a queue entry slice, a lock slice, an index node slice, and a data node. The identifying may be based on one or more of mapping a slice name of the slice access request to an address range associated with a slice type of a plurality of slice types, extracting a slice type indicator from the request, and analyzing an encoded data slice of the request.

The method continues at step 480 where the processing module selects a memory type based on the identified slice type to produce a selected memory type. For example, the processing module selects a queue memory when the identified slice type is a queue entry slice. As another example, the processing module selects a main memory when the identified slice type is not a queue entry slice and not a lock entry slice. The method continues at step 482 where the processing module selects a memory based on the selected memory type to produce a selected memory. The selecting may be based on one or more of available memory capacity, a slice size indicator, a memory reliability indicator, and a memory size threshold level. For example, the processing module selects a tenth queue memory device of the queue memory when the tenth queue memory has available memory capacity greater than the slice size of a queue entry slice for storage and a first through a ninth queue memory devices are full for a write request. Alternatively, the processing module may select another memory type to identify a memory of the other memory type when all memory devices of the selected memory type are unavailable for a request. For example, the processing module selects a second main memory device of the main memory when all queue memory devices of the queue memory are full and the slice type is a queue entry slice for a write request.

The method continues at step 484 where the processing module facilitates the slice access request utilizing the selected memory. For example, when the slice access request is a write request, the processing module stores a received slice of the request in the selected memory. As another example, when the slice access request is a read request, the processing module retrieves a slice from the selected memory and outputs the retrieved slice to a requesting entity.

In various embodiments, a method is presented for execution by a processing system that includes a processing circuit. A method includes receiving a write request to store a data object; identifying object parameters associated with the data object; selecting a memory type based on the identified object parameters; selecting a selected memory based on the memory type; and facilitating storage of the data object in the selected memory, wherein the data object is dispersed error encoded.

In various embodiments, The object parameters include a size indicator associated with the data object, such as data segment is dispersed error encoded into a plurality of data slices. The object parameters can also include temporary storage identifier associated with the data object, that for example, a identifies a data object for queue entry. The memory type can include a temporary storage, such as a queue memory device. The temporary storage can be implemented via a solid state memory device that has a lower latency and/or a lower access latency compared to other memory devices associated with at least one other memory type. The memory type can further include a main memory space that is implemented via a random access memory space.

Figure 43A:
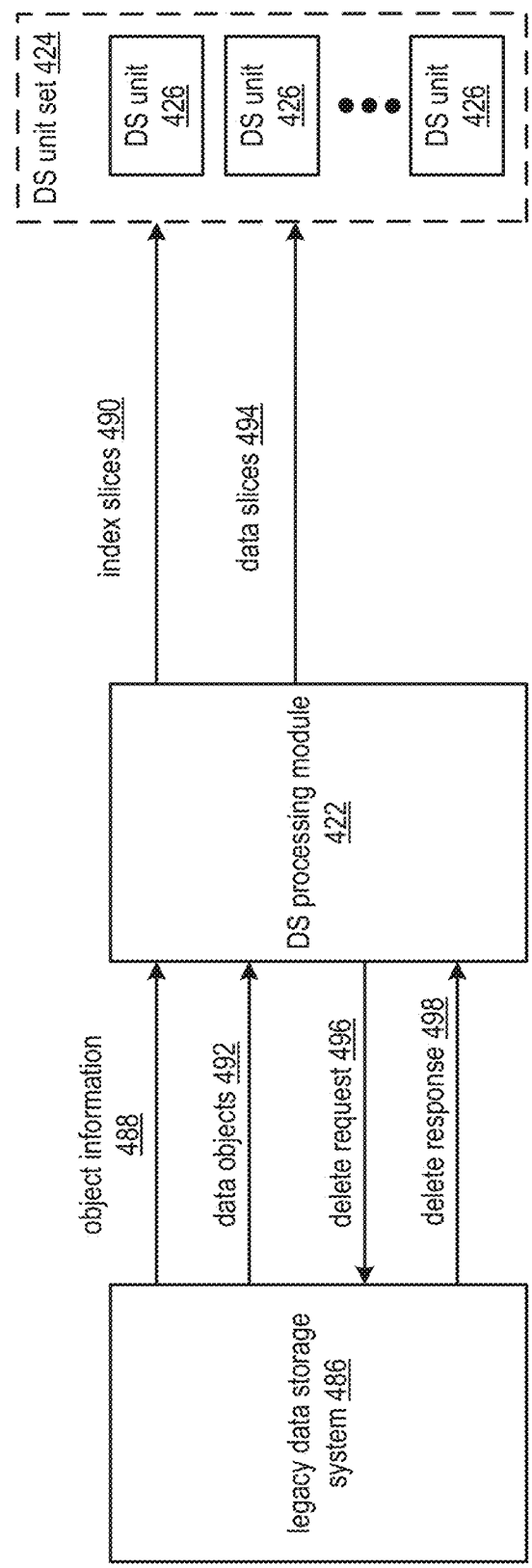
FIG. 43A is a schematic block diagram of another embodiment of a dispersed storage system in accordance with the present invention.

FIG. 43A is a schematic block diagram of another embodiment of a dispersed storage system that includes a legacy data storage system 486, a dispersed storage (DS) processing module 422, and a DS unit set 424. The DS unit set 424 includes a set of DS units 426 utilized to access slices stored in the set of DS units 426. The legacy data storage system 486 may be implemented utilizing any one of a variety of industry-standard storage technologies. The DS processing module 422 may be implemented utilizing at least one of a distributed storage and task (DST) client module, a DST processing unit, a DS processing unit, a user device, a DST execution unit, and a DS unit. The system is operable to facilitate migration of data from the legacy data storage system 486 to the DS unit set 424.

The legacy data storage system 486 provides object information 488 and data objects 492 to the DS processing module 422. The object information 488 includes one or more of object names of the data objects 492 stored in the legacy data storage system 486 and object sizes corresponding to the data objects 492. The processing module 422 receives the object information 488 and the data objects 492 from the legacy storage system 486 and stores at least some of the object information 488 in a dispersed index in the DS unit set 424. The dispersed index includes a plurality of index nodes and a plurality of leaf nodes where each of the plurality of index nodes and the plurality of leaf nodes are stored as a set of encoded index slices 490 in the DS unit set 424. Each leaf node of the dispersed index includes at least one entry corresponding to a data object 492 stored in the DS unit set 424, where the entry includes an index key associated with the data object 492. The plurality of index nodes provide a hierarchical structure to the dispersed index to identify a leaf node associated with the data object 492 based on the index key (e.g., searching through the hierarchy of index nodes based on comparing the index key to minimum index keys of each index node).

The storing in the dispersed index includes generating the index key associated with the corresponding data object 492 for each portion of the object information 488 and adding/modifying an entry of the dispersed index to include one or more of the index key, the object name, the object size, and an index entry state. The index entry state includes an indication of a migration state with regards to migrating the data object 492 from the legacy data storage system 486 to the DS unit set 424. The indication of migration state includes one of to be moved, moving, and moved. For example, the indication of migration state indicates to be moved when the data object 492 has been identified for migration from the legacy data storage system 486 to the DS unit set 424 when the moving has not been initiated. The DS processing module 422 initializes the index entry state to indicate to be moved. The initializing includes encoding a corresponding leaf node to produce a set of index slices 490 and outputting the set of index slices 490 to the DS unit set 424.

The DS processing module 422 encodes the data object 492 to produce data slices 494 and outputs the data slices 494 to the DS unit set 424 for storage. The DS processing module 422 updates the index entry state for the data object 492 to indicate the moving state (e.g., and not the to be moved state). When storage in the DS unit set 424 of a threshold number (e.g., a write threshold) of data slices 494 has been confirmed, the DS processing module 422 issues a delete request 496 to the legacy data storage system to delete the data object 492 from the legacy data storage system 486. When deletion of the data object 492 from the legacy data storage system 486 has been confirmed, the DS processing module 422 updates the index entry state for the data object 492 to indicate the moved state. The DS processing module 422 detects confirmation of deletion of the data object from the legacy data storage system 486 when receiving a favorable delete response 498 from the legacy data storage system 486 with regards to the data object 492. The method of operation is discussed in greater detail with reference to FIG. 43B.

Figure 43B:
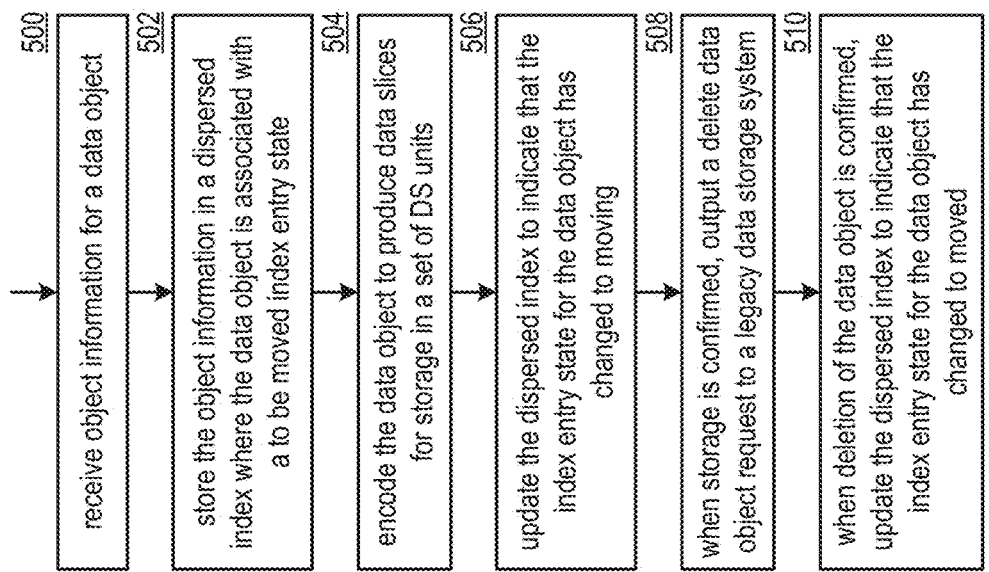
FIG. 43B is a flowchart illustrating an example of migrating data in accordance with the present invention.

FIG. 43B is a flowchart illustrating an example of migrating data. The method begins at step 500 where a processing module (e.g., a dispersed storage (DS) processing module) receives object information for a data object (e.g., from a legacy data storage system). The receiving may include outputting an object information request, receiving the data object, receiving the object information, receiving a migration request, and initiating a query. The method continues at step 502 where the processing module stores the object information in a dispersed index where the data object is associated with a to-be-moved index entry state. The storing includes establishing an index key of the data object based on one or more of the data object, a data object size indicator, and a data object identifier of the data object and modifying/updating a leaf node entry of a leaf node corresponding to the data object to include the index key, the object information, and an index entry state to indicate to be moved.

The method continues at step 504 where the processing module encodes the data object to produce data slices for storage in a set of DS units. The encoding includes encoding the data object using a dispersed storage error coding function to produce a plurality of encoded data slices, generating a plurality of slice names corresponding to the plurality of encoded data slices, generating a plurality of write slice requests that includes a plurality of slice names and the plurality of encoded data slices, and outputting the plurality of write slice requests to the DS unit set.

The method continues at step 506 where the processing module updates the dispersed index to indicate that the index entry state for the data object has changed to moving. For example, the processing module retrieves the leaf node (e.g., retrieves a set of index slices from the set of DS units, decodes the set of index slices to reproduce the leaf node), updates the index entry state to indicate moving to produce a modified leaf node, and stores the modified leaf node in the set of DS units (e.g., encodes the leaf node to produce a set of index slices, outputs the set of index slices to the set of DS units for storage).

When storage is confirmed, the method continues at step 508 where the processing module outputs a delete data object request to the legacy data storage system. For example, the processing module receives at least a write threshold number of favorable write slice responses from the set of DS units, generates the delete data object request to include the data object identifier, and outputs the delete data object request to the legacy data storage system. When deletion of the data object is confirmed, the method continues at step 510 where the processing module updates the dispersed index to indicate that the index entry state for the data object has changed to moved. For example, the processing module receives a delete data response from the legacy data storage system indicating that the deletion of the data object is confirmed, retrieves the leaf node, updates the index entry state to indicate moved to produce a further modified leaf node, and stores the further modified leaf node in the set of DS units.

Figure 44A:
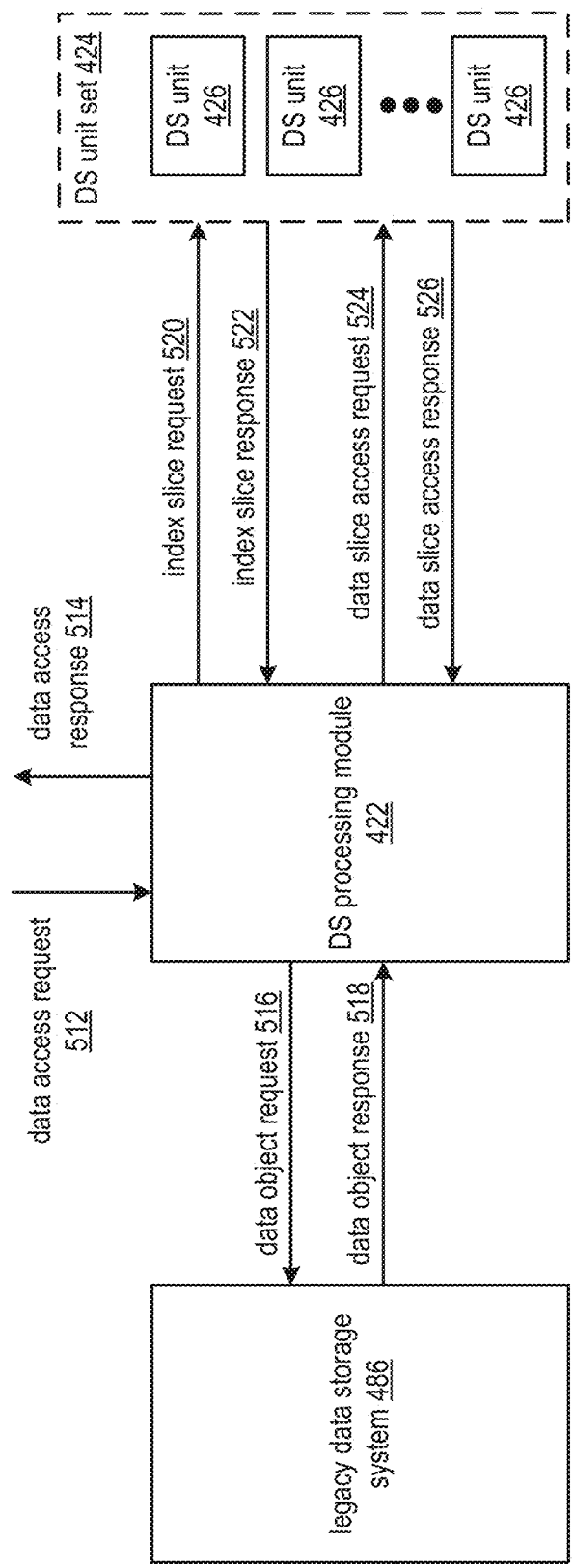
FIG. 44A is a schematic block diagram of another embodiment of a dispersed storage system in accordance with the present invention.

FIG. 44A is a schematic block diagram of another embodiment of a dispersed storage system that includes a legacy data storage system 486, a dispersed storage (DS) processing module 422, and a DS unit set 424. The DS unit set 424 includes a set of DS units 426 utilized to access slices stored in the set of DS units 426. The legacy data storage system 486 may be implemented utilizing any one of a variety of industry-standard storage technologies. The DS processing module 422 may be implemented utilizing at least one of a distributed storage and task (DST) client module, a DST processing unit, a DS processing unit, a user device, a DST execution unit, and a DS unit. The system is operable to facilitate accessing migrating data while the data is being migrated from the legacy data storage system 486 to the DS unit set 424.

The DS processing module 422 receives a data access request 512 (e.g., from a client module, from a user device, from a requesting entity) where the data access request 512 includes at least one of a read request, a write request, a delete request, and a list request. The DS processing module 422 processes the data access request 512, generates a data access response 514 based on the processing, and outputs the data access response 514 (e.g., to the client module, to the user device, to the requesting entity).

In an example of processing the data access request 512, the data access request includes the read request such that the DS processing module 422 receives the data access request 512 to read a data object. Having received the read requests, the DS processing module 422 accesses a dispersed index to identify an index entry state corresponding to the data object. The accessing includes generating a set of index slice requests 520 corresponding to a leaf node of the dispersed index associated with the data object, outputting the set of index slice requests 520 to the DS unit set 424, receiving at least a decode threshold number of index slice responses 522, and decoding the at least the decode threshold number of index slice responses 522 to reproduce the leaf node containing the index entry state corresponding to the data object. When the state indicates moved, the DS processing module 422 retrieves the data object from the DS unit set 424 (e.g., issuing data slice access requests 524 to the DS unit set 424, receiving data slice access responses 526, and decoding the data slice access responses 526 to reproduce the data object). When the state does not indicate moved, the DS processing module 422 retrieves the data object from the legacy data storage system 486 (e.g., issuing a data object request 516 to the legacy data storage system 486 and receiving a data object response 518 that includes the data object).

In another example of processing the data access request 512, the DS processing module 422 receives a data access request 512 to write another data object. The DS processing module 422 accesses the dispersed index to identify a dispersed storage network (DSN) address associated with storage of the other data object (e.g., retrieves the leaf node associated with the data object to produce the DSN address). The DS processing module 422 stores the other data object in the DS unit set 424 utilizing the DSN address (e.g., issuing data slice access requests 524 that includes slice names based on the DSN address and encoded data slices produced from encoding the other data object using a dispersed storage error coding function).

In another example of processing the data access request 512, the DS processing module 422 receives a data access request 512 to delete the data object. The DS processing module 422 accesses the dispersed index to determine the index entry state corresponding to the data object. When the index entry state indicates moved, the DS processing module 422 facilitates deletion of the data object from the DS unit set 424 (e.g., issuing data slice access requests 524 that includes delete requests to the DS unit set 424). When the index entry state indicates moving, the DS processing module 422 facilitates deletion of the data object from the DS unit set 424 and from the legacy data storage system 486 (e.g., issuing another data object request 516 that includes a delete data object request to the legacy data storage system 486). When the index entry state indicates to be moved, the DS processing module 422 facilitates deletion of the data object from the legacy data storage system 486.

In yet another example of processing the data access request 512, the DS processing module 422 receives a data access request 512 to list data. The request to list data may include one or more data object names and/or a DSN address range. The DS processing module 422 accesses the dispersed index to identify one or more DSN addresses associated with the one or more data object names of the request to list data. The DS processing module 422 facilitates issuing a series of data slice access requests 524 that includes a series of list requests to the DS unit set 424 for slices associated with the one or more DSN addresses and/or the DSN address range. The DS processing module 422 receives data slice access responses 526 that includes list responses. The DS processing module 422 issues data object requests 516 to the legacy data storage system 486 where the data object requests 516 includes list requests for the data objects. The DS processing module 422 receives data object responses 518 that includes list data object responses. The DS processing module 422 aggregates list responses from the legacy data storage system 486 and the DS unit set 424 to produce a compiled list response. The DS processing module 422 issues a data access response 514 to a requesting entity, where the data access response 514 includes the compiled list response.

Figure 44B:
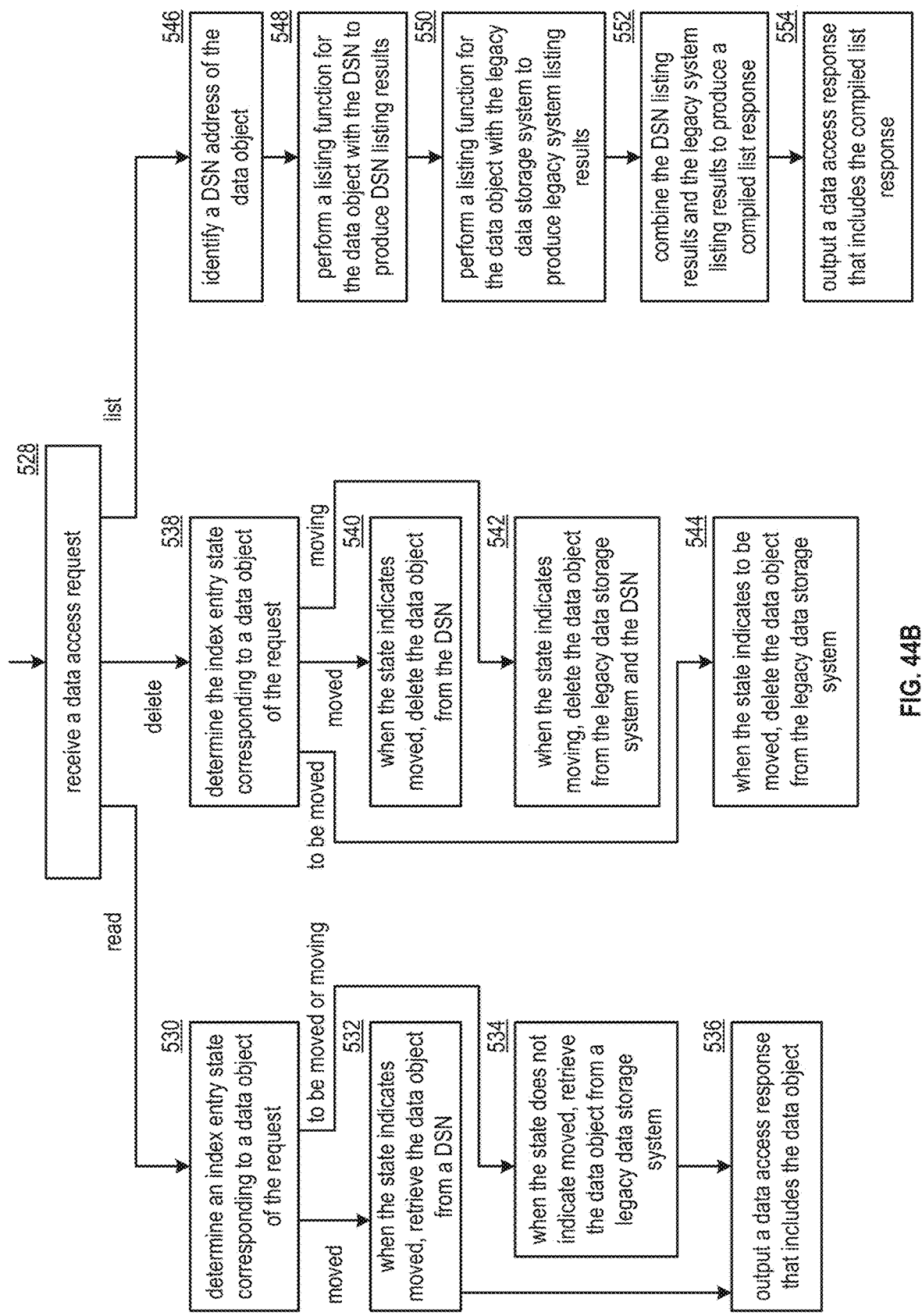
FIG. 44B is a flowchart illustrating an example of accessing migrating data in accordance with the present invention.

FIG. 44B is a flowchart illustrating an example of accessing migrating data. The method begins at step 528 where a processing module (e.g., a dispersed storage (DS) processing module) receives a data access request from a requesting entity. When the data access request includes a read request, the method branches to step 530. When the data access request includes a delete request, the method branches to step 538, when the data access request includes a list request, the method continues to step 546.

When the data access request includes the read request, the method continues at step 530 where the processing module determines an index entry state corresponding to a data object of the request (e.g., retrieve a leaf node of a dispersed index corresponding to the data object to extract the index entry state). When the index entry state indicates moved, the method continues at step 532 where the processing module retrieves the data object from a dispersed storage network (DSN). The retrieving includes generating data slice access requests, receiving data slice access responses, and decoding data slices of the data slice access responses to reproduce the data object. The method branches to step 536. When the index entry state does not indicate moved (e.g., indicates to be moved or moving), the method continues at step 534 where the processing module retrieves the data object from the legacy data storage system. The retrieving includes generating a data object request, outputting the data object request to the legacy data storage system, and receiving a data object response from the legacy data storage system that includes the data object. The method continues at step 536 where the processing module outputs a data access response that includes the data object.

When the data access request includes the delete request, the method continues at step 538 where the processing module determines the index entry state corresponding to the data object of the request. When the index entry state indicates to be moved, the method continues at step 544 where the processing module deletes the data object from the legacy data storage system (e.g., issues data object requests that includes a delete request to the legacy data storage system). When the index entry state indicates moved, the method continues at step 540 where the processing module deletes the data object from the DSN (e.g., issues delete data access slice requests to the DSN). When the index entry state indicates moving, the method continues at step 542 where the processing module deletes the data object from the legacy data storage system and the DSN.

When the data access request includes the list request, the method continues at step 546 where the processing module identifies a DSN address of the data object (e.g., based on an index lookup using a data object identifier of the request).

The method continues at step 548 where the processing module performs a listing function for the data object with the DSN to produce DSN listing results (e.g., issuing list data slice access requests, receiving list data slice access responses to produce the DSN listing results). The method continues at step 550 where the processing module performs a listing function for the data object with the legacy data storage system to produce legacy system listing results (e.g., issuing a list data object request to the legacy data storage system, receiving a list data object response to produce the legacy system listing results). The method continues at step 552 where the processing module combines the DSN listing results and the legacy system listing results to produce a compiled list response. The combining includes at least one of appending, concatenating, interleaving, and sorting. The method continues at step 554 where the processing module outputs a data access response that includes the compiled list response to the requesting entity.

Figure 45A:
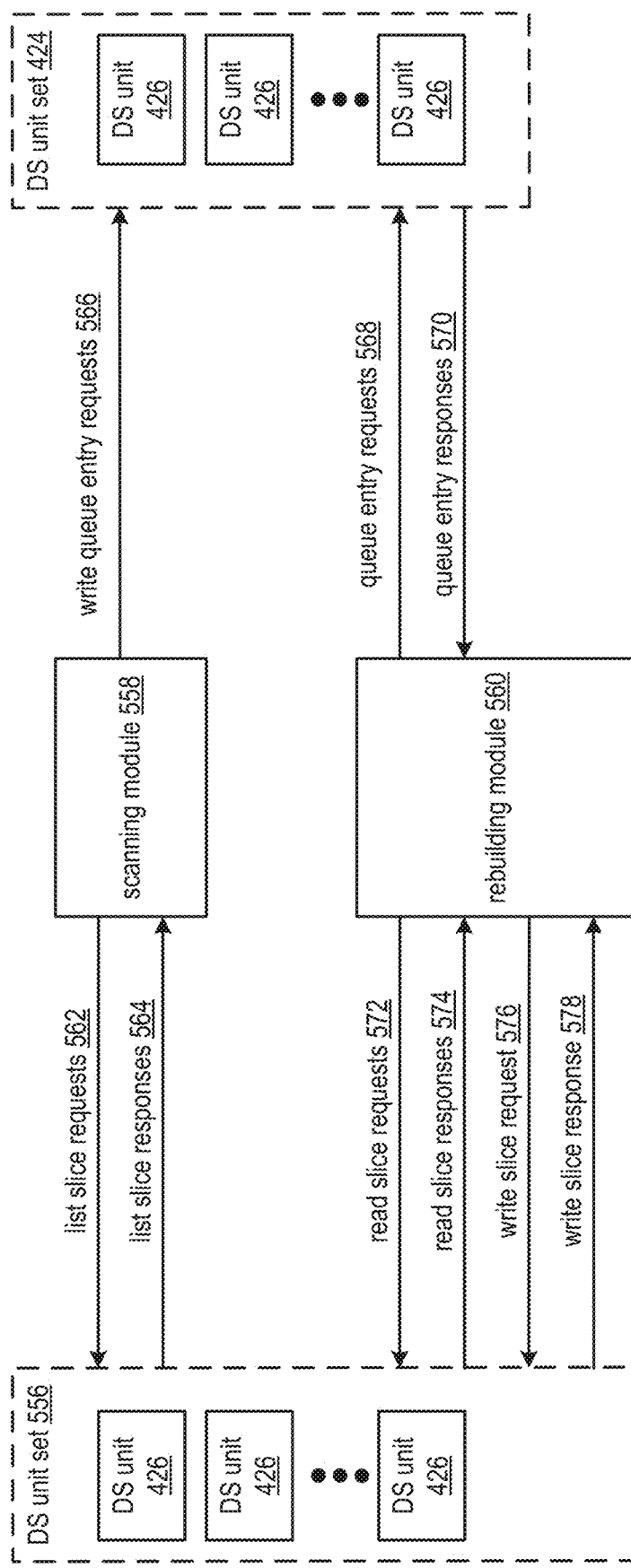
FIG. 45A is a schematic block diagram of another embodiment of a dispersed storage system in accordance with the present invention.

FIG. 45A is a schematic block diagram of another embodiment of a dispersed storage system that includes one or more dispersed storage (DS) unit sets 556 and 424, a scanning module 558, and a rebuilding module 560. Each DS unit set 556 and 424 includes a set of DS units 426. In a first embodiment, as illustrated, the one or more DS unit sets 556 and 424 are implemented as two separate sets of DS units 426. Alternatively, in another embodiment, the one or more DS unit sets are implemented as a common DS unit set (e.g., DS unit set 424). The scanning module 558 and rebuilding module 560 may be implemented utilizing one or more of a user device, a server, a processing module, a computer, a DS processing unit, a DS processing module, a DS unit, a distributed storage and task (DST) processing unit, a DST processing module, a DST client module, and a DST execution unit. For example, the scanning module 558 is implemented in a first DST execution unit and the rebuilding module 560 is implemented in a second DST execution unit. As another example, the scanning module 558 and the rebuilding module 560 are implemented utilizing a common DST execution unit.

The system functions to detect one or more stored slices in error (e.g., missing and/or corrupted slices that should be stored in one or more DS units of a first DS unit set 556) and to remedy (e.g., rebuild) the one or more stored slices in error. The scanning module 558 functions to detect the one or more stored slices in error and the rebuilding module functions 560 to remedy the one or more stored slices in error. The scanning module 558 communicates identities of the one or more stored slices in error to the rebuilding module 560 by utilizing entries of one or more dispersed queues stored in the second DS unit set 424.

In an example of operation, the scanning module 558 detects the one or more stored slices in error and updates the dispersed queue with an entry pertaining to at least one stored slice in error. The scanning module 558 functions to detect the one or more stored slices in error through a series of steps. A first step includes generating a set of list slice requests 562 that include a range of slice names to be scanned associated with the first DS unit set 556. A second step includes outputting the set of list slice requests 562 to the first DS unit set 556. A third step includes comparing list slice responses 564 from the first DS unit set 556 to identify one or more slice names associated with the one or more stored slices in error. For example, the scanning module 558 identifies a slice name that is not listed in a list slice response 564 from a DS unit 426 of the DS unit set 556 when slice names of a set of slice names that are associated with the slice name are received via other list slice responses 564 from other DS units 426 of the DS unit set 556.

Having identified the one or more stored slices in error, the scanning module 558 updates the one or more dispersed queues by sending write queue entry requests 566 to the second DS unit set 424 through a series of steps. A first step includes determining a number of slice errors per set of encoded data slices that includes the slice error. A second step includes generating a queue entry that includes one or more of the slice name, the number of slice errors, a rebuilding task indicator, and identity of the set of slice names that are associated with the slice name (e.g., a source name). A third step includes identifying a dispersed queue of the one or more dispersed queues based on the number of slice errors. A fourth step includes storing the queue entry in the identified dispersed queue associated with the second DS unit set 424. The storing includes encoding the queue entry to produce a set of entry slices, identifying a rebuilding dispersed queue, generating a set of entry slice names for the queue entry, generating a set of write slice requests that includes the set of entry slices and the set of entry slice names, and outputting the set of write slice requests to the second DS unit set 424.

With the queue entry in place, the rebuilding module 560 remedies the one or more stored slices in error through a series of steps. A first step includes retrieving a queue entry from a dispersed queue of the one or more dispersed queues where the dispersed queue is associated with a highest number of slice errors. The retrieving includes outputting a set of queue entry requests 568 to the second DS unit set 424 that includes a set of list requests associated with a slice name range of a highest priority queue entry (e.g., oldest), receiving a set of queue entry responses that includes a set of list responses, identifying a set of slice names associated with the queue entry (e.g., lowest slice names of a range of slice names associated with a first in first out (FIFO) approach), generating and outputting a set of delete read slice requests that includes the set of slice names to the second DS unit set 424, receiving at least a decode threshold number of queue entry responses 570 that includes entry slices, and decoding the at least a decode threshold number of entry slices to reproduce the queue entry.

A second step to remedy the one or more stored slices in error includes extracting the slice name of the slice in error from the queue entry. A third step includes facilitating rebuilding of the slice in error (e.g., directly rebuilding, issuing a rebuilding request to another rebuilding module). When directly rebuilding, the rebuilding module 560 outputs, to the first DS unit set 556, at least a decode threshold number of read slice requests 572 that includes slice names associated with the slice in error, receives at least a decode threshold number of read slice responses 574 that includes slices associated with the slice in error, decodes the slices associated with the slice in error to produce a recovered data segment, and encodes the recovered data segment to produce a rebuilt slice. A fourth step includes generating and outputting, to the first DS unit set 556, a write slice request 576 that includes the slice name of the slice in error and the rebuilt slice. A fifth step includes receiving a write slice response 578 that includes status of writing the rebuilt slice (e.g., succeeded/failed).

When the status of writing the rebuilt slice is favorable (e.g., succeeded), the rebuilding module 560 generates and outputs, to the second DS unit set 424, a set of queue entry requests 568 that includes a set of commit requests associated with the delete read requests previously output to the second DS unit set 424 with regards to retrieving the queue entry. Such a set of requests completes deletion of the queue entry to remove the queue entry from the dispersed queue since the slice in error has been successfully rebuilt.

Figure 45B:
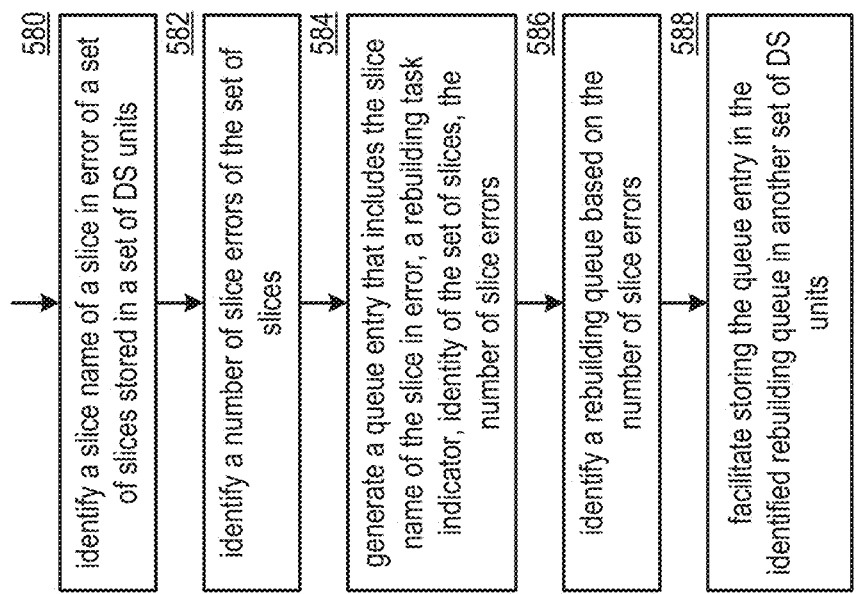
FIG. 45B is a flowchart illustrating an example of generating a rebuilding task queue entry in accordance with the present invention.

FIG. 45B is a flowchart illustrating an example of generating a rebuilding task queue entry. The method begins at step 580 where a processing module (e.g., of scanning module) identifies a slice name of a slice in error of a set of slices stored in a set of dispersed storage (DS) units. The identifying includes generating and outputting, to the set of DS units, a set of list slice requests to include a slice name range to be scanned for errors, receiving list slice responses, and identifying the slice name of the slice in error based on a comparison of list slice responses. The method continues at step 582 where the processing module identifies a number of slice errors of the set of slices (e.g., counting).

The method continues at step 584 where the processing module generates a queue entry that includes the slice name of the slice in error, a rebuilding task indicator (e.g., a rebuilding opcode), identity of the set of slices (e.g., the source name of the common set of slices), and the number of slice errors. The method continues at step 586 where the processing module identifies a rebuilding dispersed queue based on the number of slice errors. The identifying may include one or more of a lookup (e.g., a queue list by number of slice errors), a query, and receiving. The method continues at step 588 where the processing module facilitates storing the queue entry in the identified rebuilding queue in another set of DS units. Alternatively, the processing module facilitates storage of the queue entry in the identified rebuilding queue in the set of DS units.

The facilitating storage of the queue entry in the identified rebuilding queue includes a series of steps. A first step includes generating a set of queue entry slice names based on one or more of a queue vault identifier, a queue name associated with the identified rebuilding queue, a DS processing module identifier associated with the processing module, a client identifier based on a vault lookup, and a current timestamp. A second step includes encoding the queue entry using a dispersed storage error coding function to produce a set of queue entry slices. A third step includes generating a set of write slice requests that includes the set of queue entry slices and the set of queue entry slice names. A fourth step includes outputting the set of write slice requests to the other set of DS units when utilizing the other set of DS units for storage of the queue entry.

In addition, a rebuilding module may remove a queue entry from a queue associated with a highest number of missing slices first to facilitate rebuilding of the slice in error. When completing rebuilding of the slice in error, the rebuilding module facilitates deletion of the queue entry from the queue.

Figure 46:
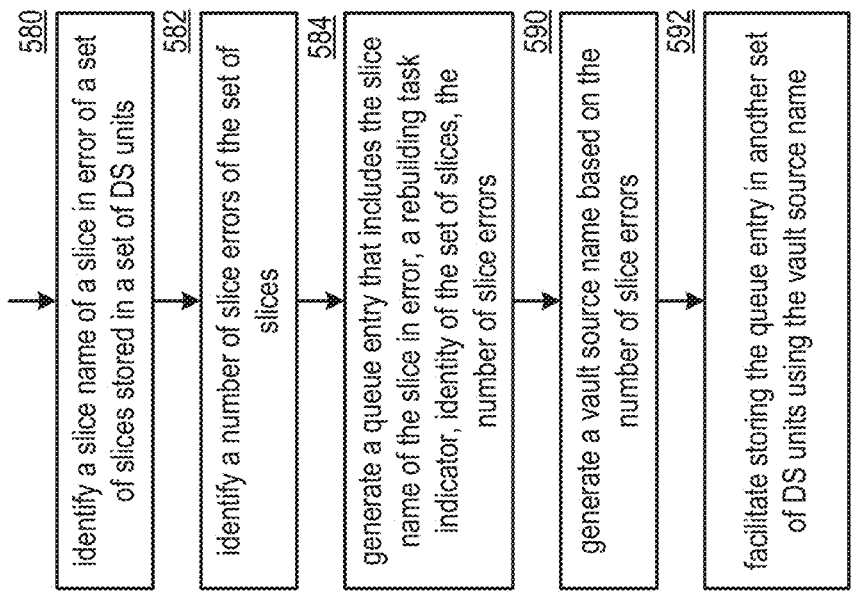
FIG. 46 is a flowchart illustrating another example of generating a rebuilding task queue entry in accordance with the present invention.

FIG. 46 is a flowchart illustrating another example of generating a rebuilding task queue entry, that includes similar steps to FIG. 45B. The method begins with steps 580, 582, and 584 of FIG. 45B where a processing module (e.g., of a scanning module) identifies a slice name of a slice in error of a set of slices stored in a set of dispersed storage (DS) units, identifies a number of slice errors of the set of slices, and generates a queue entry that includes the slice name of the slice in error, a rebuilding task indicator, identity of the set of slices, and the number of slice errors.

The method continues at step 590 where the processing module generates a vault source name based on the number of slice errors. The generating includes at least one of including a queue vault identifier (ID), a queue name to include the number of slice errors, a DS processing module ID, a client ID, and a timestamp of a current real-time. The method continues at step 592 where the processing module facilitates storing the queue entry in another set of DS units using the vault source name. The facilitating includes generating a set of slice names using the vault source name, encoding the queue entry to produce a set of queue entry slices, generating a set of write slice requests that includes the set of queue entry slices and the set of slice names, and outputting the set of write slice requests to the other set of DS units. In addition, a rebuilding module may remove the queue entry that is associated with a highest number of slices in error by generating a vault source name with a higher order queue name.

FIGS. 47A-B, E-H are schematic block diagrams of embodiments of a dispersed storage network (DSN) illustrating examples of steps of storing data. The DSN includes the user device 14, the distributed storage and task (DST) processing unit 16, and the network 24 of FIG. 1; and a set of DST execution units 1-$n$, where each DST execution unit may be implemented with the DST execution unit 36 of FIG. 1. The user device 14 includes a computing core 26 of FIG. 2. The DST processing unit 16 includes the DST client module 34 of FIG. 3. The DST client module 34 includes the DST processing module 80 of FIG. 3 and a request module 600. The request module 600 may be implemented utilizing a processing module 84 of FIG. 3. Each DST execution unit includes the processing module 84 and the memory 88 of FIG. 3.

FIG. 47A illustrates initial steps of the examples of the steps of storing the data. As a specific example, the request module 600 receives, from the user device 14, a request 602 to store data A in the DSN. Having received the request 602, the request module 600 determines, for the request 602, dispersed storage error encoding parameters for encoding the data into sets of encoded data slices. The dispersed storage error encoding parameters includes a per set decode threshold, a per set write threshold, and a per set total number. The per set decode threshold indicates a number of encoded data slices of a set of encoded data slices required to construct a corresponding segment of the data (e.g., where the data is divided into segments), the per set write threshold indicates a number of encoded data slices of the set of encoded data slices that are to be stored for a successful storage operation, and the per set total number indicates the number of encoded data slices in the set of encoded data slices (e.g., a pillar width number). For example, the request module 600 determines the dispersed storage error encoding parameters by determining a vault based on at least one of the request 602 and the user device 14, and determining the per set decode threshold, the per set write threshold, and the per set total number based on information regarding the vault (e.g., extracting parameters from a registry associated with the vault).

Having determined the dispersed storage error encoding parameters, the request module 600 determines whether the request 602 includes a desired write reliability indication. The desired write reliability indication indicates a desired level of write reliability that meets or exceeds the per set write threshold. For example, desired write reliability indication includes a value in a range between the per set write threshold and the per set total number. For instance, the desired level of write reliability indication indicates 14 slices when the decode threshold is 10, the write threshold is 12, and the total number is 16. More parameter examples are discussed in greater detail with reference to FIG. 47C.

When the request 602 does not include the desired write reliability indication, the DST processing module 80 executes storage of the sets of encoded data slices in accordance with the dispersed storage error encoding parameters and may subsequently send storage reliability information to the user device 14 indicating how many encoded data slices per set of encoded data slices were successfully stored. As a specific example, the DST processing module 80 encodes the data using a dispersed storage error coding function in accordance with the dispersed storage error encoding parameters to produce the sets of encoded data slices. For instance, the DST processing module 80 encodes a first data segment of the data A to produce slices A-1-1, A-2-1, through A-$n$-1. The DST processing module 80 issues, via the network 24, one or more sets of write slice requests 604 to the set of DST execution units 1-$n$ as write slice requests 1-$n$, where the one or more sets of write slice requests 604 includes the sets of encoded data slices. For each DST execution unit, the processing module 84 stores a corresponding encoded data slice in the memory 88 of the DST execution unit.

When the request 602 includes the desired write reliability indication, the DST processing module 80 executes the storage of the sets of encoded data slices in accordance with the dispersed storage error encoding parameters and subsequently determines whether the storage of the sets of encoded data slices is meeting the desired write reliability indication. The determining whether the storage of the sets of encoded data slices is meeting the desired write reliability indication is discussed in greater detail with reference to FIG. 47B.

FIG. 47B illustrates further steps of the examples of the steps of storing the data. As a specific example, while executing storage of the sets of encoded data slices in accordance with the dispersed storage error encoding parameters, the DST processing module 80 determines whether the storage of the sets of encoded data slices is meeting the desired write reliability indication. For example, while the DST processing module 80 executes the storage of the sets of encoded data slices in accordance with the dispersed storage error encoding parameters, the DST processing module 80 enters a loop that includes causing the DST processing module 80 to determine whether the storage of one of the sets of encoded data slices is meeting the desired write reliability indication. For instance, the DST processing module 80 receives write slice responses 606, via the network 24, from write slice responses of write slice responses 1-$n$ from the set of DST execution units 1-$n$. Each write slice response indicates whether a corresponding encoded data slice was successfully stored in an associated DST execution unit. The DST processing module 80 indicates that the one set of encoded data slices is meeting the desired write reliability indication when a number of favorable (e.g., indicating successful storage) write slice responses 606 is greater than or equal to the value of the write reliability indication.

When the storage of the one of the sets of encoded data slices is not meeting the desired write reliability indication, the DST processing module 80 flags the one of the sets of encoded data slices and determines whether the one of the sets of encoded data slices is a last set of the sets of encoded data slices (e.g., for all segments). When the storage of the one of the sets of encoded data slices is meeting the desired write reliability indication, the DST processing module 80 determines whether the one of the sets of encoded data slices is the last set of the sets of encoded data slices. When the one of the sets of encoded data slices is not the last set of the sets of encoded data slices, the DST processing module 80 repeats the loop for another one of the sets of encoded data slices. When the one of the sets of encoded data slices is the last set, the DST processing module 80 exits the loop. When exiting the loop, the DST processing module 80 compiles a list of the sets of encoded data slices of all the sets of encoded data slices that did not meet the desired write reliability indication to produce a list of sets. Having produced the list of sets, the DST processing module 80 determines a storage compliance process for the list of sets and executes the storage compliance process for the sets of encoded data slices based on the list of sets. The determining and execution of the storage compliance process is discussed in greater detail with reference to FIGS. 47D and 47G.

When the storage of the set of encoded data slices is meeting the desired write reliability indication, the request module 600 indicates that the set of encoded data slices met the desired write reliability indication by issuing storage of reliability information 608 with regards to data A to the user device 14. The reliability information 608 includes one or more of a number of encoded data slices stored for each segment, an estimated storage reliability level for each data segment, an estimated storage reliability level for all data segments, a net stored indicator, a stored indicator, a stored with low reliability indicator, a stored with desired reliability indicator, and a stored with high reliability indicator. The user device 14 may delete data A based on the storage of reliability information 608. For example, the user device 14 deletes data A from the computing core 26 when the storage reliability information indicates that each data segment was stored with the desired write reliability indication.

FIG. 47C is a diagram illustrating an example of a dispersed storage (DS) parameters table 610 that includes entries of a desired level field 612 and corresponding entries of parameter sets of a decode threshold field 614, a write threshold field 616, a desired threshold field 618, and a total number field 620. The entries of the desired level field 612 corresponds to names of candidate levels of the desired write reliability indication. For example, the candidate levels includes names of a range from highest to lowest. A parameter set of entries of the decode threshold field 614, the write threshold field 616, the desired threshold field 618, and the total number field 620 corresponds to one of the candidate levels. For example, the highest desired level 612 corresponds to a parameter set that includes a decode threshold entry of 10, a write threshold of 12, a desired threshold value of 16, and a total number of 16. As such, when the highest desired level is selected, the desired write reliability indication is met only when a value of the desired threshold is 16. For instance, all 16 encoded data slices of a set of 16 encoded data slices were successfully stored to achieve the desired write reliability indication. As another example, the medium desired level 612 corresponds to another parameter set that includes the decode threshold entry of 10, the write threshold of 12, a desired threshold value of 14, and the total number of 16. As such, when the medium desired level is selected, the desired write reliability indication is met when the value of the desired threshold is 14 or more. For instance, the desired write reliability indication is achieved when 14 or more encoded data slices of the set of 16 encoded data slices were successfully stored.

FIG. 47D is a diagram illustrating an example of a storage compliance table 622 that includes entries of the desired level field 612 of FIG. 47C, an actual stored field 624, and a compliance process field 626. An entry of the storage compliance table 622 may be utilized (e.g., by the user device 14, by the DST processing module 80) to determine the storage compliance process. As a specific example, a delete original compliance process 626 is selected when the highest desired level 612 is selected (e.g., requiring at least 16 successfully stored encoded data slices per set) and the number of encoded data slices actually stored is 16 (e.g., corresponding to an entry of 16 in the actual stored 624 field). As such, the user device may delete the data being stored in the DSN. As another specific example, a re-store compliance process 626 is selected when the highest desired level 612 is selected and the number of encoded data slices actually stored is 15. As such, the storage compliance process includes retrying storage of the sets of encoded data slices that were not successfully stored (e.g., missing one slice) during the execution of storage. As yet another example, a retrying slice compliance process 626 is selected when the medium-high desired level 612 is selected (e.g., requiring at least 15 successfully stored encoded data slices per set) and the number of encoded data slices actually stored is 14. As such, the storage compliance process includes initiating a storage unit retry process for encoded data slices of the set of encoded data slices that were not successfully stored (e.g., 2 slices) during the execution of storage.

As a further example, a re-store segment compliance process 626 is selected when the medium-high desired level 612 is selected (e.g., requiring at least 15 successfully stored encoded data slices per set) and the number of encoded data slices actually stored is 13. As such, the storage compliance process includes initiating a storage unit retry process for the set of encoded data slices that were not successfully stored (e.g., all 16 slices) during the execution of storage. As a still further example, a rebuild slice compliance process 626 is selected when the medium-high desired level 612 is selected (e.g., requiring at least 15 successfully stored encoded data slices per set) and the number of encoded data slices actually stored is 14. As such, the storage compliance process includes initiating a rebuilding process for encoded data slices of the set of encoded data slices that were not successfully stored (e.g., 4 slices) during the execution of storage.

FIG. 47E illustrates further steps of the examples of the steps of storing the data. As a specific example, the request module 600 receives, from a user device 14, a request 602 to store data B in the DSN. The request module 600 determines, for the request 602 to store data B, dispersed storage error encoding parameters for encoding the data B into sets of encoded data slices. The dispersed storage error encoding parameters includes the per set decode threshold, the per set write threshold, and the per set total number. Having determined the parameters, the request module 600 determines whether the request 602 includes the desired write reliability indication. The DST processing module 80 encodes data B to produce the sets of encoded data slices and executes storage of the sets of encoded data slices in accordance with the dispersed storage error encoding parameters (e.g., issuing one or more sets of write slice requests 604, via the network 24, that includes write slice requests 1-*n* to the set of DST execution units 1-*n*).

FIG. 47F illustrates further steps of the examples of the steps of storing the data. As a specific example, when the request includes the desired write reliability indication, while executing storage of the sets of encoded data slices in accordance with the dispersed storage error encoding parameters, the DST processing module 80 determines whether the storage of the sets of encoded data slices is meeting the desired write reliability indication. For example, the DST processing module 80 receives write slice responses 606, via the network 24, that includes write slice responses of the write slice responses 1-*n* from the DST execution units 1-*n*, and determines whether the level of the desired write reliability indication is being met. As a more specific example, the DST processing module 80 enters a loop where the DST processing module 80 determines whether the storage of one of the sets of encoded data slices is meeting the desired write reliability indication. When the storage of the one of the sets of encoded data slices is not meeting the desired write reliability indication, the DST processing module 80 flags the one of the sets of encoded data slices and determines whether the one of the sets of encoded data slices is a last set of the sets of encoded data slices. When the one of the sets of encoded data slices is not the last set of the sets of encoded data slices, the DST processing module 80 repeats the loop for another one of the sets of encoded data slices. When the one of the sets of encoded data slices is the last set of encoded data slices, the DST processing module 80 exits the loop.

Having exited the loop, the DST processing module 80 compiles a list of the sets of encoded data slices that did not meet the desired write reliability indication to produce the list of sets. When storage of the set of encoded data slices of the sets of encoded data slices is not meeting the desired write reliability indication, the DST processing module 80 determines a storage compliance process for the set of encoded data slices to meet the desired write reliability indication. For example, the DST processing module 80 determines the storage compliance process for the list of sets. Having determined the storage compliance process, the DST processing module 80 executes the storage compliance process for the set of encoded data slices. For example, the DST processing module 80 executes the storage compliance process for the sets of encoded data slices based on the list of sets. As a specific example of executing the storage compliance process, the request module 600 sends a message that includes the storage reliability information 608 of data B to the user device 14 indicating that storage of the set of encoded data slices met the per set write threshold but did not meet the desired write reliability indication.

FIG. 47G illustrates further steps of the examples of the steps of storing the data. As a specific example, continuing the steps of FIG. 47F, the request module 600 receives a store data request 602 for data B (e.g., a response to the storage reliability information 608) from the user device 14 requesting a storage retry of at least the encoded data slices of the set of encoded data slices that were not successfully stored during the execution of storage. Having received the storage request 602, the DST processing module 80 retries storage of the encoded data slices of the set of encoded data slices that were not successfully stored during the execution of storage. For example, the DST processing module 80 issues a set of write slice request 604, via the network 24, that includes a corresponding set of write slice requests 1-*n* to the set of DST execution units 1-*n*.

As another specific example of executing the storage compliance process, the DST processing module 80 initiates a rebuilding process for encoded data slices of the set of encoded data slices that were not successfully stored during the execution of storage. As yet another specific example of executing the storage compliance process, the DST processing module 80 initiates a storage unit retry process for encoded data slices of the set of encoded data slices that were not successfully stored during the execution of storage.

FIG. 47H illustrates further steps of the examples of the steps of storing the data. As a specific example, when the request 602 to re-store at least a portion of data B includes the desired write reliability indication, while executing storage of the sets of encoded data slices in accordance with the dispersed storage error encoding parameters, the DST processing module 80 determines whether the storage of the sets of encoded data slices is meeting the desired write reliability indication. For example, the DST processing module 80 receives write slice responses 606, via the network 24, that includes write slice responses of the write slice responses 1-*n* from the DST execution units 1-*n*, and determines whether the level of the desired write reliability indication is being met. When storage of the set of encoded data slices is meeting the desired write reliability indication, the request module 600 issues the storage reliability information 608 to the user device 14 to indicate that the set of encoded data slices met the desired write reliability indication. The user device 14 may delete data B from the computing core 26 when receiving the indication that the set of encoded data slices met the desired rate reliability indication.

FIG. 47I is a flowchart illustrating an achieving storage compliance. The method begins at step 630 where a processing module (e.g., of distributed storage and task (DST) client module) receives, from a device (e.g., a user device), a request to store data in a dispersed storage network (DSN). The method continues at step 632 where the processing module determines, for the request, dispersed storage error encoding parameters for encoding the data into sets of encoded data slices. The dispersed storage error encoding parameters includes a per set decode threshold, a per set write threshold, and a per set total number. The per set decode threshold indicates a number of encoded data slices of a set of encoded data slices required to construct a corresponding segment of the data, the per set write threshold indicates a number of encoded data slices of the set of encoded data slices that are to be stored for a successful storage operation, and the per set total number indicates the number of encoded data slices in the set of encoded data slices. As a specific example, the processing module determines the dispersed storage error encoding parameters by determining a vault based on at least one of the request and the device, and determining the per set decode threshold, the per set write threshold, and the per set total number based on information regarding the vault.

The method continues at step 634 where the processing module determines whether the request includes a desired write reliability indication. The desired write reliability indication indicates a desired level of write reliability that meets or exceeds the per set write threshold. The desired write reliability indication includes a value in a range between the per set write threshold and the per set total number. As a specific example, the desired write reliability indication indicates a level of 14 encoded data slices when the write threshold is 12 and the total number is 16. When the request includes the desired write reliability indication, the method branches to step 638. When the request does not include the desired write reliability indication, the method continues to step 636.

When the request does not include the desired write reliability indication, the method continues at step 636 where the processing module executes storage of the sets of encoded data slices in accordance with the dispersed storage error encoding parameters. As a specific example, the processing module issues sets of write slice requests to the DSN memory, where the sets of write slice requests includes the sets of encoded data slices, receives write slice responses regarding status of storage of the sets of encoded data slices, and issues a status message to the device indicating status of storage of the sets of encoded data slices (e.g., successful with regards to the write threshold, not successful with regards to the write threshold, number of encoded data slices successfully stored per set of encoded data slices, an estimated storage reliability level).

When the request includes the desired write reliability indication, the method continues at step 638 where the processing module executes storage of the sets of encoded data slices and while executing storage of the sets of encoded data slices in accordance with the dispersed storage error encoding parameters, determines whether the storage of the sets of encoded data slices is meeting the desired write reliability indication. The method branches to step 642 when the storage is not meeting the desired write reliability indication. The method continues to step 640 when the storage is meeting the desired write reliability indication. As a specific example, while executing the storage of the sets of encoded data slices in accordance with the dispersed storage error encoding parameters, the processing module enters a loop that includes determining whether the storage of one of the sets of encoded data slices is meeting the desired write reliability indication. When the storage of the one of the sets of encoded data slices is not meeting the desired write reliability indication, the processing module flags the one of the sets of encoded data slices and determines whether the one of the sets of encoded data slices is a last set of the sets of encoded data slices. Alternatively, when storage of the one of the sets of encoded data slices is meeting the desired write reliability indication, the processing module determines whether the one of the sets of encoded data slices is the last set of the sets of encoded data slices. When the one of the sets of encoded data slices is not the last set of encoded data slices, the processing module repeats the loop for another one of the sets of encoded data slices. When the one of the sets of encoded data slices is the last set of encoded data slices, the processing module exits the loop. When exiting the loop, the processing module compiles a list of the sets of encoded data slices of all the sets of encoded data slices that did not meet the desired write reliability indication to produce a list of sets.

When storage of the set of encoded data slices is meeting the desired write reliability indication, the method continues at step 640 where the processing module indicates that the set of encoded data slices met the desired write reliability indication. When storage of the set of encoded data is not meeting the desired write reliability indication, the method continues at step 642 where the processing module determines a storage compliance process for the set of encoded data slices to meet the desired write reliability indication. As a specific example, the processing module determines the storage compliance process for the list of sets. Having determined the storage compliance process, the method continues at step 644 where the processing module executes the storage compliance process for the set(s) of encoded data slices based on the list of sets.

As a specific example of executing the storage compliance process, the processing module initiates a rebuilding process for encoded data slices of the set of encoded data slices that were not successfully stored during the execution of storage. For instance, the processing module issues a rebuilding request to a rebuilding entity that includes identification of the set of encoded data slices that were not successfully stored during the execution of storage. As another instance, the processing module retrieves at least a decode threshold number of encoded data slices of the set of encoded data slices that were not successfully stored, decodes the at least a decode threshold number of encoded data slices to reproduce a data segment, encodes the data segment using the dispersed storage error coding function to reproduce the set of encoded data slices, and stores the set of encoded data slices in the DSN memory.

As another specific example of executing the storage compliance process, the processing module initiates a storage unit retry process for encoded data slices of the set of encoded data slices that were not successfully stored during the execution of storage. For instance, the processing module issues a redundant write slice request to a corresponding storage unit of the DSN memory for each encoded data slice of the set of encoded data slices that were not successfully stored.

As yet another specific example of executing the storage compliance process, the processing module sends a message to the device indicating that storage of the set of encoded data slices met the per set write threshold but did not meet the desired write reliability indication. The processing module receives a response from the device requesting a storage retry of at least the encoded data slices of the set of encoded data slices that were not successfully stored during the execution of storage. Having received the response, the processing module retries storage of the encoded data slices of the set of encoded data slices that were not successfully stored during the execution of storage. For instance, the processing module encodes a portion of the data using the dispersed storage error coding function to reproduce the set of encoded data slices that were not successfully stored. Having reproduced the set of encoded data slices, the processing module sends the encoded data slices of the set of encoded data slices to the DSN memory for storage.

FIG. 48A is a schematic block diagram of another embodiment of a dispersed storage system that includes a dispersed storage (DS) processing module 422 and a DS unit set 424. The DS unit set 424 includes a set of DS units 426 utilized to access slices stored in the set of DS units 426. The DS processing module 422 may be implemented utilizing at least one of a distributed storage and task (DST) client module, a DST processing unit, a DS processing unit, a user device, a DST execution unit, and a DS unit. Alternatively, another DS processing module may be utilized to store data in the DS unit set 424 as a plurality of encoded data slices associated with a plurality of slice names. The system is operable to facilitate deletion of data in the DS unit set 424.

The DS processing module 422 identifies a data object stored locally (e.g., in a cache memory of the DS processing module 422) where the locally stored data object is associated with the plurality of sets of encoded data slices stored in the DS unit set 424. The DS processing module 422 determines a threshold number (e.g., greater than a read threshold number) of slice names corresponding to at least a set of encoded data slices of the plurality of sets of encoded data slices corresponding to the locally stored data object. The threshold number of slice names may be associated with a preferred DS units of the set of DS units 426 where the preferred DS units are associated with a preferred performance levels (e.g., more available processing capacity) as compared to other DS units of the DS unit set.

The DS processing module 422 generates a threshold number of watch requests 650 that includes the threshold number of slice names. The DS processing module 422 outputs the threshold number of watch requests 650 to corresponding DS units of the DS unit set 424. Each DS unit 426 of the corresponding DS units generates a watch response 652 with regards to availability of a corresponding encoded data slice. For example, the DS unit 426 generates the watch response 652 to indicate that the encoded data slice is visible when the DS unit 426 received a write slice request and a commit request with regards to the encoded data slice. The DS unit 426 outputs the watch response 652 to the DS processing module 422.

The DS processing module 422 receives watch responses 652 from the DS unit set 424. The DS processing module 422 determines whether to delete the locally stored data object based on the watch responses. For example, the DS processing module 422 determines to delete the locally stored object when a threshold number of favorable (e.g., encoded data slice is visible) watch responses 652 have been received. The method of operation is discussed in greater detail with reference to FIG. 48B.

FIG. 48B is a flowchart illustrating an example of deleting data. The method begins with step 654 where a processing module (e.g., of a dispersed storage (DS) processing module) identifies a data object, that is cached locally, for deletion. The identifying may be based on one or more of a memory utilization level indicator, an error message, a request, an expiration time, and a storage age indicator. The method continues at step 656 where the processing module identifies a threshold number of slice names corresponding to encoded data slices stored at a corresponding threshold number of DS units corresponding to some of the data object. The identifying includes at least one of selecting the threshold number of DS units based on one or more of a round-robin selection scheme, a DS unit activity indicator, an error message, and a predetermination. The identifying further includes generating one or more sets of slice names corresponding to the data object based on a data object identifier and selecting one or more subsets of slice names where each subset includes a threshold number of slice names.

The method continues at step 658 where the processing module generates a threshold number of watch requests that includes the threshold number of slice names. The method continues at step 660 where the processing module outputs the threshold number of watch requests to the threshold number of DS units where each DS unit of the threshold number of DS units generates and outputs a watch response to indicate whether status of a corresponding encoded data slice has changed from not visible to visible. The watch response includes a slice name and a visibility status indicator. When receiving a threshold number of favorable (e.g., including visibility status indicator indicating that an associated encoded data slice is visible) watch responses, the method continues at step 662 where the processing module deletes the data object.

FIG. 49A is a schematic block diagram of another embodiment of a dispersed storage system that includes a dispersed storage (DS) processing module 422 and a DS unit set 424. The DS unit set 424 includes a set of DS units 426 utilized to access slices stored in the set of DS units 426. The DS processing module 422 may be implemented utilizing at least one of a distributed storage and task (DST) client module, a DST processing unit, a DS processing unit, a user device, a DST execution unit, and a DS unit. The system is operable to facilitate access of data in the DS unit set 424.

The DS processing module 422 stores data as a plurality of encoded data slices in the DS unit set 424 and retrieves at least some of the encoded data slices from the DS unit set 424 to reproduce the data. The DS processing module 422 issues one or more sets of slice access requests 664 to the DS unit set 424 to store the encoded data slices in the DS unit set 424. A slice access request 664 may include one or more of a request type indicator, a slice name 666, and an encoded data slice. For example, the slice access request 664 includes a write slice request type (e.g., write, read, delete, list), the encoded data slice, and the slice name 666 corresponding to the encoded data slice when storing the encoded data slice in a DS unit 426 of the DS unit set 424.

The DS processing module 422 issues another one or more sets of slice access requests 664 to the DS unit set 424 to retrieve the encoded data slices from the DS unit set 424 where a slice access request 664 of the other one or more sets of slice access requests 664 includes a read slice request type and the slice name 666 corresponding to the encoded data slice associated with the retrieving. The DS processing module 422 receives a slice access response 668 from one or more DS units 426 of the DS unit set 424 in response to the slice access request 664 that includes the read slice request type. The slice access response 668 includes one or more of the request type indicator, the slice name 666, the encoded data slice, and a status code. The status code indicates status of a requested operation of a slice access request. For example, the status code indicates whether the requested operation was successful.

The slice name 666 utilized in the slice access request 664 and the slice access response 668 includes a slice index field 670 and a vault source name field 672. The slice index field 670 includes a slice index entry that corresponds to a pillar number of a set of pillar numbers associated with a pillar width dispersal parameter utilized in a dispersed storage error coding function to encode data to produce encoded data slices. The vault source name field 672 includes a source name field 674 and a segment ID field 676. The segment ID field 676 includes a segment ID entry corresponding to each data segment of the plurality of data segments that comprise the data. The source name field 674 includes a vault identifier (ID) field 678, a generation field 680, and an object ID field 682. The vault ID field 678 includes a vault ID entry that identifies a vault of the dispersed storage system associated with the requesting entity. The generation field 680 includes a generation entry corresponding to a generation of a data set associated with the vault. Multiple generations of data may be utilized for the vault to distinguish major divisions of a large amount of data. The object ID field 682 includes an object ID entry that is associated with a data name corresponding to the data.

As a specific example of storing the data, the DS processing module 422 receives the data and the data name associated with the data. The DS processing module 422 segments the data to produce a plurality of data segments in accordance with a segmentation scheme. The DS processing module 422 generates a set of slice names 666 for each data segment of the plurality of data segments. The generating includes a series of steps. In a first step, the DS processing module 422 identifies a vault ID based on the request. For example, the DS processing module performs a registry lookup to identify the vault ID based on a requesting entity ID associated with the request. In a second step, the DS processing module 422 generates a generation field entry based on utilization of other generation entries associated with the vault ID. The DS processing module selects a generation ID associated with a generation that is not yet full and is just greater than a previous generation ID corresponding to a generation that is full. For example, the DS processing module 422 accesses a generation utilization list of a registry to identify a fullness level associated with each potential generation ID to identify a generation ID that is not full and is just one generation ID larger than a previous generation ID that is full. In a third step, the DS processing module 422 generates an object ID entry. The generating includes at least one of generating an object ID based on a random number, performing a deterministic function (e.g., a hashing function) on the data name to produce the object ID entry, and performing the deterministic function on at least a portion of the data to produce the object ID entry. In a fourth step, for each data segment, the DS processing module 422 generates a set of slice names 666 where each slice name 666 includes a slice index entry corresponding to a pillar number of the slice name, the vault ID entry, the generation entry, the object ID entry, and a segment number corresponding to the data segment (e.g., starting at zero and increasing by one for each data segment).

Having generated the set of slice names 666, the DS processing module 422 encodes the plurality of data segments to produce a plurality of sets of encoded data slices using a dispersed storage error coding function. The DS processing module 422 generates one or more sets of slice access requests 664 that includes the sets of slice names 666 and the plurality of sets of encoded data slices. The DS processing module 422 outputs the one or more sets of slice access requests 664 to the DS unit set 424.

As a specific example of retrieving the data, the DS processing module 422 receives the data name associated with the data for retrieval. The DS processing module 422 obtains one or more source names associated with the data. The obtaining includes identifying the vault ID (e.g., based on a registry lookup, a dispersed storage network (DSN) index lookup based on the data name), identifying the object ID (e.g., a DSN index lookup based on the data name, performing a deterministic function on the data name), and selecting one or more generation field entries. The selecting of the one or more generation field entries includes identifying a fullness level associated with each viable generation field entry and selecting the one or more generation field entries based on the fullness levels of each of the one or more generation field entries. For example, the DS processing module 422 accesses the generation utilization list and selects generation field entries associated with each generation that is full and a next generation ID that is not full where the next generation ID is one greater than a greatest generation ID of generation IDs associated with full generations. For each generation of the one or more generation field entries, the DS processing module 422 generates the one or more source names that includes the generation, the vault ID, and the object ID.

Having generated the one or more source names, the DS processing module 422 generates, for each source name, one or more sets of slice names that includes the source name, a slice index, and a segment ID of the at least one data segment of the plurality of data segments. The DS processing module 422 generates one or more sets of slice access requests 664 that includes read slice requests and the one or more sets of slice names. The DS processing module 422 outputs the one or more sets of slice access requests 664 to the DS unit set 424. The DS processing module 422 receives the slice access responses 668 from the DS unit set 424 and decodes the received slice access responses 668 using the dispersed storage error coding function to reproduce the data. The decoding includes utilizing at least a decode threshold number of favorable (e.g., successfully retrieved an encoded data slice) slice access responses 668 corresponding to a common data segment of a common generation. Alternatively, the DS processing module 422 attempts to retrieve a first data segment using multiple generation IDs to identify one generation ID of the multiple generation IDs associated with storage of the data for utilization of the one generation ID in retrieval of subsequent data segments. The method of operation is discussed in greater detail with reference to FIG. 49B.

FIG. 49B is a flowchart illustrating another example of accessing data. The method begins with step 684 where a processing module (e.g., a dispersed storage (DS) processing module) identifies a data object access within a dispersed storage network (DSN). The identifying may be based on receiving a request that includes one or more of a data name, a requester identifier (ID), a vault ID, an object ID, a source name, and data. The method continues at step 686 where the processing module identifies a vault ID based on the data object. For example, the processing module performs a vault ID lookup based on the data name. As another example, the processing module performs the vault ID lookup based on the requester ID.

The method continues at step 688 where the processing module obtains an object ID based on the data object. The obtaining further includes obtaining the object ID based on one or more of a request type, the data, receiving the object ID, and the data name. For example, for a read request, the processing module accesses a DSN index (e.g., a directory) to retrieve the object ID based on the data name. As another example, for a write request, the processing module generates the object ID based on a deterministic function applied to the data name.

The method continues at step 690 where the processing module selects at least one generation ID based on generation status. The generation status indicates availability of one or more generation IDs (e.g., full or not full). The selecting further includes selecting the generation ID based on one or more of the request type and the generation status. For example, for a read request, the processing module selects each generation ID associated with a generation status that indicates that the generation is full and selects a generation ID that is one greater than a largest generation ID of one or more generation IDs that are full, if any. As another example, for a write request, the processing module selects a lowest generation ID associated with a generation that is not full.

For each generation ID, the method continues at step 692 where the processing module generates at least one set of slice names using the vault ID, generation ID, and the object ID. For each set of slice names, the method continues at step 694 where the processing module generates a set of slice access requests that includes the set of slice names. The generating may further be based on the request type. For example, for a write request, the processing module includes a set of slice names and includes a set of encoded data slices that are encoded, using a dispersed storage error coding function, from a corresponding data segment of the data. As another example, for a read request, the processing module includes a set of slice names.

The method continues at step 696 where the processing module accesses the DSN utilizing the set of slice access requests. The accessing includes outputting the set of slice access requests to the DSN. The accessing may further be based on the request type. For example, for the read request type, the processing module receives slice access responses and decodes favorable slice access responses using the dispersed storage error coding function to reproduce one or more data segments of the data. As another example, for the write request type, the processing module confirms storage of the data object when receiving a write threshold number of favorable slice access responses from the DSN for each data segment of a plurality of data segments of the data.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/ or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by a processing system that includes a processing circuit, the method comprises:
   receiving a write request to store a data object;
   identifying object parameters associated with the data object;
   selecting a selected memory type of a plurality of memory types to store the data object, based on the identified object parameters;
   selecting a selected memory to store the data object, the selected memory having the selected memory type of the plurality of memory types; and
   storing the data object in the selected memory having the selected memory type of the plurality of memory types, wherein the data object is dispersed error encoded.

2. The method of claim 1, wherein the object parameters include a size indicator associated with the data object.

3. The method of claim 1, wherein the object parameters include a temporary storage identifier associated with the data object.

4. The method of claim 1, wherein the plurality of memory types include a first memory type and a second memory type and wherein the first memory type has a lower latency compared with the second memory type.

5. The method of claim 4, wherein the plurality of memory types include a first memory type and a second memory type and wherein the first memory type has a lower cost compared with the second memory type.

6. The method of claim 1, wherein the selected memory type includes a temporary storage implemented via a solid state memory device, and wherein the temporary storage has a lower latency compared to other memory devices associated with at least one other memory type.

7. The method of claim 1, wherein the selected memory type includes a temporary storage implemented via a solid state memory device, and wherein the temporary storage has a lower access latency compared to other memory devices associated with at least one other memory type.

8. The method of claim 1, wherein the selected memory type includes a main memory space.

9. The method of claim 6, wherein the main memory space is implemented via a random access memory space.

10. The method of claim 1, wherein the data object is dispersed error encoded into a plurality of data slices.

11. A processing system of a storage network comprises:
    at least one processor;
    a memory that stores operational instructions, that when executed by the at least one processor cause the processing system to operations including:
      receiving a write request to store a data object;
      identifying object parameters associated with the data object;
      selecting a selected memory type of a plurality of memory types to store the data object, based on the identified object parameters;
      selecting a selected memory to store the data object, the selected memory having the selected memory type of the plurality of memory types; and
      storing the data object in the selected memory having the selected memory type of the plurality of memory types, wherein the data object is dispersed error encoded.

12. The processing system of claim 11, wherein the object parameters include a size indicator associated with the data object.

13. The processing system of claim 11, wherein the object parameters include a temporary storage identifier associated with the data object.

14. The processing system of claim 11, wherein the memory type includes a temporary storage.

15. The processing system of claim 14, wherein the temporary storage is implemented via a solid state memory device.

16. The processing system of claim 14, wherein the temporary storage has a lower latency compared to other memory devices associated with at least one other memory type.

17. The processing system of claim 14, wherein the temporary storage has a lower access latency compared to other memory devices associated with at least one other memory type.

18. The processing system of claim 11, wherein the memory type includes a main memory space.

19. The processing system of claim 16, wherein the main memory space is implemented via a random access memory space.

20. The processing system of claim 11, wherein the data object is dispersed error encoded into a plurality of data slices.

* * * * *